(12) United States Patent
Borowiec et al.

(10) Patent No.: US 10,078,669 B2
(45) Date of Patent: Sep. 18, 2018

(54) DATA COMPRESSION SYSTEM

(71) Applicant: NEC Corporation, Tokyo (JP)

(72) Inventors: Dominik Borowiec, Warsaw (PL); Michal Welnicki, Warsaw (PL)

(73) Assignee: NEC CORPORATION, Minato-ku, Tokyo (JP)

( * ) Notice: Subject to any disclaimer, the term of this patent is extended or adjusted under 35 U.S.C. 154(b) by 326 days.

(21) Appl. No.: 14/655,784

(22) PCT Filed: May 29, 2014

(86) PCT No.: PCT/JP2014/002844
§ 371 (c)(1),
(2) Date: Jun. 26, 2015

(87) PCT Pub. No.: WO2014/192299
PCT Pub. Date: Dec. 4, 2014

(65) Prior Publication Data
US 2015/0331913 A1 Nov. 19, 2015

Related U.S. Application Data

(60) Provisional application No. 61/828,953, filed on May 30, 2013.

(51) Int. Cl.
*G06F 17/00* (2006.01)
*G06F 17/30* (2006.01)
*H03M 7/30* (2006.01)

(52) U.S. Cl.
CPC .. *G06F 17/30501* (2013.01); *G06F 17/30153* (2013.01); *G06F 17/30539* (2013.01); *H03M 7/30* (2013.01); *H03M 7/3079* (2013.01); *H03M 7/6064* (2013.01)

(58) Field of Classification Search
CPC .................................................. G06F 17/30153
See application file for complete search history.

(56) References Cited

U.S. PATENT DOCUMENTS 6,125,348 A * 9/2000 Levine .................... G06T 9/004
704/230

FOREIGN PATENT DOCUMENTS

| CN | 1484822 A | 3/2004 |
|---|---|---|
| JP | 2005-531051 A | 10/2005 |
| JP | 2009-187293 A | 8/2009 |
| JP | 2011-090526 A | 5/2011 |

(Continued)

OTHER PUBLICATIONS

EP Search report dated Dec. 20, 2016 in EP Application No. 14803616.3.

(Continued)

*Primary Examiner* — Ajith Jacob
(74) *Attorney, Agent, or Firm* — Sughrue Mion, PLLC

(57) ABSTRACT

The system includes a correlation extraction means for extracting at least one candidate for a correlation from a collected given data set, based on a relationship between units of data in the given data set; a correlation verification means for verifying whether or not the units of data in the given data set satisfy the correlation extracted by the correlation extraction means; and a data compression means for compressing the given data set with use of the correlation, based on the result of verification by the correlation verification means.

9 Claims, 39 Drawing Sheets

(56) References Cited

FOREIGN PATENT DOCUMENTS

| JP | 2012-168671 A | 9/2012 |
|---|---|---|
| WO | 03/096230 A2 | 11/2003 |
| WO | 2013/007185 A1 | 1/2013 |

OTHER PUBLICATIONS

XP002764853, "Delta Coding", May 20, 2013. Retrieved from the Internet: URL: https://en.wikipedia.org/w/index.php?title=Delta_encoding&oldid=556019881. Retrieved on Dec. 2, 2016.
Cezary Dubnicki, et al.: "HYDRAstor: A Scalable Secondary Storage", internet article, Jan. 14, 2009, XP002764854. Retrieved from the Internet: URL: https://www.usenix.org/legacy/event/fast09/tech/full_papers/dubnicki/dubnicki_html/strzelczak_html.html. Retrieved on Dec. 1, 2016.
Dominik Borowiec, "Correlation-based compression of the statistics generated by the distributed secondary storage system", Master's thesis in Computer Science, University of Warsaw Faculty of Mathematics and Mechanics, URL:http://students.mimuw.edu.pl/SR/prace-mgr/borowiec/borowiec.pdf, Jun. 2013, pp. 1-106.
International Search Report for PCT/JP2014/002844 dated Aug. 26, 2014 [PCT/ISA/210].
Communication dated Jun. 9, 2017, from the State Intellectual Property Office of People's Republic of China in corresponding Application No. 201480019699.4.
Communication dated Nov. 7, 2017, from Japanese Patent Office in counterpart application No. 2015-530803.

\* cited by examiner

[Fig. 1]
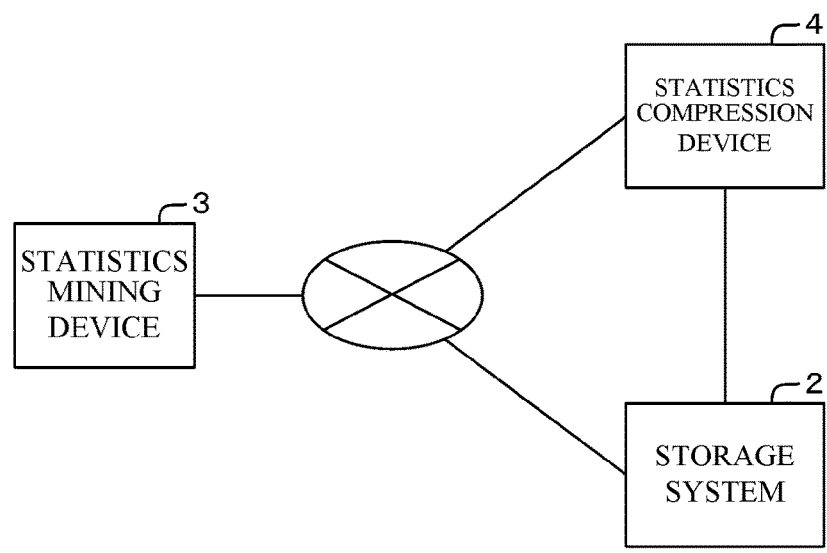

[Fig. 2]
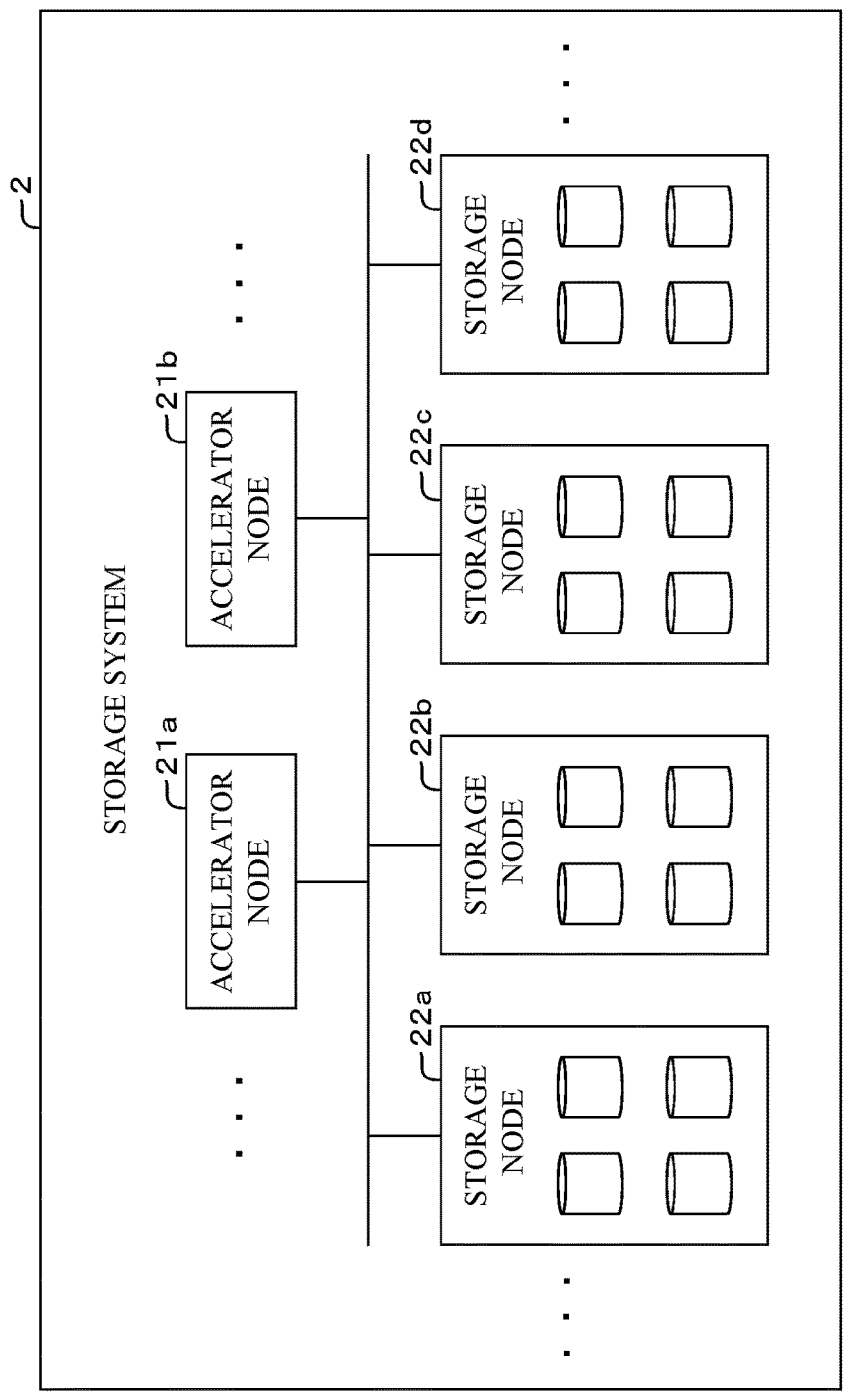

[Fig. 3]
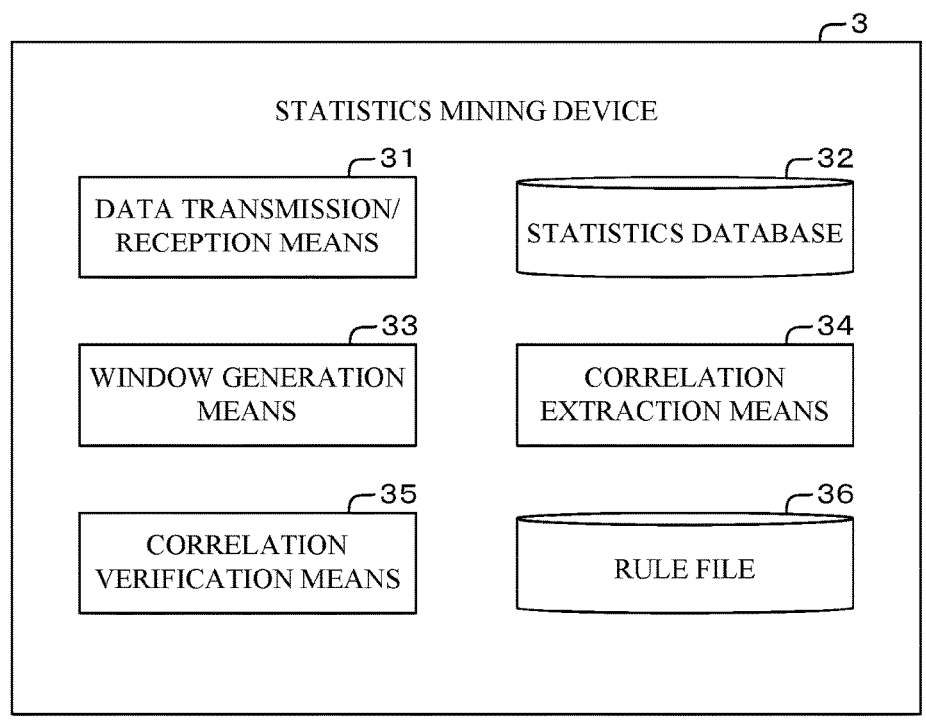

[Fig. 4]

| | | | | | | | | | | | | | | | | | | |
|---|---|---|---|---|---|---|---|---|---|---|---|---|---|---|---|---|---|---|
| STATISTIC A | 10 | 20 | 10 | 15 | 12 | 13 | 14 | 16 | 15 | 14 | | | | | | | | ⎫ |
| STATISTIC B | 10 | 20 | 10 | 15 | 12 | 13 | 14 | 16 | 15 | 14 | | | | | | | | ⎬ UNIT A |
| STATISTIC C | 10 | 30 | 40 | 55 | 67 | 80 | 94 | 110 | 125 | 139 | | | | | | | | |
| STATISTIC D | 19 | 22 | 27 | −1 | 17 | 11 | 13 | 20 | 5 | | | | | | | | | ⎭ |
| STATISTIC E | 6 | 16 | 11 | 12 | 13 | 17 | 14 | 15 | 10 | 15 | 10 | 12 | 14 | 16 | 2 | 1 | 31 | ⎫ |
| STATISTIC F | 4 | 10 | 26 | 13 | 17 | 14 | 12 | 10 | 15 | 10 | 34 | 32 | 12 | 56 | 7 | 5 | 65 | ⎬ UNIT B |
| STATISTIC G | 7 | 7 | 7 | 7 | 7 | 7 | 7 | 7 | 7 | 7 | 7 | 7 | 7 | 7 | 7 | 7 | 7 | ⎭ |

| WINDOW | | | | | | | | | | | |
|---|---|---|---|---|---|---|---|---|---|---|---|
| STATISTIC A | 10 | 20 | 10 | 15 | 12 | 13 | 14 | 16 | 15 | 14 | |
| STATISTIC B | 10 | 20 | 10 | 15 | 12 | 13 | 14 | 16 | 15 | 14 | |
| STATISTIC C | 10 | 30 | 40 | 55 | 67 | 80 | 94 | 110 | 125 | 139 | |
| STATISTIC D | 19 | 22 | 27 | −1 | 17 | 11 | 13 | 13 | 20 | 5 | WIDTH |
| STATISTIC E | 15 | 16 | 11 | 12 | 13 | 14 | 15 | 15 | 15 | 10 | |
| STATISTIC F | 4 | 10 | 26 | 13 | 17 | 14 | 12 | 10 | 15 | 10 | |
| STATISTIC G | 7 | 7 | 7 | 7 | 7 | 7 | 7 | 7 | 7 | 7 | |

33 (arrow pointing to table)

LENGTH

[Fig. 6]
1. SEARCH FOR CONSTANT CORRELATION
| STATISTIC A | 10 | 20 | 10 | 15 | 12 | 13 | 14 | 16 | 15 | 14 |
|---|---|---|---|---|---|---|---|---|---|---|
| STATISTIC B | 10 | 20 | 10 | 15 | 12 | 13 | 14 | 16 | 15 | 14 |
| STATISTIC C | 10 | 30 | 40 | 55 | 67 | 80 | 94 | 110 | 125 | 139 |
| STATISTIC D | 19 | 22 | 27 | −1 | 17 | 11 | 13 | 13 | 20 | 5 |
| STATISTIC E | 15 | 16 | 11 | 12 | 13 | 14 | 15 | 15 | 15 | 10 |
| STATISTIC F | 4 | 10 | 26 | 13 | 17 | 14 | 12 | 10 | 15 | 10 |
| STATISTIC G | 7 | 7 | 7 | 7 | 7 | 7 | 7 | 7 | 7 | 7 |
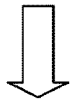
・STATISTIC G   7  7  7  7  7  7  7  7  7  7
⟶ VALUE OF STATISTIC G IS CONSTANT → HAVE CONSTANT CORRELATION
※HEURISTIC 1: REMOVE CONSTANT STATISTIC
| STATISTIC A | 10 | 20 | 10 | 15 | 12 | 13 | 14 | 16 | 15 | 14 |
|---|---|---|---|---|---|---|---|---|---|---|
| STATISTIC B | 10 | 20 | 10 | 15 | 12 | 13 | 14 | 16 | 15 | 14 |
| STATISTIC C | 10 | 30 | 40 | 55 | 67 | 80 | 94 | 110 | 125 | 139 |
| STATISTIC D | 19 | 22 | 27 | −1 | 17 | 11 | 13 | 13 | 20 | 5 |
| STATISTIC E | 15 | 16 | 11 | 12 | 13 | 14 | 15 | 15 | 15 | 10 |
| STATISTIC F | 4 | 10 | 26 | 13 | 17 | 14 | 12 | 10 | 15 | 10 |

[Fig. 7]

2. SEARCH FOR IDENTITY CORRELATION

| STATISTIC F | 4  | 10 | 26 | 13 | 17 | 14 | 12 | 10  | 15  | 10  |
|-------------|----|----|----|----|----|----|----|-----|-----|-----|
| STATISTIC A | 10 | 20 | 10 | 15 | 12 | 13 | 14 | 16  | 15  | 14  |
| STATISTIC B | 10 | 20 | 10 | 15 | 12 | 13 | 14 | 16  | 15  | 14  |
| STATISTIC C | 10 | 30 | 40 | 55 | 67 | 80 | 94 | 110 | 125 | 139 |
| STATISTIC E | 15 | 16 | 11 | 12 | 13 | 14 | 15 | 15  | 15  | 10  |
| STATISTIC D | 19 | 22 | 27 | -1 | 17 | 11 | 13 | 13  | 20  | 5   |

( • STATISTIC A    10  20  10  15  12  13  14  16  15  14
( • STATISTIC B    10  20  10  15  12  13  14  16  15  14

→ STATISTIC A AND STATISTIC B HAVE IDENTICAL VALUE → HAVE IDENTITY CORRELATION ( • STATISTIC B    10  20  10  15  12  13  14  16  15  14
( • STATISTIC C    10  30  40  55  67  80  94  110 125 139

• dSTATISTIC C        20  10  15  12  13  14  16  15  14

→ STATISTIC B AND dSTATISTIC C HAVE IDENTICAL VALUE → HAVE IDENTITY CORRELATION ( • STATISTIC A    10  20  10  15  12  13  14  16  15  14
( • STATISTIC C    10  30  40  55  67  80  94  110 125 139

• dSTATISTIC C        20  10  15  12  13  14  16  15  14

→ STATISTIC A AND dSTATISTIC C HAVE IDENTICAL VALUE → HAVE IDENTITY CORRELATION

HEURISTIC 2: LEAVE ONLY REPRESENTATIVE OF ABSTRACTION CLASS

[Fig. 8]
3. SEARCH FOR SUM CORRELATION
| ·STATISTIC D | 19 | 22 | 27 | −1 | 17 | 11 | 13 | 13 | 20 | 5 |
| ·STATISTIC E | 15 | 16 | 11 | 12 | 13 | 14 | 15 | 15 | 15 | 10 |
| ·STATISTIC F | 4 | 10 | 26 | 13 | 17 | 14 | 12 | 10 | 15 | 10 |
·dSTATISTIC F    6    16   −13    4    −3    −2    −2    5    −5
STATISTIC D = STATISTIC E + dSTATISTIC F
→ STATISTIC D IS SUM OF STATISTIC E AND dSTATISTIC F → HAVE SUM CORRELATION

[Fig. 9]
(A)
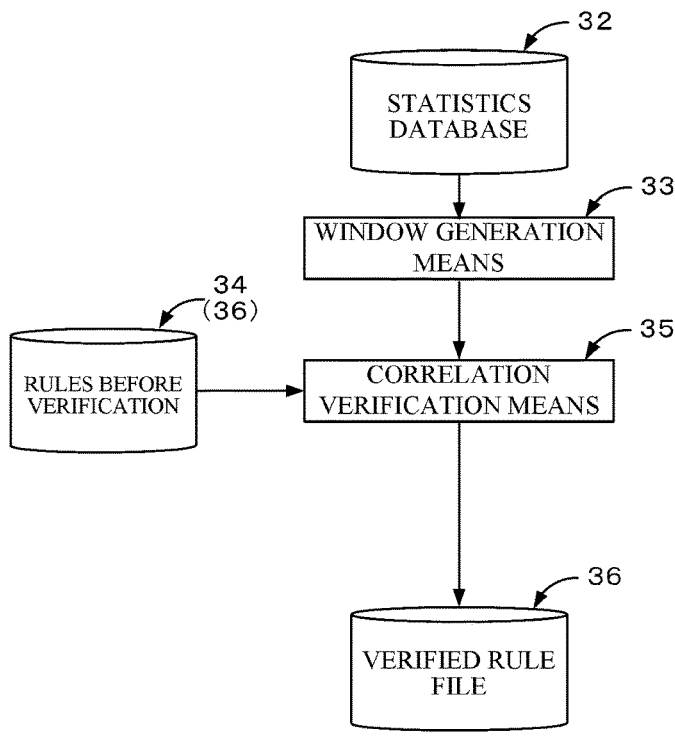
(B)
| STATISTIC A | 10 | 20 | 10 | 15 | 12 | 13 | 14 | 16 | 15 | 14 | 14 |
| STATISTIC B | 10 | 20 | 10 | 15 | 12 | 13 | 14 | 16 | 15 | 14 | 14 |
⇩
WINDOW
| ⋮ | | | | | | | | | | |
| STATISTIC A | 10 | 20 | 10 | 15 | 12 | 13 | 14 | 16 | 15 | 14 |
| STATISTIC B | 10 | 20 | 10 | 15 | 12 | 13 | 14 | 16 | 15 | 14 |
| ⋮ | | | | | | | | | | |
⇩                             APPLY TO ANOTHER
                              WINDOW AND VERIFY
HAVE IDENTITY CORRELATION
  ...

[Fig. 10]

CORRELATIONS $(p=p1), (q=q1=q2), (r=r1=r2=r3), p=q+r$ (A) COMBINATIONAL APPROACH (STORE CYCLOPAEDICALLY)

- $p=q+r$   · $p=q1+r$   · $p=q2+r$   · $p1=q+r$   · $p1=q1+r$   · $p1=q2+r$
- $p=q+r1$  · $p=q1+r1$  · $p=q2+r1$  · $p1=q+r1$  · $p1=q1+r1$  · $p1=q2+r1$
- $p=q+r2$  · $p=q1+r2$  · $p=q2+r2$  · $p1=q+r2$  · $p1=q1+r2$  · $p1=q2+r2$
- $p=q+r3$  · $p=q1+r3$  · $p=q2+r3$  · $p1=q+r3$  · $p1=q1+r3$  · $p1=q2+r3$

→ TOTAL 24 RULES (B) ABSTRACTION CLASS APPROACH

- $p=q+r$     · $(q=q1=q2)$
- $(p=p1)$    · $(r=r1=r2=r3)$

→ TOTAL 4 RULES (C) TREE APPROACH

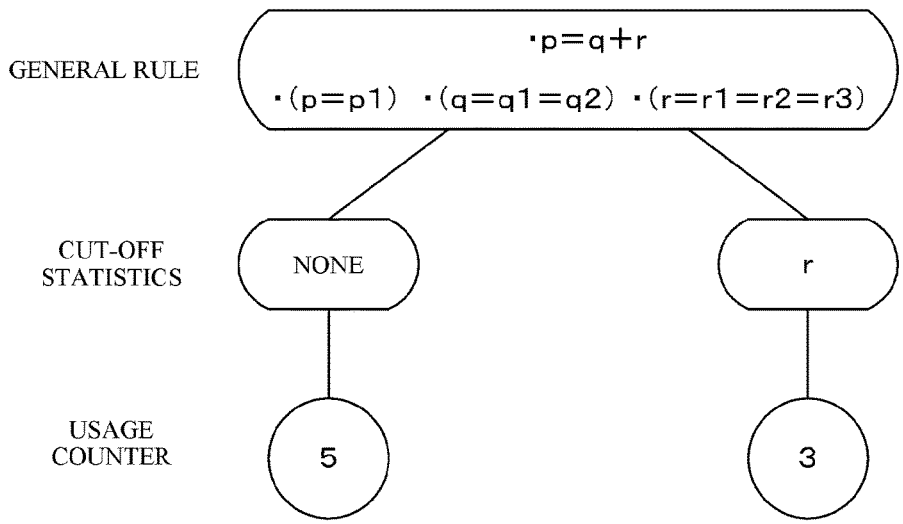

[Fig. 11]
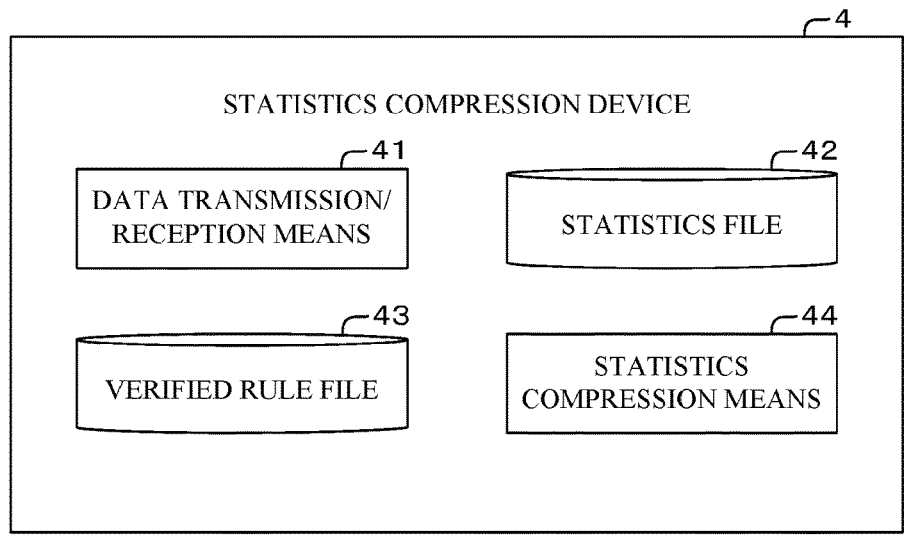
[Fig. 12]
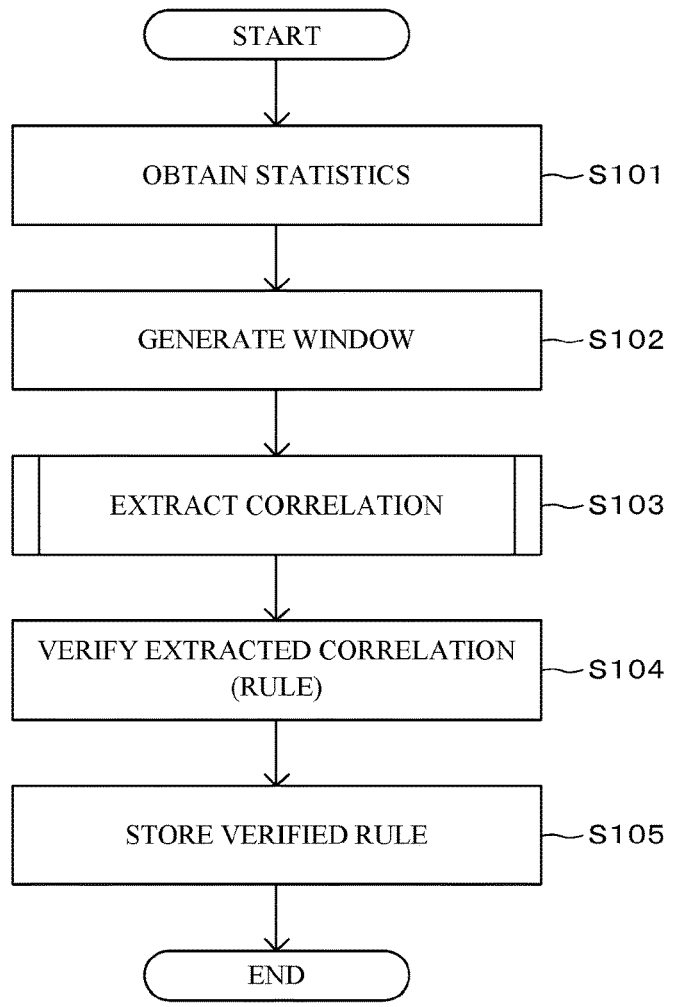

[Fig. 13]
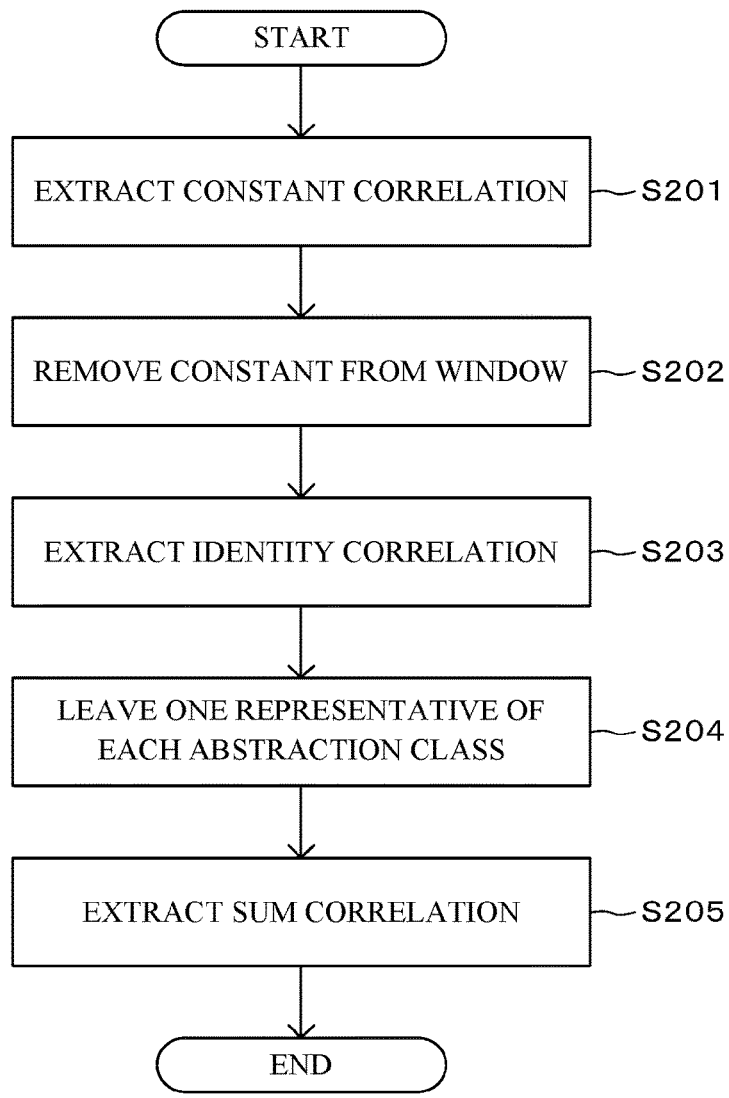

[Fig. 14]

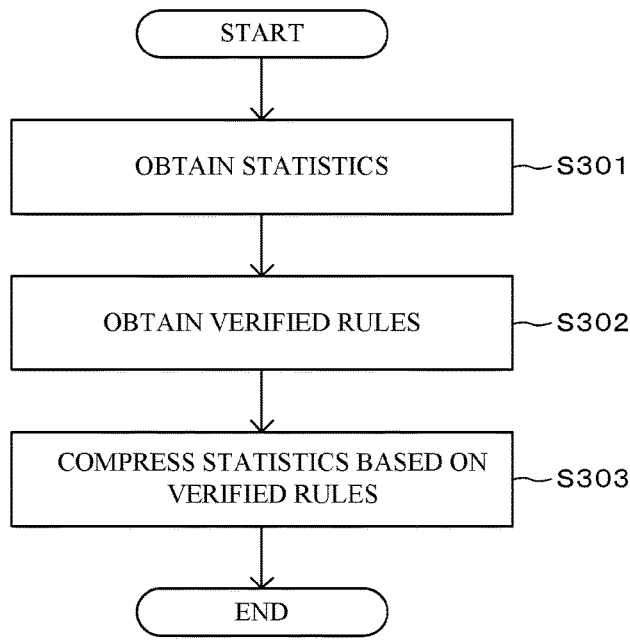

[Fig. 15]

```
VERSON 1 hydra-0_24_10269-BEv6_s-554-FRF5601_DB-31
* NetworkAddress 192.168.7.131:24800                    ———— Metadata
NETSTAT stat_alpha 1 C first_example_unit
NETSTAT stat_beta  2 C first_example_unit     Declaration of the statistic stat_delta,
NETSTAT stat_gamma 3 C first_example_unit     having type C (counter), identifier 4
NETSTAT stat_delta 4 C first_example_unit     and gathered from the first_example_unit.
NETSTAT stat_epsilon 5 C second_example_unit
NETSTAT stat_zeta 6 C second_example_unit
NETSTAT stat_eta 7 C second_example_unit
SENDER first_example_unit 2012-10-16_10:07:53
TIME OFFSET 0;20;40;60;79;100;121;140;162;180       The sequence of the samples
1 10;20;10;15;12;13;14;16;15;14;                    of the statistic no.2(stat_beta).
2 10;20;10;15;12;13;14;16;15;14;
3 10;30;40;55;67;80;94;110;125;139;
4 5;22;27;-1;17;11;13;13;20;5;
SENDER second_example_unit 2012-10-16_10:07:54
TIME OFFSET 0;21;40;60;80;100;120;140;160;180;200;220;240;262;281;299;322
5 6;16;11;12;13;14;15;15;15;10;10;12;14;16;2;1;31
6 4;10;26;13;17;14;12;10;15;10;34;32;12;56;7;5;65
7 7;7;7;7;7;7;7;7;7;7;7;7;7;7;7;7;           Definition of the section
                                              containing sequences
                                              of samples of the statistics
                                              gathered from the
                                              second_example_unit.
```

Please note that format of storing the timestamps will not be described in detail.
Timestamps are treated as metadata only and passed to the Zplus file without any modifications.

Example Zstat file.

[Fig. 16]
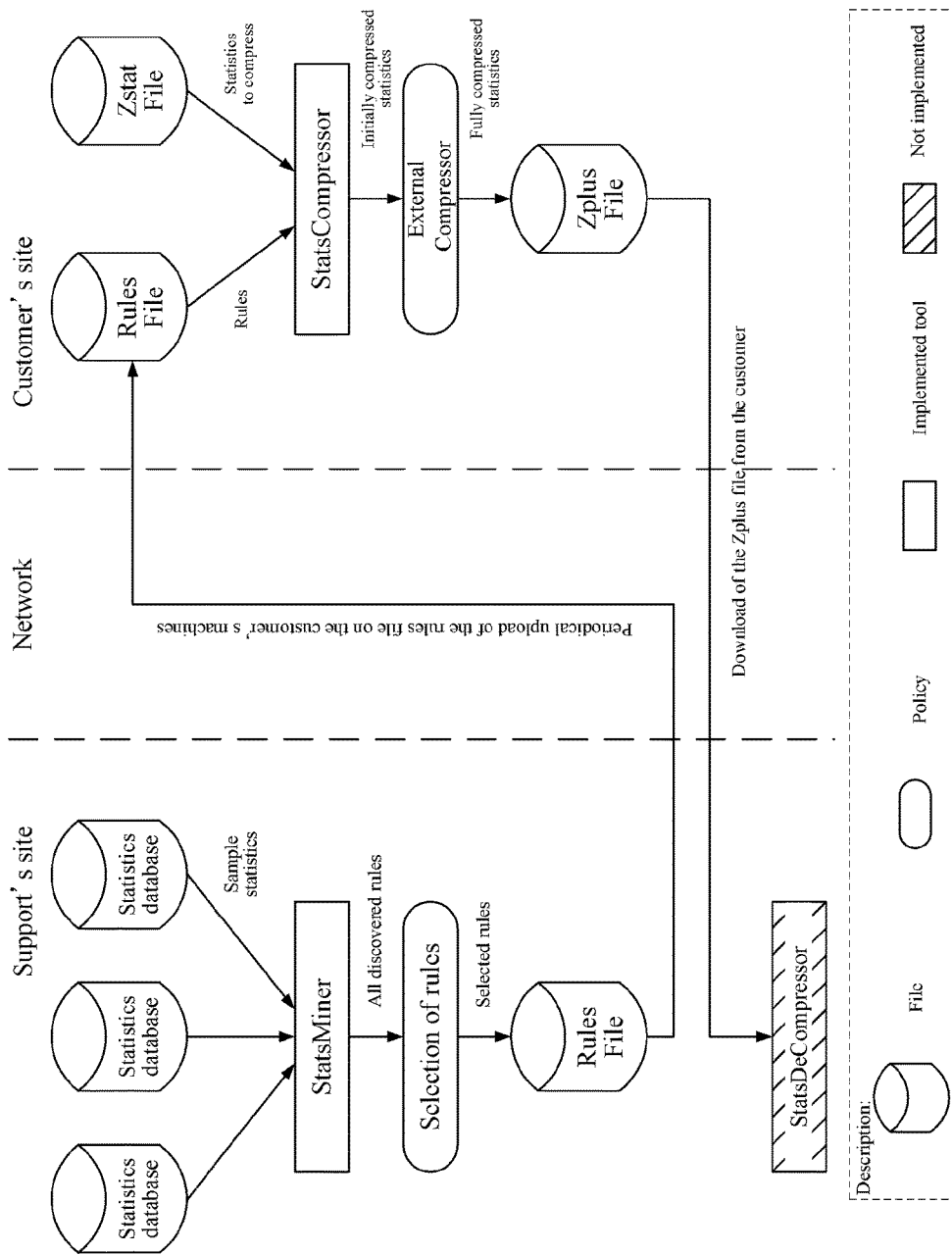

[Fig. 17]
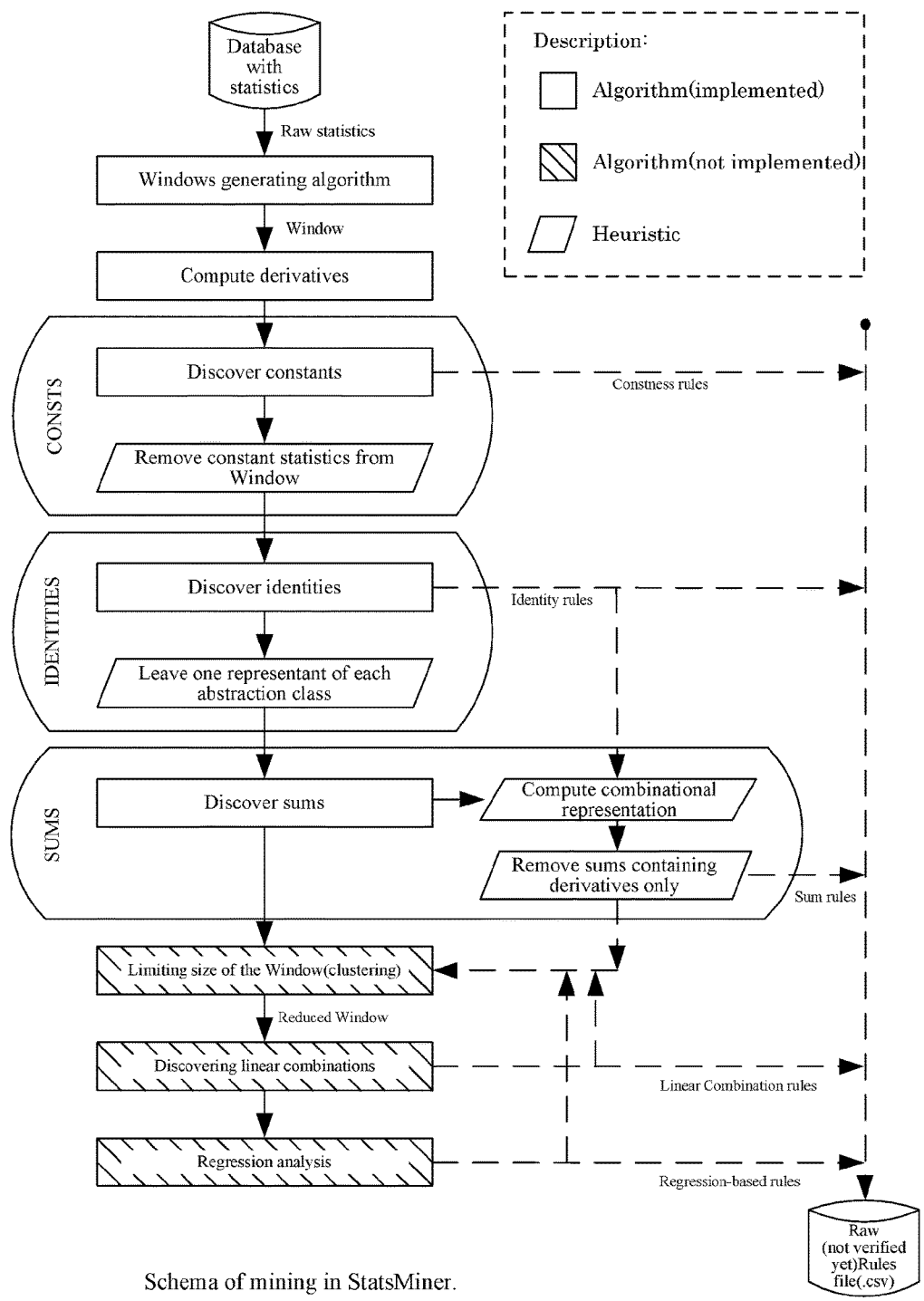
Schema of mining in StatsMiner.

[Fig. 18]
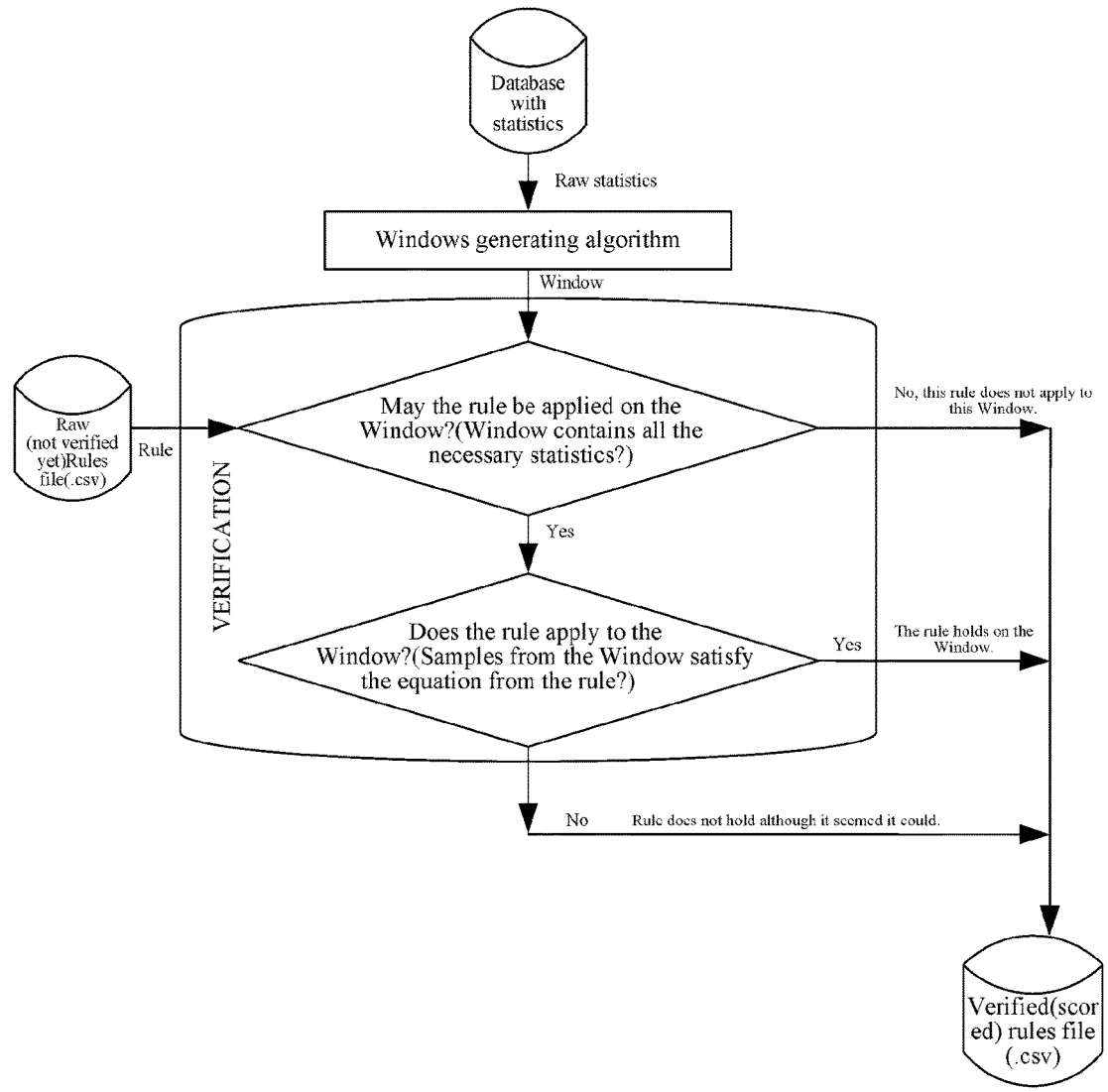
Schema of verifying in StatsMiner.

[Fig. 19]

| stat_alpha   | 10 | 20 | 10 | 15 | 12 | 13 | 14 | 16  | 15  | 14  |
|--------------|----|----|----|----|----|----|----|-----|-----|-----|
| stat_beta    | 10 | 20 | 10 | 15 | 12 | 13 | 14 | 16  | 15  | 14  |
| stat_gamma   | 10 | 30 | 40 | 55 | 67 | 80 | 94 | 110 | 125 | 139 |
| stat_delta   | 19 | 22 | 27 | -1 | 17 | 11 | 13 | 13  | 20  | 5   |
| stat_epsilon | 15 | 16 | 11 | 12 | 13 | 14 | 15 | 15  | 15  | 10  |
| stat_zeta    | 4  | 10 | 26 | 13 | 17 | 14 | 12 | 10  | 15  | 10  |
| stat_eta     | 7  | 7  | 7  | 7  | 7  | 7  | 7  | 7   | 7   | 7   |

Example window having length 10 and width 7. It is built up from samples of 7 statistics: stat_alpha, stat_beta etc., each having exactly 10 samples. Window was generated from the example Zstat file from the fig. 15.

[Fig. 20]

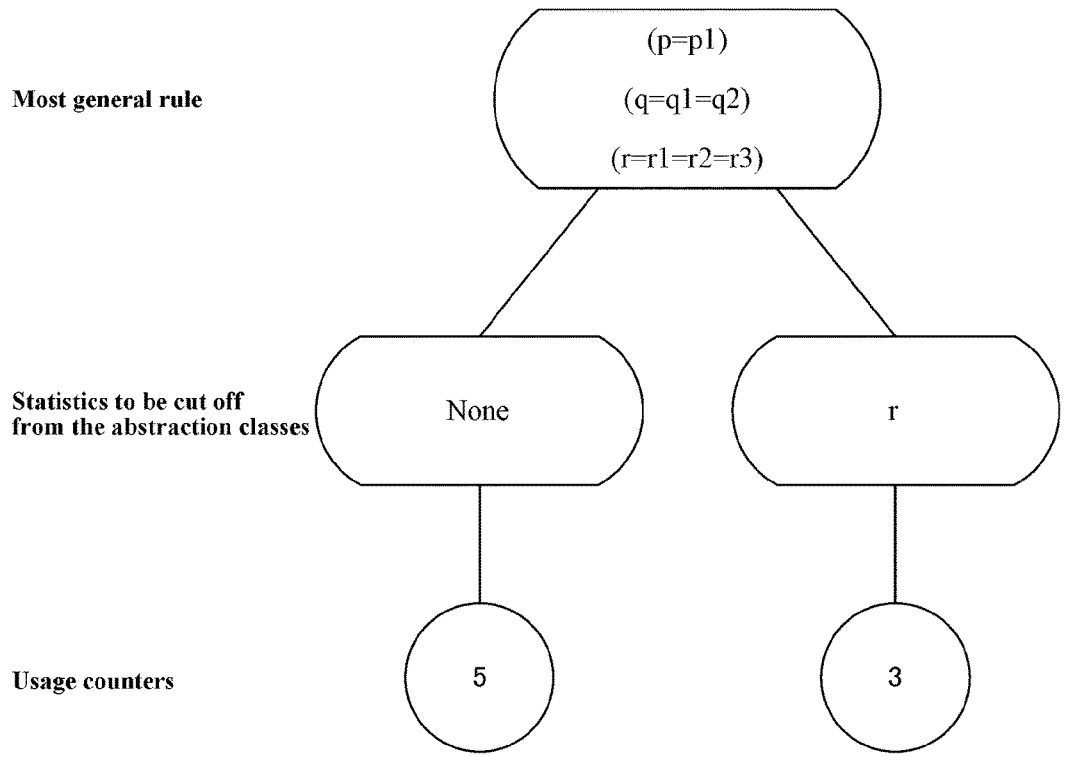

Representation of the following rules as a tree:
( p = p1 ) = ( q = q1 = q2 ) + ( r + r1 + r2 + r3 ) with usage counter 5 , and
( p = p1 ) = ( q = q1 = q2 ) + ( r1 + r2 + r3 ) having usage counter 3 .

[Fig. 21]

|  | LRT_A | | CL | |
|---|---|---|---|---|
|  | total | avg. per window | total | avg. per window |
| Number of databases | 50 | - | 30 | - |
| Number of windows | 202 | - | 43 | - |
| Number of statistics | - | 46 610 | - | 44 890 |
| Consts rules | 117 310 | 36 633 | 154 023 | 33 152 |
| Identity rules | 561 560 | 29 026 | 776 814 | 57 210 |
| Sums rules | 13 738 732 | 431 324 | 25 803 555 | 4 601 580 |
| All rules | 14 417 602 | - | 26 734 292 | - |
| Consts mining time [s] | 38 | <1 | 8 | <1 |
| Identity mining time [s] | 54 | <1 | 21 | <1 |
| Sums mining time [s] | 204 202 | 1010 | 6137 | 143 |
| Mining time [s] | 144 177 | 713 | 11 167 | 260 |
| Verifying time [s] | 51 936 | 257 | 8358 | 194 |
| CPU time [s] | 84 536 | - | 24768 | - |
| memory [s] | 9471 | - | 27681 | - |

Results of StatsMiner

[Fig. 22]
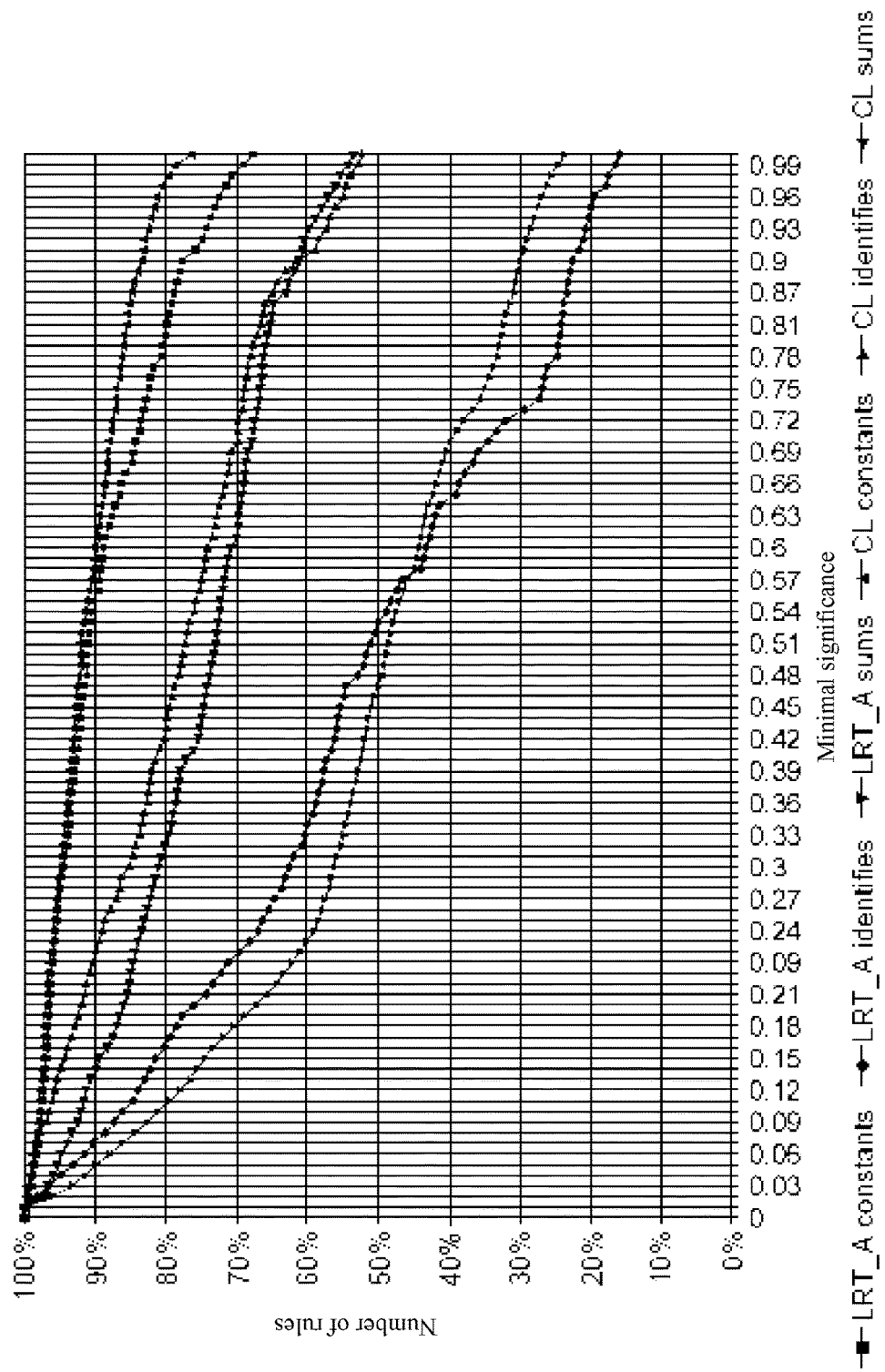
Plot of the minimal significance of rules discovered in LRT_A and CL sets.

[Fig. 23]

Full files

| compressor | max [ % ] | min [ % ] | avg | σ |
|---|---|---|---|---|
| bzip2-6 | 52.6 | 43.8 | 47.96 | 1.85 |
| bzip2-9 | 52.7 | 43.8 | 47.78 | 1.85 |
| gzip-6 | 57.1 | 50.0 | 53.72 | 1.68 |
| gzip-9 | 57.9 | 51.0 | 54.34 | 1.71 |
| xz-6 | 70.6 | 62.7 | 67.4 | 1.81 |
| xz-9 | 70.6 | 62.7 | 67.39 | 1.81 |
| noComp | 74.3 | 58.8 | 64.44 | 3.61 |

Only bodies

| compressor | max [ % ] | min [ % ] | avg [ % ] | σ [ % ] |
|---|---|---|---|---|
| bzip2-6 | 47.9 | 33.4 | 42.99 | 2.46 |
| bzip2-9 | 47.7 | 33.4 | 42.72 | 2.46 |
| gzip-6 | 52.4 | 38.0 | 48.27 | 2.63 |
| gzip-9 | 52.5 | 38.1 | 48.34 | 2.63 |
| xz-6 | 68.0 | 52.8 | 63.53 | 2.93 |
| xz-9 | 68.0 | 52.8 | 63.53 | 2.93 |
| noComp | 34.0 | 21.6 | 30.61 | 1.99 |

Performance

| category | max | min | avg | σ |
|---|---|---|---|---|
| CPU time [s] | 1134.73 | 631.44 | 911.26 | 95.37 |
| memory [MB] | 4245 | 2759 | 3820 | 304 |

StatsCompressor's Compression Ratios for compression of the LRT_A set using the rules discovered in LRT_A ( full LRT_A / LRT_A ) .

[Fig. 24]

Full files

| compressor | max [ % ] | min [ % ] | avg | σ |
|---|---|---|---|---|
| bzip2-6 | 8.60 | 4.90 | 7.47 | 0.76 |
| bzip2-9 | 8.60 | 4.90 | 7.50 | 0.76 |
| gzip-6 | 9.90 | 6.20 | 8.78 | 0.76 |
| gzip-9 | 9.70 | 6.0 | 8.61 | 0.76 |
| xz-6 | 8.2 | 4.9 | 7.19 | 0.67 |
| xz-9 | 8.2 | 4.9 | 7.19 | 0.67 |
| noComp | 74.3 | 58.8 | 64.44 | 3.61 |

Only bodies

| compressor | max [ % ] | min [ % ] | avg [ % ] | σ [ % ] |
|---|---|---|---|---|
| bzip2-6 | 12.7 | 7.5 | 11.31 | 0.86 |
| bzip2-9 | 12.7 | 7.6 | 11.33 | 0.84 |
| gzip-6 | 13.6 | 7.9 | 12.07 | 0.96 |
| gzip-9 | 13.5 | 7.9 | 12.00 | 0.95 |
| xz-6 | 11.5 | 6.7 | 10.25 | 0.83 |
| xz-9 | 11.5 | 6.7 | 10.25 | 0.83 |
| noComp | 34.0 | 21.6 | 30.61 | 1.99 |

Absolute compression ratios ( uncompressed Zstat to fully compressed Zplus) from the LRT_A set using rules discovered in LRT_A .

[Fig. 25]

| Compressor | avg. compression ratio | σ of compression ratio | Time [s] | Memory[MB] |
|---|---|---|---|---|
| bzip2-6 | 15.71 | 1.62 | 2.24 | 5 |
| bzip2-9 | 15.82 | 1.61 | 2.39 | 6 |
| gzip-6 | 16.47 | 1.47 | 0.66 | <1 |
| gzip-9 | 15.99 | 1.51 | 1.22 | <1 |
| xz-6 | 10.73 | 0.92 | 5.18 | 92 |
| xz-9 | 10.73 | 0.91 | 5.17 | 158 |
| xz-9-e | 10.31 | 1.0 | 11.04 | 158 |

Compression ratios and performance of external compressors while compressing Zstat files from the LRT_A set.

[Fig. 26]
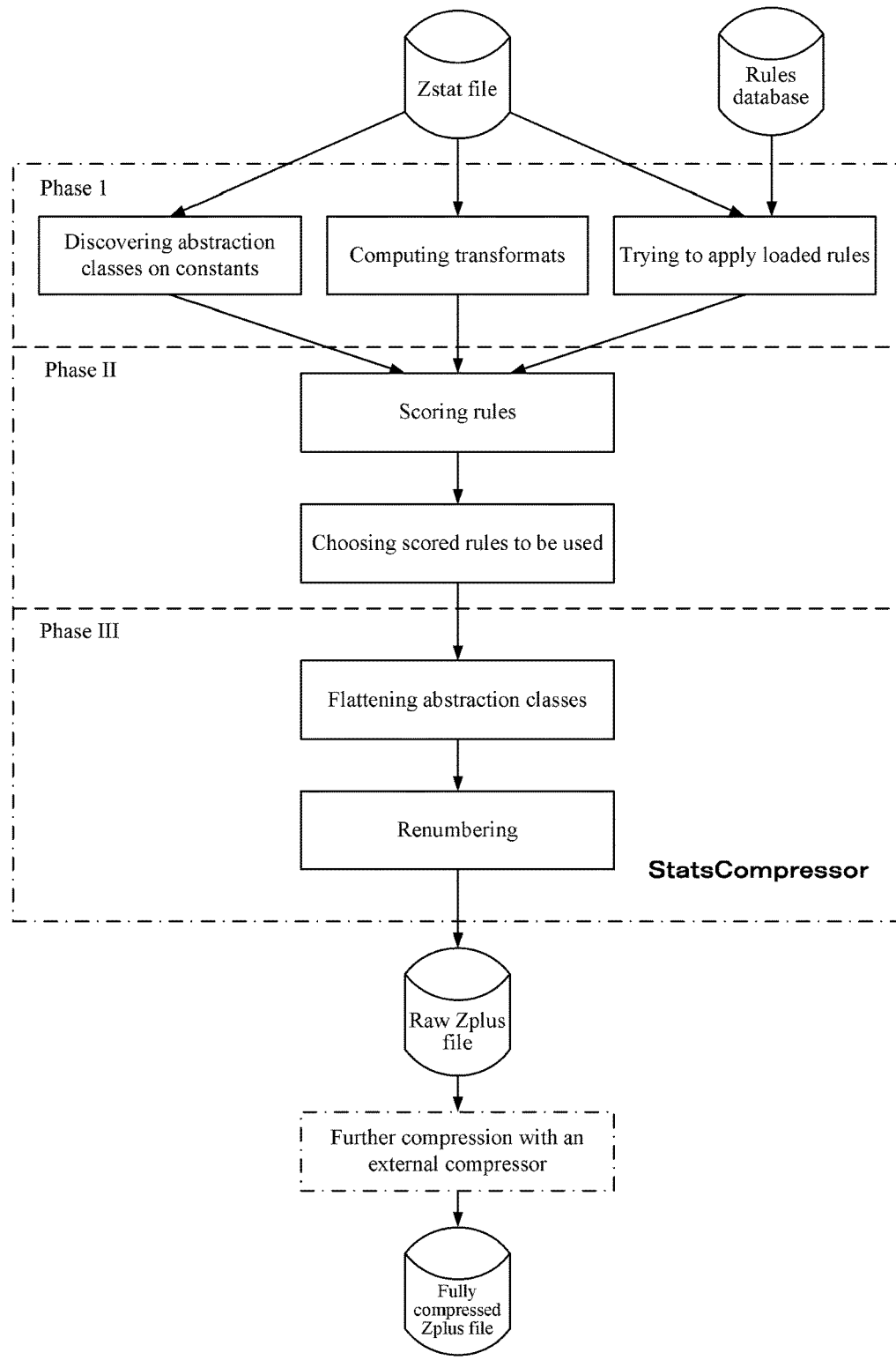
Shema of compressing with StatsCompressor.

[Fig. 27]

Full files

| compressor | max [ % ] | min [ % ] | avg | σ |
|---|---|---|---|---|
| bzip2-6 | 69.8(17.2) | 56.3(12.5) | 59.34(11.38) | 3.43(1.58) |
| bzip2-9 | 69.6(16.9) | 56.1(12.3) | 59.31(11.53) | 3.44(1.59) |
| gzip-6 | 79.1(22.0) | 63.1(13.1) | 67.83(14.11) | 3.42(1.74) |
| gzip-9 | 78.4(20.5) | 62.4(11.4) | 67.18(12.84) | 3.41(1.7) |
| xz-6 | 85.9(15.3) | 73.3(10.6) | 78.45(11.05) | 2.36(0.55) |
| xz-9 | 85.9(15.3) | 73.2(10.5) | 78.45(11.06) | 2.36(0.55) |
| noComp | 81.3(7.0) | 63.2(4.4) | 69.74(5.3) | 4.24(0.63) |

Only bodies

| compressor | max [ % ] | min [ % ] | avg [ % ] | σ [ % ] |
|---|---|---|---|---|
| bzip2-6 | 60.3(12.4) | 49.0(15.6) | 51.81(8.82) | 2.8(0.34) |
| bzip2-9 | 60.6(12.9) | 48.7(15.3) | 51.82(9.1) | 2.9(0.44) |
| gzip-6 | 67.4(15.0) | 54.0(16.0) | 58.17(9.9) | 2.75(0.12) |
| gzip-9 | 67.8(15.3) | 54.1(16.0) | 58.34(10.0) | 2.81(0.18) |
| xz-6 | 77.7(9.7) | 66.5(13.7) | 71.52(7.99) | 2.33(-0.6) |
| xz-9 | 77.7(9.7) | 66.5(13.7) | 71.52(7.99) | 2.33(-0.6) |
| noComp | 47.1(13.1) | 37.5(15.9) | 40.19(9.58) | 2.23(0.24) |

Performance

| category | max | min | avg | σ |
|---|---|---|---|---|
| CPU time [ s ] | 1124.19(-10.54) | 629.22(-2.22) | 916.73(5.47) | 91.96(-3.41) |
| memory [ MB ] | 4241(-4) | 2753(-5) | 3815(-4) | 304(<1) |

StatsCompressor's Compression Ratios for compression of the LRT_A set using rules discovered in the LRT_A set ( full LRT_A / LRT_A ) with renumbering disabled. The values in brackets are *value of (* this field *) − value of (* the same field in full LRT_A / LRT_A *)*.

[Fig. 28]

Full files

| compressor | max [ % ] | min [ % ] | avg | σ |
|---|---|---|---|---|
| bzip2-6 | 55.1(2.5) | 48.2(4.4) | 50.3(2.34) | 1.84(-0.01) |
| bzip2-9 | 55.2(2.5) | 48.1(4.3) | 50.14(2.36) | 1.83(-0.02) |
| gzip-6 | 60.3(3.2) | 53.7(3.7) | 56.23(2.51) | 1.61(-0.07) |
| gzip-9 | 61.0(3.1) | 53.7(2.7) | 56.66(2.32) | 1.69(-0.02) |
| xz-6 | 73.3(2.7) | 66.3(3.6) | 70.43(3.03) | 1.53(-0.28) |
| xz-9 | 73.3(2.7) | 66.3(3.6) | 70.42(3.03) | 1.54(-0.27) |
| noComp | 75.1(0.8) | 59.3(0.5) | 65.06(0.62) | 3.68(0.07) |

Only bodies

| comperssor | max [ % ] | min [ % ] | avg [ % ] | σ [ % ] |
|---|---|---|---|---|
| bzip2-6 | 49.5(1.6) | 37.0(3.6) | 44.74(1.75) | 2.19(-0.27) |
| bzip2-9 | 49.6(1.9) | 37.1(3.7) | 44.46(1.74) | 2.26(-0.2) |
| gzip-6 | 53.8(1.4) | 41.8(3.8) | 50.07(1.8) | 2.36(-0.27) |
| gzip-9 | 54.0(1.5) | 41.9(3.8) | 50.17(1.83) | 2.37(-0.26) |
| xz-6 | 69.5(1.5) | 57.4(4.6) | 65.57(2.04) | 2.53(-0.4) |
| xz-9 | 69.5(1.5) | 57.4(4.6) | 65.57(2.04) | 2.53(-0.4) |
| noComp | 34.9(0.9) | 23.6(2.0) | 31.67(1.06) | 1.81(-0.18) |

Performance

| category | max | min | avg | σ |
|---|---|---|---|---|
| CPU time [ s ] | 1097.79(-36.94) | 665.44(34.0) | 911.38(0.12) | 84.28(-11.09) |
| memory [ MB ] | 4232(-12) | 2742(-16) | 3806(-13) | 304(0) |

StatsCompressor's Compression Ratios for compression of the LRT_A set using rules discovered in the LRT_A set with flattening of abstraction classes disabled. The values in brackets are *value of (* this field *) − value of (* the same field in full LRT_A / LRT_A *)*.

[Fig. 29]

Full files

| compressor | max [ % ] | min [ % ] | avg | σ |
|---|---|---|---|---|
| bzip2-6 | 94.0 | 81.4 | 90.3 | 2.86 |
| bzip2-9 | 94.1 | 81.6 | 89.98 | 2.84 |
| gzip-6 | 91.6 | 76.7 | 87.31 | 3.18 |
| gzip-9 | 92.4 | 78.4 | 88.46 | 3.04 |
| xz-6 | 93.4 | 82.1 | 90.31 | 2.39 |
| xz-9 | 93.4 | 82.1 | 90.3 | 2.4 |
| noComp | 96.0 | 92.2 | 94.57 | 0.8 |

Only bodies

| compressor | max [ % ] | min [ % ] | avg [ % ] | σ [ % ] |
|---|---|---|---|---|
| bzip2-6 | 96.2 | 83.2 | 92.63 | 2.67 |
| bzip2-9 | 95.9 | 83.5 | 92.43 | 2.63 |
| gzip-6 | 95.2 | 80.1 | 91.33 | 3.15 |
| gzip-9 | 95.2 | 80.3 | 91.38 | 3.1 |
| xz-6 | 96.0 | 85.5 | 93.52 | 2.16 |
| xz-9 | 96.0 | 85.5 | 93.52 | 2.16 |
| noComp | 94.0 | 80.9 | 90.16 | 2.94 |

Performance

| category | max | min | avg | σ |
|---|---|---|---|---|
| CPU time [ s ] | 5.98 | 3.74 | 4.09 | 0.35 |
| memory [ MB ] | 233 | 194 | 206 | 8 |

StatsCompressor's Compression Ratios for compression of the LRT_A set with all methods of compression disabled except for compression of constants. Postprocessing was however still enabled.

[Fig. 30]

Full files

| compressor | max [ % ] | min [ % ] | avg | σ |
|---|---|---|---|---|
| bzip2-6 | 76.9 | 65.2 | 69.11 | 3.03 |
| bzip2-9 | 76.9 | 65.9 | 69.2 | 2.96 |
| gzip-6 | 81.1 | 69.5 | 73.84 | 2.18 |
| gzip-9 | 80.4 | 68.8 | 73.27 | 2.16 |
| xz-6 | 85.8 | 76.4 | 81.94 | 1.92 |
| xz-9 | 85.8 | 76.4 | 81.94 | 1.91 |
| noComp | 85.2 | 75.8 | 78.44 | 2.52 |

Only bodies

| compressor | max [ % ] | min [ % ] | avg[ % ] | σ [ % ] |
|---|---|---|---|---|
| bzip2-6 | 72.1 | 58.5 | 64.38 | 3.1 |
| bzip2-9 | 72.3 | 58.1 | 63.72 | 3.34 |
| gzip-6 | 72.4 | 61.5 | 66.65 | 2.33 |
| gzip-9 | 72.8 | 61.8 | 66.79 | 2.38 |
| xz-6 | 82.5 | 71.7 | 78.09 | 2.68 |
| xz-9 | 82.5 | 71.7 | 78.09 | 2.68 |
| noComp | 62.5 | 47.9 | 57.17 | 2.66 |

Performance

| category | max | min | avg | σ |
|---|---|---|---|---|
| CPU time [ s ] | 3.67 | 2.7 | 3.2 | 0.19 |
| memory [ MB ] | 901 | 764 | 792 | 28 |

StatsCompressor's Compression Ratios for compression of the LRT_A set with all methods of compression disabled except for usage of transformats. Postprocessing was still enabled but had no impact on the results.

[Fig. 31]

| Transformat | avg. number of applications | among all the transformats |
|---|---|---|
| 0 - transformat | 165 | <1% |
| Difference transformat | 41 955 | 86% |
| Dominant transformat | 6820 | 14% |
| Total | 48 940 | 100% |

The average number of times specific transformat was used for Zstat files from the LRT_A set ( all other methods of compression were disabled ) .

[Fig. 32]

Full files

| compressor | max [ % ] | min [ % ] | avg | σ |
|---|---|---|---|---|
| bzip2-6 | 80.6(28.0) | 70.2(26.4) | 77.28(29.32) | 2.1(0.25) |
| bzip2-9 | 80.3(27.6) | 70.5(26.7) | 77.01(29.23) | 2.08(0.23) |
| gzip-6 | 84.3(27.2) | 71.9(21.9) | 80.69(26.97) | 2.55(0.87) |
| gzip-9 | 85.4(27.5) | 73.8(22.8) | 81.89(27.55) | 2.38(0.67) |
| xz-6 | 87.6(17.0) | 78.3(15.6) | 85.12(17.72) | 1.97(0.16) |
| xz-9 | 87.5(16.9) | 78.3(15.6) | 85.1(17.71) | 1.98(0.17) |
| noComp | 83.6(9.3) | 76.5(17.7) | 80.12(15.68) | 1.51(-2.1) |

Only bodies

| compressor | max [ % ] | min [ % ] | avg[ % ] | σ [ % ] |
|---|---|---|---|---|
| bzip2-6 | 80.7(32.8) | 69.9(36.5) | 77.82(34.83) | 2.38(-0.08) |
| bzip2-9 | 79.7(32.0) | 70.3(36.9) | 77.38(34.66) | 2.11(-0.35) |
| gzip-6 | 87.3(34.9) | 73.7(35.7) | 83.5(35.23) | 2.63 |
| gzip-9 | 87.3(34.8) | 73.8(35.7) | 83.54(35.2) | 2.6(-0.03) |
| xz-6 | 89.6(21.6) | 79.8(27.0) | 87.32(23.79) | 1.93(-1.0) |
| xz-9 | 89.6(21.6) | 79.8(27.0) | 87.32(23.79) | 1.93(-1.0) |
| noComp | 64.6(30.6) | 51.0(29.4) | 61.65(31.04) | 2.49(0.5) |

Performance

| category | max | min | avg | σ |
|---|---|---|---|---|
| CPU time [ s ] | 1168.23(33.5) | 672.21(40.77) | 888.11(-23.15) | 94.71(-0.66) |
| memory [ MB ] | 3466(-779) | 2392(-366) | 3081(-738) | 233(-70) |

StatsCompressor's Compression Ratios for compression of the LRT_A set using rules discovered in the LRT_A set with deviations vectors usage and transformats disabled. The values in brackets are *value of (* this field *)* − *value of (* the same field in full LRT_A / LRT_A *)*.

[Fig. 33]

| Category | Identity rules | Sums rules |
|---|---|---|
| All statistics | 48 940 | |
| Non-const statistic | 14 528 | |
| Loaded rules | 9 115 500 | |
| Tried to apply | 709 364 | 26 386 600 |
| Having a good cost | 310 492 | 4 212 930 |
| Not applied , cycling | 16 598 | 193 870 |
| Not applied , lhs described | 252 894 | 5 965 020 |
| Applied | 41 008(6596) | 1002 |
| Evaluation time [s] | 7.4 | 578 |
| Choosing the rules time [s] | 18.0 | |

Statistics of usage of rules loaded from file by StatsCompressor per Zstat file while compressing the LRT_A set using all the methods and rules generated on the LRT_A set . Rules created for constants compression are also included .

[Fig. 34]

Full files

| compressor | max [ % ] | min [ % ] | avg | σ |
|---|---|---|---|---|
| bzip2-6 | 54.4(1.8) | 44.6(0.8) | 49.87(1.91) | 1.85(0.00) |
| bzip2-9 | 54.5(1.8) | 44.6(0.8) | 49.69(1.91) | 1.84(-0.01) |
| gzip-6 | 58.3(1.2) | 50.7(0.7) | 55.44(1.72) | 1.69(0.01) |
| gzip-9 | 59.0(1.1) | 51.7(0.7) | 56.1(1.76) | 1.68(-0.03) |
| xz-6 | 72.4(1.8) | 63.3(0.6) | 69.18(1.78) | 1.95(0.14) |
| xz-9 | 72.4(1.8) | 63.4(0.7) | 69.18(1.79) | 1.95(0.14) |
| noComp | 74.6(0.3) | 60.2(1.4) | 65.48(1.04) | 3.37(-0.24) |

Only bodies

| compressor | max [ % ] | min [ % ] | avg[ % ] | σ [ % ] |
|---|---|---|---|---|
| bzip2-6 | 50.6(2.7) | 34.4(1.0) | 45.3(2.31) | 2.63(0.17) |
| bzip2-9 | 50.4(2.7) | 34.4(1.0) | 45.02(2.3) | 2.67(0.21) |
| gzip-6 | 54.7(2.3) | 39.0(1.0) | 50.51(2.24) | 2.82(0.19) |
| gzip-9 | 54.8(2.3) | 39.1(1.0) | 50.58(2.24) | 2.82(0.19) |
| xz-6 | 70.3(2.3) | 54.0(1.2) | 65.9(2.37) | 3.15(0.22) |
| xz-9 | 70.3(2.3) | 54.0(1.2) | 65.9(2.37) | 3.15(0.22) |
| noComp | 36.0(2.0) | 22.6(1.0) | 32.63(2.02) | 2.19(0.2) |

Performance

| category | max | min | avg | σ |
|---|---|---|---|---|
| CPU time [ s ] | 21.1(-1113.63) | 17.05(-614.39) | 19.95(-891.31) | 0.94(-94.43) |
| memory [MB] | 422(-3822) | 322(-2436) | 347(-3473) | 18(-285) |

StatsCompressor's Compression Ratios for compression of the LRT_A set using identity rules ( only ) discovered in the LRT_A set . The values in brackets are *value of (* this field *) − value of (* the same field in full LRT_A / LRT_A *)* .

[Fig. 35]

Full files

|  | 80% | 50% | 20% | 5% | 0% |
|---|---|---|---|---|---|
| bzip2-6 | 0.11 | 0.4 | 0.75 | 1.3 | 1.91 |
| bzip2-9 | 0.13 | 0.4 | 0.76 | 1.31 | 1.91 |
| gzip-6 | 0.12 | 0.4 | 0.73 | 1.26 | 1.72 |
| gzip-9 | 0.12 | 0.41 | 0.74 | 1.29 | 1.76 |
| xz-6 | 0.13 | 0.42 | 0.77 | 1.29 | 1.78 |
| xz-9 | 0.13 | 0.42 | 0.78 | 1.28 | 1.79 |
| noComp | 0.07 | 0.19 | 0.39 | 0.67 | 1.04 |

Only bodies

|  | 80% | 50% | 20% | 5% | 0% |
|---|---|---|---|---|---|
| bzip2-6 | 0.14 | 0.46 | 0.89 | 1.57 | 2.31 |
| bzip2-9 | 0.14 | 0.48 | 0.91 | 1.57 | 2.3 |
| gzip-6 | 0.16 | 0.52 | 0.95 | 1.63 | 2.24 |
| gzip-9 | 0.16 | 0.52 | 0.96 | 1.64 | 2.24 |
| xz-6 | 0.17 | 0.55 | 1.02 | 1.7 | 2.37 |
| xz-9 | 0.17 | 0.55 | 1.02 | 1.7 | 2.37 |
| noComp | 0.12 | 0.38 | 0.75 | 1.29 | 2.02 |

Performance

|  | 80% | 50% | 20% | 5% | 0% |
|---|---|---|---|---|---|
| CPU time [s] | -176.0 | -429.33 | -712.21 | -842.63 | -891.31 |
| memory [MB] | -694 | -1736 | -2777 | -3299 | -3473 |

Differences between StatsCompressor's Compression Ratios for compression of the LRT_A set using : all the rules discovered on the LRT_A set and all the identity rules and only a given percentage of sum rules . The values in cells are *value of* ( result of the compression with the reduced set of sum rules ) − *value of* ( corresponding field in full LRT_A / LRT_A ) .

[Fig. 36]

Full files

| compressor | max [ % ] | min [ % ] | avg | σ |
|---|---|---|---|---|
| bzip2-6 | 66.8(14.2) | 51.1(7.3) | 60.18(12.22) | 2.98(1.13) |
| bzip2-9 | 66.7(14.0) | 51.4(7.6) | 59.9(12.12) | 2.97(1.12) |
| gzip-6 | 66.0(8.9) | 54.5(4.5) | 62.36(8.64) | 2.34(0.66) |
| gzip-9 | 66.5(8.6) | 55.4(4.4) | 62.92(8.58) | 2.3(0.59) |
| xz-6 | 79.2(8.6) | 67.1(4.4) | 74.17(6.77) | 2.66(0.85) |
| xz-9 | 79.1(8.5) | 67.1(4.4) | 74.15(6.76) | 2.66(0.85) |
| noComp | 81.2(6.9) | 73.2(14.4) | 75.27(10.83) | 2.21(-1.4) |

Only bodies

| compressor | max [ % ] | min [ % ] | avg[ % ] | σ [ % ] |
|---|---|---|---|---|
| bzip2-6 | 65.5(17.6) | 42.9(9.5) | 57.32(14.33) | 3.9(1.44) |
| bzip2-9 | 64.8(17.1) | 43.4(10.0) | 56.63(13.91) | 3.7(1.24) |
| gzip-6 | 63.9(11.5) | 44.2(6.2) | 58.83(10.56) | 3.52(0.89) |
| gzip-9 | 64.0(11.5) | 44.3(6.2) | 58.88(10.54) | 3.53(0.9) |
| xz-6 | 78.5(10.5) | 59.8(7.0) | 72.18(8.65) | 3.67(0.74) |
| xz-9 | 78.5(10.5) | 59.8(7.0) | 72.18(8.65) | 3.67(0.74) |
| noComp | 59.0(25.0) | 37.7(16.1) | 51.93(21.32) | 3.52(1.53) |

Performance

| category | max [ % ] | min [ % ] | avg | σ |
|---|---|---|---|---|
| CPU time [s] | 4.67(-1130.06) | 3.64(-627.8) | 4.0(-907.26) | 0.2(-95.17) |
| memory [MB] | 246(-3999) | 212(-2546) | 223(-3597) | 6(-297) |

StatsCompressor's Compression Ratios for compression of the LRT_A set without usage of any rules found by StatsMiner. The values in brackets are *value of (* this field *) − value of (* the same field in full LRT_A / LRT_A ( same experiment but all the rules are being used *) )* .

[Fig. 37]

Full files

| compressor | max [ % ] | min [ % ] | avg | σ |
|---|---|---|---|---|
| bzip2-6 | 74.5(21.9) | 43.3(-0.5) | 48.67(0.71) | 4.29(2.44) |
| bzip2-9 | 74.5(21.8) | 43.8 | 48.47(0.69) | 4.29(2.44) |
| gzip-6 | 76.0(18.9) | 48.4(-1.6) | 54.25(0.53) | 3.78(2.1) |
| gzip-9 | 76.2(18.3) | 48.9(-2.1) | 54.89(0.55) | 3.74(2.03) |
| xz-6 | 81.2(10.6) | 60.5(-2.2) | 67.83(0.43) | 3.04(1.23) |
| xz-9 | 81.3(10.7) | 60.5(-2.2) | 67.84(0.45) | 3.05(1.24) |
| noComp | 81.8(7.5) | 58.7(-0.1) | 64.64(0.2) | 3.98(0.37) |

Only bodies

| compressor | max [ % ] | min [ % ] | avg [ % ] | σ [ % ] |
|---|---|---|---|---|
| bzip2-6 | 65.0(17.1) | 34.0(0.6) | 43.66(0.67) | 4.24(1.78) |
| bzip2-9 | 64.5(16.8) | 34.0(0.6) | 43.38(0.66) | 4.19(1.73) |
| gzip-6 | 65.0(12.6) | 38.8(0.8) | 48.72(0.45) | 4.06(1.43) |
| gzip-9 | 65.9(13.4) | 38.9(0.8) | 48.82(0.48) | 4.14(1.51) |
| xz-6 | 71.2(3.2) | 53.2(0.4) | 63.83(0.3) | 3.73(0.8) |
| xz-9 | 71.2(3.2) | 53.2(0.4) | 63.83(0.3) | 3.73(0.8) |
| noComp | 41.5(7.5) | 22.1(0.5) | 30.92(0.31) | 2.52(0.53) |

Performance

| category | max | min | avg | σ |
|---|---|---|---|---|
| CPU time [s] | 1255.27(120.54) | 596.87(-34.57) | 932.76(21.5) | 120.4(25.03) |
| memory [MB] | 4380(134) | 2099(-659) | 3784(-36) | 392(87) |

StatsCompressor's Compression Ratios for compression of the LRT_B set with usage of all the rules found by StatsMiner on the LRT_A set. The values in brackets are *value of ( this field ) − value of ( the same field in full LRT_A / LRT_A )*.

[Fig. 38]

Full files

| compressor | 95% | 90% | 80% | 70% | 50% |
|---|---|---|---|---|---|
| bzip2-6 | 4.24 | 3.92 | 3.34 | 2.91 | 2.2 |
| bzip2-9 | 4.12 | 3.8 | 3.28 | 2.88 | 2.2 |
| gzip-6 | 3.58 | 3.32 | 2.86 | 2.43 | 1.96 |
| gzip-9 | 3.54 | 3.28 | 2.82 | 2.41 | 1.94 |
| xz-6 | 2.5 | 2.36 | 2.12 | 1.71 | 1.45 |
| xz-9 | 2.49 | 2.36 | 2.13 | 1.71 | 1.45 |
| noComp | 3.16 | 2.9 | 2.45 | 2.17 | 1.65 |

Only bodies

| compressor | 95% | 90% | 80% | 70% | 50% |
|---|---|---|---|---|---|
| bzip2-6 | 4.85 | 4.52 | 3.96 | 3.51 | 2.71 |
| bzip2-9 | 4.9 | 4.53 | 3.93 | 3.47 | 2.68 |
| gzip-6 | 4.58 | 4.27 | 3.69 | 3.18 | 2.57 |
| gzip-9 | 4.51 | 4.21 | 3.63 | 3.12 | 2.52 |
| xz-6 | 3.46 | 3.3 | 3.0 | 2.49 | 2.12 |
| xz-9 | 3.46 | 3.3 | 3.0 | 2.49 | 2.12 |
| noComp | 6.25 | 5.72 | 4.83 | 4.29 | 3.25 |

Performance

| category | 95% | 90% | 80% | 70% | 50% |
|---|---|---|---|---|---|
| CPU time [s] | -756.12 | -735.22 | -704.43 | -620.71 | -563.37 |
| memory [MB] | -2897 | -2816 | -2696 | -2385 | -2071 |

Differences in the average StatsCompressor's Compression Ratios for compression of the LRT_A set using : all the rules discovered in the LRT_A set and rules having the minimal given importance . The values in cells are *value of (* compression with rules of minimal importance *) − value of (* average in the full LRT_A / LRT_A *)* .

[Fig. 39]

Full files

| compressor | max [ % ] | min [ % ] | avg | σ |
|---|---|---|---|---|
| bzip2-6 | 73.8(21.2) | 43.6(-0.2) | 49.19(1.23) | 4.19(2.34) |
| bzip2-9 | 73.8(21.2) | 44.1(0.3) | 48.98(1.2) | 4.18(2.33) |
| gzip-6 | 74.6(17.5) | 48.7(-1.3) | 54.71(0.99) | 3.63(1.95) |
| gzip-9 | 75.6(17.7) | 49.2(-1.8) | 55.38(1.04) | 3.66(1.95) |
| xz-6 | 82.5(11.9) | 60.9(-1.8) | 68.43(1.03) | 3.17(1.36) |
| xz-9 | 82.5(11.9) | 60.9(-1.8) | 68.43(1.04) | 3.18(1.37) |
| noComp | 81.7(7.4) | 59.0(0.2) | 64.86(0.42) | 3.92(0.31) |

Only bodies

| compressor | max [ % ] | min [ % ] | avg [ % ] | σ [ % ] |
|---|---|---|---|---|
| bzip2-6 | 66.2(18.3) | 34.6(1.2) | 44.33(1.34) | 4.34(1.88) |
| bzip2-9 | 65.6(17.9) | 34.6(1.2) | 44.05(1.33) | 4.31(1.85) |
| gzip-6 | 66.2(13.8) | 39.6(1.6) | 49.41(1.14) | 4.18(1.55) |
| gzip-9 | 67.1(14.6) | 39.7(1.6) | 49.52(1.18) | 4.26(1.63) |
| xz-6 | 74.9(6.9) | 53.6(0.8) | 64.66(1.13) | 3.96(1.03) |
| xz-9 | 74.9(6.9) | 53.6(0.8) | 64.66(1.13) | 3.96(1.03) |
| noComp | 41.9(7.9) | 22.6(1.0) | 31.36(0.75) | 2.57(0.58) |

Performance

| category | max | min | avg | σ |
|---|---|---|---|---|
| CPU time [s] | 58.32(-1076.41) | 30.25(-601.19) | 45.97(-865.29) | 4.24(-91.13) |
| memory [MB] | 696(-3549) | 424(-2334) | 631(-3188) | 53(-250) |

StatsCompressor's Compression Ratios for compression of the LRT_B set with usage of rules already used by StatsCompressor while compressing the LRT_A set with the rules discovered on the LRT_A set. The values in brackets are *value of (* this field *) − value of (* the same field in full LRT_A / LRT_A *)*.

[Fig. 40]

Full files

| compressor | max [ % ] | min [ % ] | avg | σ |
|---|---|---|---|---|
| bzip2-6 | 54.6(2.0) | 44.4(0.6) | 50.17(2.21) | 1.91(0.06) |
| bzip2-9 | 54.6(1.9) | 44.3(0.5) | 49.97(2.19) | 1.89(0.04) |
| gzip-6 | 58.5(1.4) | 50.5(0.5) | 55.64(1.92) | 1.69(0.01) |
| gzip-9 | 59.1(1.2) | 51.5(0.5) | 56.25(1.91) | 1.67(-0.04) |
| xz-6 | 72.2(1.6) | 63.1(0.4) | 68.77(1.37) | 2.0(0.19) |
| xz-9 | 72.2(1.6) | 63.2(0.5) | 68.77(1.38) | 1.99(0.18) |
| noComp | 75.0(0.7) | 60.5(1.7) | 66.03(1.59) | 3.31(-0.3) |

Only bodies

| compressor | max [ % ] | min [ % ] | avg [ % ] | σ [ % ] |
|---|---|---|---|---|
| bzip2-6 | 51.1(3.2) | 34.1(0.7) | 45.68(2.69) | 2.72(0.26) |
| bzip2-9 | 50.9(3.2) | 34.1(0.7) | 45.37(2.65) | 2.77(0.31) |
| gzip-6 | 55.0(2.6) | 38.7(0.7) | 50.77(2.5) | 2.88(0.25) |
| gzip-9 | 55.1(2.6) | 38.8(0.7) | 50.81(2.47) | 2.89(0.26) |
| xz-6 | 70.2(2.2) | 53.8(1.0) | 65.54(2.01) | 3.17(0.24) |
| xz-9 | 70.2(2.2) | 53.8(1.0) | 65.54(2.01) | 3.17(0.24) |
| noComp | 38.9(4.9) | 22.8(1.2) | 33.75(3.14) | 2.41(0.42) |

Performance ( StatsMiner + StatsCompressor )

| category | max | min | avg | σ |
|---|---|---|---|---|
| CPU time [s] | 902.1(-232.63) | 93.44(-538.0) | 478.04(-433.22) | 166.44(71.07) |
| memory [MB] | 4833(588) | 794(-1964) | 1176(-2643) | 652(347) |

StatsCompressor's Compression Ratios for compression of the LRT_A set with rules discovered by StatsMiner in the file compressed at the moment. The values in brackets are *value of (*this field*) − value of (*the same field in full LRT_A */ LRT_A )*.

[Fig. 41]

Full files

| compressor | optimistic | realistic | used | no rules | merge |
|---|---|---|---|---|---|
| bzip2-6 | 49.88(1.92) | 54.89(6.93) | 55.83(6.64) | 65.22(5.04) | 50.43(0.26) |
| bzip2-9 | 49.98(2.2) | 55.03(7.25) | 56.05(7.07) | 65.26(5.36) | 50.56(0.59) |
| gzip-6 | 56.09(2.37) | 60.19(6.47) | 61.08(6.37) | 67.99(5.63) | 56.64(1.0) |
| gzip-9 | 56.3(1.96) | 60.4(6.06) | 61.33(5.95) | 68.17(5.25) | 56.85(0.6) |
| xz-6 | 71.45(4.05) | 74.87(7.47) | 75.74(7.31) | 80.46(6.29) | 71.94(3.17) |
| xz-9 | 71.44(4.05) | 74.87(7.48) | 75.74(7.31) | 80.46(6.31) | 71.94(3.17) |
| noComp | 57.78(-6.66) | 62.12(-2.32) | 62.68(-2.18) | 74.47(-0.8) | 58.23(-7.8) |

Only bodies

| compressor | optimistic | realistic | used | no rules | merge |
|---|---|---|---|---|---|
| bzip2-6 | 46.97(3.98) | 52.26(9.27) | 53.32(8.99) | 63.42(6.1) | 47.52(1.84) |
| bzip2-9 | 47.1(4.38) | 52.49(9.77) | 53.55(9.5) | 63.25(6.62) | 47.72(2.35) |
| gzip-6 | 53.08(4.81) | 57.57(9.3) | 58.6(9.19) | 66.16(7.33) | 53.74(2.97) |
| gzip-9 | 53.04(4.7) | 57.51(9.17) | 58.56(9.04) | 66.08(7.2) | 53.67(2.86) |
| xz-6 | 68.95(5.42) | 72.76(9.23) | 73.76(9.1) | 79.08(6.9) | 69.56(4.02) |
| xz-9 | 68.95(5.42) | 72.76(9.23) | 73.76(9.1) | 79.08(6.9) | 69.56(4.02) |
| noComp | 35.35(4.74) | 42.1(11.49) | 42.97(11.61) | 61.17(9.24) | 36.03(2.28) |

Performance

| compressor | optimistic | realistic | used | no rules | merge |
|---|---|---|---|---|---|
| CPU time [s] | 1304.51(393.25) | 820.32(-90.94) | 43.73(-2.24) | 6.84(2.84) | 2724.19(2246.15) |
| memory [MB] | 3896(48) | 1973(-1846) | 537(-93) | 305(82) | 12155(10978) |

Average StatsCompressor's Compression Ratios for compression of the CL_2 set in different models. The values in brackets are *value of (* this field *) − value of (* the same field for the test run on the LRT_A set *)*.

[Fig. 42]

Full files

| compressor | optimistic | realistic | used | no rules | merge |
|---|---|---|---|---|---|
| bzip2-6 | 3.02(1.17) | 3.08(1.23) | 3.11(-1.08) | 3.69(0.71) | 3.21(1.3) |
| bzip2-9 | 2.93(1.08) | 3.1(1.25) | 3.08(-1.1) | 3.58(0.61) | 3.24(1.35) |
| gzip-6 | 2.4(0.72) | 2.54(0.86) | 2.48(-1.15) | 3.08(0.74) | 2.6(0.91) |
| gzip-9 | 2.34(0.63) | 2.48(0.77) | 2.45(-1.21) | 3.05(0.75) | 2.55(0.88) |
| xz-6 | 1.85(0.04) | 2.16(0.35) | 2.17(-1.0) | 2.38(-0.28) | 2.1(0.1) |
| xz-9 | 1.85(0.04) | 2.15(0.34) | 2.17(-1.01) | 2.39(-0.27) | 2.1(0.11) |
| noComp | 3.21(-0.4) | 3.22(-0.39) | 3.06(-0.86) | 2.22(0.01) | 3.13(-0.18) |

Only bodies

| compressor | optimistic | realistic | used | no rules | merge |
|---|---|---|---|---|---|
| bzip2-6 | 2.96(0.5) | 3.24(0.78) | 3.16(-1.18) | 3.95(0.05) | 3.18(0.46) |
| bzip2-9 | 2.95(0.49) | 3.23(0.77) | 3.15(-1.16) | 3.91(0.21) | 3.2(0.43) |
| gzip-6 | 2.49(-0.14) | 2.8(0.17) | 2.79(-1.39) | 3.42(-0.1) | 2.75(-0.13) |
| gzip-9 | 2.5(-0.13) | 2.81(0.18) | 2.81(-1.45) | 3.44(-0.09) | 2.78(-0.11) |
| xz-6 | 2.01(-0.92) | 2.46(-0.47) | 2.47(-1.49) | 2.67(-1.0) | 2.37(-0.8) |
| xz-9 | 2.02(-0.91) | 2.46(-0.47) | 2.47(-1.49) | 2.67(-1.0) | 2.37(-0.8) |
| noComp | 2.68(0.69) | 3.13(1.14) | 2.98(0.41) | 3.32(-0.2) | 2.93(0.52) |

Performance

| compressor | optimistic | realistic | used | no rules | merge |
|---|---|---|---|---|---|
| CPU time [s] | 272.36(176.99) | 95.92(0.55) | 3.89(-0.35) | 0.63(0.43) | 1846.93(1680.49) |
| memory [MB] | 1431(1126) | 191(-112) | 24(-29) | 19(13) | 12016(11364) |

Standard deviations of StatsCompressor's Compression Ratios for compression of the CL_2 set in different models. The values in brackets are *value of ( this field )* - *value of ( the same field for the LRT_A set )*.

DATA COMPRESSION SYSTEM

CROSS REFERENCE TO RELATED APPLICATIONS

This application is a National Stage of International Application No. PCT/JP2014/002844 filed May 29, 2014, claiming priority based on U.S. Provisional Patent Application No. 61/828,953 filed May 30, 2013, the contents of all of which are incorporated herein by reference in their entirety.

TECHNICAL FIELD

The present invention relates to a data compression system, a data compression method, a correlation-for-data-compression extraction device, and a program.

BACKGROUND ART

In a distributed system such as a scalable storage, in order to address bugs or to improve performance, operating conditions of respective software components and system statuses of hardware resources are collected at regular intervals as statistic information.

The statistic information consists of enormous amounts of data. To analyze problems in the system using statistic information obtained from the client side, for example, it is desirable to collect statistic information as much as possible. Meanwhile, there is a case where the amount of data that can be downloaded is limited due to security reasons, for example. As such, there is a need to compress data and transmit the compressed data in order to transmit larger amount of statistic information without increasing the size of the packages.

As described above, in order to achieve a given object such as performing an analysis based on collected data, a large quantity of data may be stored or transferred. In that case, it is desirable to compress data in order to address security problems as described above, or from the viewpoint of costs.

As a technique of compressing data, Patent Document 1 has been known, for example. Patent Document 1 discloses a technique of grouping data of a compression-target data group based on a distribution of consistency in item information, and compressing data in which the information has been rewritten according to the determined information accuracy.

CITATION LIST

Patent Literature

PTL 1: JP 2012-168671 A

SUMMARY OF INVENTION

Technical Problem

As described above, in the case of obtaining data for investigation or the like, obtaining large volumes of data may be crucial. However, a desirable compression ratio was not always achieved only by the compression performed using the above-described technique.

Further, when performing compression of data along with processing such as data transfer for investigation, it is necessary to compress data while maintaining high reliability. However, it is much difficult to compress data efficiently while maintaining high reliability than simply compressing data.

As described above, there was a problem that it is difficult to compress data efficiently while maintaining high reliability.

In view of the above, an object of the present invention is to provide a data compression system capable of solving the above-described problem, that is, a problem that it is difficult to compress data efficiently while maintaining high reliability.

Solution to Problem

In order to achieve the above-described object, a data compression system, which is an aspect of the present invention, includes a correlation extraction means for extracting, from a collected given data set, at least one candidate for a correlation between values of data constituting the given data set;

a correlation verification means for verifying whether or not the given data set satisfies the correlation extracted by the correlation extraction means; and a data compression means for compressing the given data set with use of the correlation, based on the result of verification by the correlation verification means.

Further, a data compression method, which is another aspect of the present invention, includes extracting, from a collected given data set, at least one candidate for a correlation between values of data constituting the given data set;

verifying whether or not the given data set satisfies the extracted correlation; and based on the result of verification, compressing the given data set with use of the correlation.

Further, a correlation-for-data-compression searching device, which is another aspect of the present invention, is a correlation-for-data-compression extraction device that extracts a correlation for compressing given data, the device including a correlation extraction unit that extracts, from a collected given data set, at least one candidate for a correlation between values of data constituting the given data set; and a correlation verification unit that verifies whether or not the given data set satisfies the correlation extracted by the correlation extraction unit.

Further, a program, which is another aspect of the present invention, is a program for causing an information processing device to realize a correlation extraction means for extracting, from a collected given data set, at least one candidate for a correlation between values of data constituting the given data set; and a correlation verification means for verifying whether or not the given data set satisfies the correlation extracted by the correlation extraction means.

Advantageous Effects of Invention

As the present invention is configured as described above, the present invention is able to realize a data compression system capable of compressing data efficiently while maintaining high reliability.

BRIEF DESCRIPTION OF DRAWINGS

FIG. 1 is a block diagram showing an overall configuration of a data compression system according to a first exemplary embodiment of the present invention.

FIG. 2 is a block diagram showing an exemplary configuration of the storage system shown in FIG. 1.

FIG. 3 is a block diagram showing an exemplary configuration of the statistics mining device shown in FIG. 1.

FIG. 4 is a table showing exemplary statistics stored in the statistics mining device shown in FIG. 3.

FIG. 5 is a table showing an exemplary window generated by the window generation means shown in FIG. 3.

FIG. 6 is a diagram showing an example of correlation extraction performed by the correlation extraction means shown in FIG. 3.

FIG. 7 is a diagram showing an example of correlation extraction performed by the correlation extraction means shown in FIG. 3.

FIG. 8 is a diagram showing an example of correlation extraction performed by the correlation extraction means shown in FIG. 3.

FIG. 9 is a diagram showing an example of verification processing performed by the correlation verification means shown in FIG. 3.

FIG. 10 is a diagram for explaining a storing method when correlations are stored in the rule file shown in FIG. 3.

FIG. 11 is a block diagram showing an exemplary configuration of the statistics compression device shown in FIG. 1.

FIG. 12 is a flowchart showing an exemplary operation of the statistics mining device shown in FIG. 1.

FIG. 13 is a flowchart showing an exemplary operation of the of the statistics mining device shown in FIG. 1, when searching for correlations in a window.

FIG. 14 is a flowchart showing an exemplary operation of the statistics compression device shown in FIG. 1.

FIG. 15 illustrates an exemplary Zstat file in a second exemplary embodiment of the present invention.

FIG. 16 is a schematic diagram showing an overall configuration of the second exemplary embodiment of the present invention.

FIG. 17 is a diagram for explaining a mining operation in StatsMiner.

FIG. 18 is a diagram for explaining a verification operation in StatsMiner.

FIG. 19 is a diagram showing an exemplary configuration of a window generated by StatsMiner based on the Zstat file shown in FIG. 15.

FIG. 20 is a diagram, showing an example of storing rules found by StatsMiner as a tree.

FIG. 21 is a table showing exemplary performance results of StatsMiner.

FIG. 22 is a graph showing examples of percentages of minimal significance of different types of rules.

FIG. 23 is a table showing examples of average compression ratios of StatsCompressor and performance results of StatsCompressor.

FIG. 24 is a table showing example of absolute compression ratios.

FIG. 25 is a table showing exemplary performance of external compressors.

FIG. 26 is a diagram for explaining a compressing operation in StatsCompressor.

FIG. 27 is a table showing exemplary results of compressing LRT_A set using rules discovered in the LRT_A with renumbering disable.

FIG. 28 is a table showing exemplary results of compressing the LRT_A set using rules discovered in the LRT_A with flattening of abstraction classes disabled.

FIG. 29 is a table showing exemplary results of experiment in StatsCompressor in which only compression of constants was performed.

FIG. 30 is a table showing exemplary compression ratios of StatsCompressor for compression of the LRT_A set using transformats as a sole compression method.

FIG. 31 is a table showing an example of the number of times that transformats were used specifically.

FIG. 32 is a table showing exemplary compression ratios of StatsCompressor with deviation vectors disabled (only strict correlations are allowed).

FIG. 33 is a table showing exemplary statistics of the usage of rules loaded from rule files, when compressing the LRT_A set with rules discovered on LRT_A set.

FIG. 34 is a table showing exemplary compression ratios of StatsCompressor for compression of the LRT_A set using only identity rules discovered in the LRT_A set.

FIG. 35 is a table showing exemplary differences between compression ratios when varying percentages of the used sum rules.

FIG. 36 is a table showing exemplary compression ratios of StatsCompressor for compression of the LRT_A without using any rules found by StatsMiner.

FIG. 37 is a table showing exemplary compression ratios of StatsCompressor for compression of LRT_B set using rules found on the LRT_A set.

FIG. 38 is a table showing exemplary differences in the average compression ratios of StatsCompressor when varying percentages of rules having a given minimal importance.

FIG. 39 is a table showing exemplary compression ratios of StatsCompressor for compression of the LRT_B set using only rules already used for compression of LRT_A set.

FIG. 40 is a table showing results of performing both StatsMiner and StatsCompressor on a client's site.

FIG. 41 is a table showing exemplary average compression ratios of StatsCompressor when running the designed solution on CL_2 set in different models.

FIG. 42 is a table showing exemplary standard deviations of results when running the designed solution on CL_2 set in different models.

DESCRIPTION OF EMBODIMENTS

First Exemplary Embodiment

A first exemplary embodiment of the present invention describes a data compression system 1 (data compression system) which compresses statistics (data, data group) generated by collecting operating statuses of the respective software units running of a storage system 2 and hardware resources at given intervals, with use of correlations between the statistics.

Referring to FIG. 1, the data compression system 1 in the present embodiment includes the storage system 2, a statistics mining device 3 (correlation-for-data-compression extraction device), and a statistics compression device 4. The storage system 2, the statistics mining device 3, and the statistics compression device 4 are communicably connected with one another over a network. Further, the storage system 2 and the statistics compression device 4 are communicably connected with each other.

The storage system 2 is configured such that a plurality of server computers are connected with one another. Referring to FIG. 2, the storage system 2 includes accelerator nodes 21 (21a, 21b, . . . , hereinafter each of them is denoted as an accelerator node 21 if no distinction is needed) and storage nodes 22 (22a, 22b, . . . , hereinafter each of them is denoted as a storage node 22 if no distinction is needed). Further, all of the storage nodes 22 are connected with one another over a network. On the other hand, although the accelerator nodes 21 are connected with all of the storage nodes 22, there is no connection among the accelerator nodes 21. Further, the accelerator nodes 21 are connected with a client's server, the statistics mining device 3, and the statistics compression device 4.

The accelerator node 21 is a server computer which controls storing and reading operations of the own storage system 2. The accelerator node 21 works as a gateway to the storage system 2, and has a function of providing a data access API.

The storage node 22 is a server computer including a storage device for storing data. The storage node 22 holds data obtained via the accelerator node 21.

It should be noted that the storage system 2 may include a hybrid node in which the features of the accelerator node 21 and the features of the storage node 22 are combined, instead of the accelerator node 21.

Further, the number of the accelerator nodes 21 and the number of the storage nodes 22 are not limited to those shown in FIG. 2. The storage system 2 may include a larger number of, or a smaller number of, accelerator nodes 21 and storage nodes 22 than those shown in FIG. 2.

The storage system 2 of the present embodiment includes the accelerator node 21 and the storage node 22 as described above. Processes to be executed on the servers of both the accelerator node 21 and the storage node 22 collect various statistics. Specifically, the respective software units running on the respective servers collect statistics. Here, in the system like the storage system 2 of the present embodiment, there is a case where similar statistics appear in a plurality of units, such as in the case where information is transmitted and received between respective units, for example. This means that as the respective units operate in cooperation with each other, there may be correlations between the statistics collected by one unit and the statistics collected by another unit. The data compression system 1 of the present embodiment is configured to compress statistics with use of such correlations.

It should be noted that the operation of the accelerator node 21 and the operation of the storage node 22 differ from each other, as described above. Accordingly, the statistics collected by the accelerator node 21 and the statistics collected by the storage node 22 are not necessarily the same. As such, description will be given below on the case of compressing statistics collected by the storage node 22.

In this case, the storage system 2 transmits statistics collected from each of the storage nodes 22 to the statistics mining device 3 via the accelerator node 21.

It should be noted that compression targets of the data compression system 1 are not limited to the statistics collected from the storage node 22. The data compression system 1 may be configured to compress the statistics collected from the accelerator node 21, or may be configured to compress the statistics collected from both the accelerator node 21 and the storage node 22.

Further, the storage system 2 of the present embodiment is configured to collect statistics from each node and transmit them to the statistics mining device 3. This means that one file including the statistics to be transmitted to the statistics mining device 3 includes statistics collected by the respective units on one storage node 22. However, when carrying out the present invention, it is not necessary to have the above-described configuration. This means that one file including the statistics to be transmitted to the statistics mining device 3 may include statistics collected by the respective units on a plurality of nodes.

The statistics mining device 3 is an information processing device which performs mining on a set of statistics transmitted from the storage system 2, and searches for given correlations (mathematical correlations and the like) such as correlations between different statistics or intracorrelation of one statistic. The statistics mining device 3 includes a CPU (Central Processing Unit) not shown, and storage devices (memory and hard disk). The statistics mining device 3 is configured to realize the functions described below by the CPU executing a program installed in the storage device.

Referring to FIG. 3, the statistics mining device 3 includes a data transmission/reception means 31, a statistics database 32, a window generation means 33 (may be part of a correlation extraction means and a correlation verification means), a correlation extraction means 34, a correlation verification means 35, and a rule file 36.

The data transmission/reception means 31 has a function of transmitting and receiving statistics and rules, described below, with the storage system 2 and the statistics compression device 4. The data transmission/reception means 31 receives (may via the statistics compression device 4), from the storage system 2, statistics (a file including statistics) collected from each of the storage nodes 22 on the storage system 2, for example. Then, the data transmission/reception means 31 stores the received statistics in the statistics database 32. Further, the data transmission/reception means 31 transmits rules (verified rules) stored in the rule file 36, described below, to the statistics compression device 4, for example. Transmission of rules by the data transmission/reception means 31 is performed each time a predetermined period has passed.

The statistics database 32 is a storage device such as a memory or a hard disk. The statistics database 32 stores statistics received by the data transmission/reception means 31. As such, the statistics database 32 is configured to store different types of statistics by each file (by each node). It should be noted that the statistics database 32 may store a plurality of files by combining them in one file.

FIG. 4 shows exemplary statistics stored in the statistics database 32. Referring to FIG. 4, the statistics database 32 stores, in one file, a statistic A, a statistic B, a statistic C, and a statistic D, which are collected by a unit A, and a statistic E, a statistic F, and a statistic G, which are collected by a unit B, for example. In this way, the statistics database 32 stores statistics collected by a plurality of units in one file.

Further, the statistics database 32 stores 10, 20, 10, 15, 12, 13, 14, 16, 15, and 14, as samples (data values) of the statistic A, for example. The statistics database 32 also stores 6, 16, 11, 12, 13, 14, 15, 15, 15, 10, 10, 12, 14, 16, 2, 1, and 31, as samples of the statistic E, for example. This means that the statistics database 32 stores 10 samples as the statistic A (statistic A is a data group including 10 samples), while storing 17 samples as the statistic E (statistic E is a data group including 17 samples). In this way, the number of samples of the respective statistics stored in the statistics database 32 may differ from one another.

The window generation means 33 has a function of generating a window (localized search range) which is a range for searching for correlations from the statistics (file including the statistics) stored in the statistics database 32. Here, a window is a set of comparable, same-length sequences of samples of all available statistics. As such, a window is a localized search range of correlations such that each statistic includes the same number of samples (such that the number of data values constituting each data group becomes the same). Accordingly, the length of the window is the number of samples which is the same in any statistics (for example, 10 to 20, the predetermined number), and the width of the window is the number of types of the statistics. It should be noted that the window may or may not include information relating to the time of collecting each samples.

The window generation means 33 generates a window shown in FIG. 5, using the statistics shown in FIG. 4, for example. Referring to FIG. 5, the window generation means 33 generates a window having length 10 and width 7, using the statistics shown in FIG. 4. As such, the window generation means 33 generates a window in which each of the 7 types of statistics includes 10 samples. In this way, the window generation means 33 is able to divide one file into a plurality of windows. Then, the window generation means 33 transmits the generated window to the correlation extraction means 34 and the correlation verification means 35.

It should be noted that the window generation means 33 generates a window by obtaining a given number of statistics in the order of getting them. This means that the window generation means 33 obtains samples of the respective statistics in the order that they stored in the statistics database 32 and generates a window, without considering timestamps of the samples of the respective statistics. The window generation means 33 may generate a window by means of this method. Meanwhile, the window generation means 33 may generate a window while considering timestamps. In this way, the window generation means 33 can generate a window using statistics stored in the statistics database 32 by means of various methods.

Further, the window generation means 33 may be configured to reuse previously generated windows. This means that the window generation means 33 may be configured to obtain statistics (sample strings) at random from a plurality of windows which have been generated previously, and generate a new window using the obtained sample strings. Further, the window generation means 33 may be configured to generate a window in which the number of types of statistics is limited.

The correlation extraction means 34 has a function of extracting correlations based on the relation between the respective statistics in the window generated by the window generation means 33. Further, the correlation extraction means 34 may be configured to use various heuristic approaches when extracting correlations from the respective statistics.

Specifically, the correlation extraction means 34 of the present embodiment extracts constant correlations, identity correlations, and sum correlations, from the samples of the respective statistics in the window. Further, the correlation extraction means 34 performs a heuristic approach when searching for constant correlations and identity correlations.

Hereinafter, an exemplary operation of the correlation extraction means 34, when extracting correlations, will be described using the exemplary window shown in FIG. 5.

First, the correlation extraction means 34 extracts a constant correlation. Referring to FIG. 6, as all of the samples of the statistic G are 7, it seems that the statistic G is a constant. As such, the correlation extraction means 34 finds a constant correlation in the statistic G (finds that there is a rule of statistic G=constant). Further, as a heuristic approach, the correlation extraction means 34 removes the statistic G, having the constant correlation found, from the window. This means that if the correlation extraction means 34 founds a constant correlation as a predetermined type of correlation, the correlation extraction means 34 removes the statistic having such a constant correlation. Thereby, 6 statistics, from the statistic A to the statistic F) are left in the window.

Next, the correlation extraction means 34 extracts an identity correlation. Specifically, the correlation extraction means 34 extracts an identity correlation using a method as shown in FIG. 7. Referring to FIG. 7, the correlation extraction means 34 changes the order of the sample strings of the respective statistics in the window, into lexicographic order. This means that the correlation extraction means 34 changes the order of the sample strings such that a statistic having a smaller number comes upper, when viewed sequentially from the number in the sample located at the left of the window. Then, the correlation extraction means 34 compares the sample string of a statistic and the sample string of another statistic located immediately below, and find a pair of statistics which are determined to be identical based on the predetermined criteria. Here, the predetermined criteria for determining that statistics are identical may be a case where the respective samples constituting a statistic and the respective samples constituting another statistic are completely identical, for example. Further, the predetermined criteria for determining that statistics are identical may include A case where the sample string of a statistic and finite differences between adjacent samples in the sample string of another statistic are the same, for example. For example, as shown in FIG. 7, in the statistic A and the statistic B, all of the sample values are the same. Accordingly, the correlation extraction means 34 determines that there is an identity correlation between the statistic A and the statistic B (finds that there is a rule of statistic A=statistic B). Further, as shown in FIG. 7, the respective sample values of the statistic B or the statistic A and the values of a dstatistic C which are finite differences in the statistic C, are the same. Accordingly, the correlation extraction means 34 determines that there is an identity correlation between the statistic B or A and the dstatistic C (finds that there are rules of statistic B=dstatistic C, and statistic A=dstatistic C).

Through the above-described processing, the correlation extraction means 34 extracts identity correlations. Then, as a heuristic approach, the correlation extraction means 34 performs processing to leave a representative of the abstraction classes in the window. In the case shown in FIG. 7, the values of the statistic A and the statistic B are the same, as described above. As such, the correlation extraction means 34 deletes the samples of either the statistic A or the statistic B. Thereby, the samples of either the statistic A or the statistic B are left in the window.

Then, the correlation extraction means 34 extracts a sum correlation. Specifically, the correlation extraction means 34 adds the samples of each two statistics, and checks whether or not the result equals to the existing samples of the statistics (the correlation extraction means 34 may be configured to check three or more sums). Further, when searching for a sum correlation, the correlation extraction means 34 may use finite differences of the samples of the respective statistics. For example, referring to FIG. 8, it is found that the statistic D is the sum of the statistic E and a dstatistic F which is the finite difference of the statistic F. As such, the correlation extraction means 34 finds that there is a sum correlation between the statistics D and the statistic E and the dstatistic F (finds that there is a rule of statistic D=statistic E+dstatistic F).

With the method described above, the correlation extraction means 34 extracts correlations from the samples of the respective statistics generated by the window generation means 33. Then, the correlation extraction means 34 transmits the rules explaining the extracted correlations (rules before verification) to the correlation verification means 35. For example, the correlation extraction means 34 transmits the rules before verification such as statistic G=constant, statistic A=statistic B, statistic B=dstatistic C, statistic A=dstatistic C, and statistic D=dstatistic E+dstatistic F, to the correlation verification means 35.

It should be noted that the correlation extraction means 34 may be configured to store the rules explaining the extracted correlations (rules before verification) in the rule file 36, instead of transmitting them to the correlation verification means 35.

Further, the method of extracting correlations by the correlation extraction means 34 is not limited to that described above. The correlation extraction means 34 may be configured to extract correlations by finding whether the samples satisfying the predetermined correlations exist in the window. Further, the correlations extracted by the correlation extraction means 34 are not limited to those described above. The correlation extraction means 34 may be configured to extract rules based on linear combination between statistics or regression.

The correlation verification means 35 has a function of applying a rule before verification received from the correlation extraction means 34 (or a rule stored in the rule file 36) to each window, to thereby verify whether or not the rule before verification can be applied to each window.

Specifically, as shown in FIGS. 9(A) and (B), the correlation verification means 35 applies a rule before verification received from the correlation extraction means 34 (or a rule stored in the rule file 36) to each window generated by the window generation means 33 to thereby verify the significance of the rule. For example, the correlation verification means 35 verifies whether or not the rule is applicable to each window, and measures the number of windows in which application has been successful. Then, based on the number of windows in which application has been successful, the correlation verification means 35 calculates the significance of the rule. For example, the correlation verification means 35 calculates the significance by dividing the number of windows in which application has been successful by the number of all target windows.

Then, the correlation verification means 35 stores the verified rule in the rule file 36.

It should be noted that the significance, calculated as described above, can be used when the correlation verification means 35 stores the verified rules in the rule file 36, for example. This means that the correlation verification means 35 may be configured to store only verified rules having significance exceeding a predetermined storing threshold, in the rule file 36. Further, the significance can be used when the data transmission/reception means 31 transmits rules to the statistics compression device 4, for example. This means that the data transmission/reception means 31 may be configured to transmit only rules having significance exceeding a predetermined transmission threshold, to the statistics compression device 4.

The rule file 36 is a storage device such as a memory or a hard disk. The rule file 36 is configured to store verified rules transmitted from the correlation verification means 35. Specifically, the rule file 36 receives a verified rule from the correlation verification means 35. Then, the rule file 36 stores the received verified rule. The verified rule stored in the rule file 36 will be transmitted to the statistics compression device 4 via the data transmission/reception means 31. It should be noted that the rule file 36 may be configured to also store rules before verification (rules transmitted from the correlation extraction means 34).

FIG. 10 shows an exemplary storing method for a verified rule to be stored in the rule file 36. As shown in FIG. 10(A), the rule file 36 may be configured to store combinations of the respective rules cyclopaedically (to list data satisfying correlations cyclopaedically) as a combinational approach, for example. Further, as shown in FIG. 10(B), the rule file 36 may be configured to store rules as abstract concepts, as an approach based on abstraction classes, for example. Further, as shown in FIG. 10(C), the rule file 36 may be configured to store rules by a tree method which is a combination of general rules showing correlations and their exceptions, for example. The rule file 36 may be configured to store rules using any method other than the three methods described above.

The statistics compression device 4 is an information processing device which compresses statistics using rules found and verified by the statistics mining device 3. The statistics compression device 4 includes a CPU (Central Processing Unit) not shown, and storage devices (memory and hard disk). The statistics compression device 4 is configured to realize the functions, described below, by the CPU executing a program stored in the storage device.

Referring to FIG. 11, the statistics compression device 4 includes a data transmission/reception means 41, a statistics file 42, a verified rule file 43, and a statistics compression means 44.

The data transmission/reception means 41 has a function of transmitting and receiving statistics and verified rules with the storage system 2 and the statistics mining device 3. The data transmission/reception means 41 receives statistics (file including statistics) transmitted by the storage system 2, for example. Then, the data transmission/reception means 41 stores the received statistics in the statistics file 42. Further, the data transmission/reception means 41 receives verified rules transmitted by the statistics mining device 3, for example. Then, the data transmission/reception means 41 stores the received verified rules in the rule file 43.

The statistics file 42 is a storage device such as a memory or a hard disk. The statistics file 42 stores statistics transmitted from the storage system 2 (received by the data transmission/reception means 41). The statistics stored in the statistics file 42 will be compressed by the statistics compression means 44 with use of the rules found by the statistics mining device 3, as described below.

The verified rule file 43 is a storage device such as a memory or a hard disk. The verified rule file 43 stores verified rules received by the data transmission/reception means 41. The verified rules stored in the verified rule file 43 will be used when the statistics compression means 44 compresses data, as described below.

The statistics compression means 44 has a function of compressing statistics stored in the statistics file 42 using verified rules stored in the rule file 43. The statistics compression means 44 obtains rules from the rule file 43. The statistics compression means 44 also obtains statistics from the statistics file 42. The statistics compression means 44 compresses the statistics obtained from the statistics file 42 using the rules obtained from the rule file 43. Then, the statistics compression means 44 stores the compressed statistics in a compressed statistics storage unit, not shown, for example.

It should be noted that the statistics compression means 44 may be configured to perform compression processing again using an external general compressor, after having compressed the statistics using the verified rules as described above.

Further, the statistics compression means 44 may be configured to find simple correlations, such as a constant correlation, by itself. In that case, the statistics compression means 44 may be configured to perform compression using correlations found by itself.

Further, the statistics compression means 44 may be configured to choose verified rules to be used for compression performed in accordance with predetermined criteria. The statistics compression means 44 may be configured to perform flattening of the abstraction classes or perform renumbering to exchange identifiers used by the statistics.

The configuration of the data compression system 1 is as described above. Next, operation of the data compression system 1 will be described. First, an exemplary operation of the statistics mining device 3 will be described with reference to FIG. 12.

Referring to FIG. 12, the data transmission/reception means 31 obtains statistics collected by each of the storage nodes 22 in the storage system 2 (step S101). Then, the data transmission/reception means 31 stores the obtained statistics in the statistics database 32.

Next, the window generation means 33 generates windows using the statistics stored in the statistics database 32 (step S102). It should be noted that the window generation means 33 may generate a new window by extracting statistics from windows previously generated by itself. In this way, the window generation means 33 generates windows.

Then, the correlation extraction means 34 extracts correlations in the windows (step S103). Thereby, the correlation extraction means 34 obtains rules (rules before verification). Then, the correlation extraction means 34 transmits the rules before verification to the correlation verification means 35.

Then, the correlation verification means 35 verifies whether or not the rule before verification, received from the correlation extraction means, is applicable to the respective windows generated by the window generation means 33 (step S104). For example, the correlation verification means 35 measures the number of windows to which the rule before verification are applicable. Then, based on the measured number of windows to which the rule is applicable, the correlation verification means 35 calculates the significance of the rule. Further, the correlation verification means 35 stores the verified rule in the rule file 36 (step S105). Then, the verified rules stored in the rule file 36 will be transmitted to the statistics compression device 4 via the data transmission/reception means 31, each time a predetermined period has passed, for example.

The exemplary operation of the statistics mining device 3 is as described above. Next, an example of extraction of correlations performed by the correlation extraction means 34 will be described in detail with reference to FIG. 13.

Referring to FIG. 13, the correlation extraction means 34 first extracts a constant correlation (step S201). Specifically, the correlation extraction means 34 extracts a statistic, in which the respective sample values are constant, as that having a constant correlation. Then, the correlation extraction means 34 removes the statistic having the constant correlation from the window which is the target for extracting correlations (step S202).

Next, the correlation extraction means 34 extracts an identity correlation (step S203). Specifically, the correlation extraction means 34 compares respective samples of adjacent statistics after lexicographically changing the order of the statistics in the window, to thereby extracts a pair of statistics determined as identical based on predetermined criteria. Then, the correlation extraction means 34 performs processing to leave one representative of each abstraction class in the window (step S204). This means that if a correlation of A=B is extracted, the correlation extraction means 34 removes the sample values of either A or B from the window. Thereby, only samples of either A or B is left in the window.

Then, the correlation extraction means 34 extracts a sum correlation (step S205). Specifically, the correlation extraction means 34 adds the samples of each two statistics, and checks whether the results equals to the existing samples of the statistics. When searching for a sum correlation, the correlation extraction means 34 uses finite differences of the samples of the respective statistics. Thereby, the correlation extraction means 34 extracts a combination of statistics having a sum correlation.

The exemplary operation of the correlation extraction means 34 is as described above. Next, an exemplary compression processing performed by the statistics compression device 4 will be described with reference to FIG. 14.

Referring to FIG. 14, the data transmission/reception means 41 of the statistics compression device 4 obtains statistics from the storage system 2 regularly (or when needed) (step S301). Then, the data transmission/reception means 41 stores the obtained statistics in the statistics file 42.

Further, the data transmission/reception means 41 of the statistics compression device 4 obtains verified rules regularly, for example, from the statistics mining device 3 (step S302). Then, the data transmission/reception means 41 stores the obtained verified rules in the verified rule file 43.

With these two operations, statistics are stored in the statistics file 42, and verified rules are stored in the verified rule file. Then, the statistics compression means 44 performs compression processing on the statistics stored in the statistics file 42 using the verified rules stored in the verified rule file 43 (step S303).

The example of statistics compression processing performed by the statistics compression device 4 is as described above.

As described above, the data compression system 1 according to the present embodiment includes the statistics mining device 3 provided with the correlation extraction means 34, and the statistics compression device 4. With this configuration, the data compression system 1 is able to perform statistics compression processing based on the correlations extracted by the correlation extraction means 34. In general, respective software units operate in cooperation with each other. As such, there are often correlations between statistics obtained by the respective software units. Accordingly, by compressing statistics using those correlations, it is possible to compress statistics more efficiently while maintaining high reliability.

Further, the statistics mining device 3 of the present embodiment includes the window generation means 33. With this configuration, it is possible to extract correlations in the window generated by the window generation means 33. In general, the number of samples of the respective statistics, from which correlations are extracted, is not necessarily the same. As such, when extracting correlations, it is necessary to extract correlations between statistics having different number of samples, whereby the algorithm becomes complicated. On the other hand, with use of a window, it is possible to extract correlations in a state where the respective statistics have the same number of samples.

Consequently, the algorithm for extracting correlations can be simplified. Further, clear criteria can be used when results are compared.

Further, the statistics mining device 3 according to the present embodiment includes the correlation extraction means 34 and the correlation verification means 35. With this configuration, a correlation extraction work performed by the correlation extraction means 34 and a verification work performed by the correlation verification means 35 can be separated. Consequently, parallel calculation can be performed more efficiently.

Further, the correlation extraction means 34 according to the present embodiment is configured to use some heuristic methods. Specifically, the correlation extraction means 34 is configured to, after extracting constant correlations, remove the statistics having such constant correlations from the window. Further, the correlation extraction means 34 is configured to, after extracting identity correlations, leave only one representative of each abstraction class in the window. With this configuration, an identity extraction work can be performed in the window from which statistics having constant correlations have been removed. It is also possible to extract sum correlations in the window from which statistics having constant correlations have been removed and statistics other than the representative of each abstraction class have been removed. In general, a work of extracting constant correlations is a lightweight work than a work of extracting identity correlations. Further, a work of extracting identity correlations is a lightweight work than a work of extracting sum correlations. As such, with use of the heuristic methods as described above, lightweight correlations can hide the heavier ones.

It should be noted that in the present embodiment, description has been given on the case of compressing statistics collected by the storage system 2. However, the present invention is also applicable without limiting to the case of compressing statistics collected by the storage system 2. For example, the present invention may be applied in the case of compressing statistics collected between grid servers.

Further, the object to be compressed by the data compression system 1 is not necessarily limited to statistics. The data compression system 1 can be used for compressing various types of data having correlations.

Further, while in the present embodiment the statistics mining device 3 and the statistics compression device 4 are different information processing devices, embodiments of the present invention are not limited to the above-described case. The present invention may be implemented by an information processing device including a statistics mining processor and a statistics compression processor. Further, the present invention may be implemented on the storage system 2.

Second Exemplary Embodiment

A second exemplary embodiment of the present invention will be described below in the form of a thesis.

Chapter 1 Introduction

Distributed systems are currently gaining increasing popularity. Their complexity makes it difficult to monitor them on-line, so methods of gathering the state of the system for delayed investigation are being developed. Obtaining volumes of data large enough may be crucial, thus compression algorithms are being improved. The thesis presents and assesses a new approach for compression of the statistics generated by a commercial, secondary-storage, distributed system—NEC HYDRAstor. statistics are frequently-probed values of thousands of measures built into the HYDRAstor, which aim to present the current state of the system.

The need for improving the compression of the statistics emerged from a real-life use case—investigation of the problems with the HYDRAstor running in the customer's datacenter requires obtaining the statistics. However, some institutions significantly limit the amount of data that can be downloaded from them due to security reasons. Naturally, having a small quantity of samples of the statistics dramatically increases the time and effort spent on the analysis of a problem with the system, so there is a need to enlarge the number of samples of the statistics that are being obtained from the customers without increasing the size of passed packages. On the other hand, the proposed solution should be lossless because any distortion of values of samples after decompression may lead to false conclusions drew from the analysis of such statistics.

The aim of the thesis is to present a method of efficient, lossless compression of the statistics, which is adjusted to the close cooperation with NEC HYDRAstor system. Proposed solution was implemented, so different experiments were conveyed on the created software to measure the achievable compression ratios and performance. The solution presented in the thesis enables support engineers to receive more samples of the statistics from the customer's installations without downloading more data. As a result, the quality of service of the HYDRAstor rises, because investigation of the state of HYDRAstor is simpler.

The thesis consists of six chapters.

2. 'Background' contains a brief introduction to the NEC HYDRAstor, which is important for understanding of the decisions made while preparing the solution.

3. 'The distributed model of correlation-based compression' presents the concept of the proposed solution.

4. 'Correlations miner' describes and assesses the first of the two implemented tools, named a StatsMiner. Evaluation is being made both on some artificial data and on the statistics received from customers.

5. 'Compressor' describes the second of the implemented tools, named a StatsCompressor. The chapter contains also an evaluation of the tool on some artificial data and discusses a few models of cooperation of StatsMiner with StatsCompressor.

6. 'Evaluation on real statistics obtained from customers' evaluates the implemented software and different models of its usage on the statistics received from customers.

7. 'Related work' summarizes other research conveyed in the fields touched upon by the thesis. On that basis, some suggestions for future work are being made.

Chapter 2 Background

The problem that is tried to be solved in the thesis appeared during the usage of the NEC HYDRAstor system, so the solution should address the specific requirements of HYDRAstor. Due to that, a short description of the mentioned system, concerning constraints it puts on the developed solution, is needed. A comprehensive specification of HYDRAstor can be found in [DGH+09].

The chapter contains three sections.

2.1. 'General overview of HYDRAstor' contains a description of the HYDRAstor system. Many important terms, referred to later, will be defined here.

2.2. 'System monitoring' discusses logs collecting and analyzing issues, including the HYDRAstor point of view. The section also contains broadened explanations of why the research described in the thesis is important.

2.3. 'Gathering statistics in HYDRAstor' presents some technical details of the process of gathering statistics in the HYDRAstor system and formats of files used for storing the statistics, as the described solution has to fit in the framework.

2.1. General Overview of HYDRAstor

HYDRAstor, provided by NEC Corporation, is an enterprise level, scalable, secondary storage system, making use of hard drives instead of tape drives. It supports writing backup data with high throughput and low latency, which are crucial requirements for this kind of software. It is of such great importance because backup windows always have a very limited length due to the fact that backup operation may dramatically reduce the efficiency of the backuped system. This constitutes a major constraint for the solution described in the thesis—no software running alongside HYDRAstor can have a negative impact on the write performance.

As write is a primary operation conveyed in HYDRAstor, it will be described with a little more detail. When entering the system, the byte-stream of backup data is being divided into a stream of variable-sized, immutable chunks. If some chunks already exist in the system, this fact will be discovered thanks to the usage of chunks' content hashing, and such chunks will not be written twice. This process is called inline deduplication and usage of this concept is crucial for HYDRAstor's performance. If the chunk should be stored, decision where to put it should be taken. HYDRAstor is in fact a fault-tolerant distributed system, consisting of a group of servers. To preserve the consistency of data in case of server or disk failure, each chunk is erasure-coded by applying to it Reed-Solomon codes. SHA-1 hashes of the encoded chunks and Distributed Hash Table concept are used for determining a logical place of storing the chunks. Finally, the data is being transferred by the internal network to the physical node corresponding to the logical one selected in the previous step.

Naturally, it is possible to read data from HYDRAstor, although this process is not so common and thus not so important as the writing, so the system was optimized for writing rather than reading. Reads are generally not frequent.

Finally, data can be deleted from HYDRAstor. The trade-off for a fast, low latency writing is that the deletion process becomes rather complex and acts as a garbage collection mechanism. There are three distinct phases, each having different impact on the system. First of all, if an order to remove some data from the system is received, it affects the internal metadata only and real data still exist on drives. To decide which physically stored chunks should be erased, a special process called deletion should be run. Its aim is to mark some chunks as 'to-remove'. Deletion is a complex, distributed algorithm and will not be described here, albeit full description can be found in [SAHI+13]. However, there are some facts about deletion which should be considered while developing statistics compression. First of all, deletion is run periodically and rather rare usage of this tool is preferred. It means that statistics of this process stay constant for the long periods of time. Secondly, it consumes substantial resources while operating, so HYDRAstor can behave differently when deletion is in progress. It is worth pointing out that deletion can run simultaneously with writing. As it has been already stated, deletion only marks some physical chunks as unused. To retrieve the disk space, a space reclamation process should be run. Contrary to the deletion process, space reclamation does not have much impact on HYDRAstor and is just one of many processes run from time to time as so-called background tasks.

2.1.1. Versions

There are three main versions of the HYDRAstor system—H2, H3 and H4. H2 is the oldest one commercially used, H3 is the most popular among customers and H4 is the one being currently introduced to the market. These numbers stand for both hardware and software as HYDRAstor is being sold as a complete solution—specially designed servers with the aforementioned software installed on them.

Naturally, NEC publishes patches and updates for the product. As the system is being heavily utilized in large corporations (which are main target group of HYDRAstor), applying patches may be a very difficult and time-consuming process—there should be a service window large enough to do all the maintenance. Due to that, consumers install only these patches they really need. As a result, there exist many different subversions within every version of HYDRAstor. It is not surprising that each subversion can behave slightly differently so the designed solution for the statistics compression should be appropriately flexible. Moreover, HYDRAstor has many configuration parameters which are used for performance tuning according to the specific customer's needs.

Correlation-based statistics compression will be used at least in H4 systems, although the possibility of simple porting it to the previous versions will definitely be a plus.

2.1.2. Physical Architecture

Each installation of HYDRAstor consists of two kinds of servers dedicated to two different tasks. The heart of the system are Storage Nodes (SN), which hold the data. All storage nodes are joined together via network connections. Another kind of servers are Acceleration Nodes (AN) which work as a gateway to the HYDRAstor, providing data access API. Each AN is connected with all SNs but there are no links between any two ANs. ANs are connected to the customer's servers also (SNs are not).

The distinction between ANs and HNs is important for the statistics compression because processes running on the both kinds of servers gather statistics but these statistics are not the same and the nodes behave differently. In H3 version processes of ANs and HNs have about 50 000 statistics each, however statistics of processes running on AN nodes contain much more constants.

In the H4 version, instead of AN there are Hybrid Nodes (HNs), which combine the features of old ANs and SNs. In this configuration, processes from old ANs and SNs run simultaneously on the same machines.

It was decided to convey all the experiments presented in the thesis on the statistics gathered from SN or HN nodes (in the case of HNs, only statistics from the storage processes were taken into account). There were a few technical reasons for it. Moreover, in this approach results of the experiments are more consistent. It is believed, that the compression ratio of the statistics generated by processes from ANs will be even better than this of the statistics gathered from SNs.

2.1.3. Software Architecture

Architecture of a Single Node

HYDRAstor is a concurrent application, making extensive use of message passing communication. Different subsystems of HYDRAstor (called units) exchange messages with each other thanks to the OOSF Framework (Object—Oriented Server Framework). Moreover, OOSF Framework schedules execution of the units code on its own threads (it implements the idea of user-space threads). If there is a message for a specific unit, this unit is put into a queue and waits for an idle scheduler's thread to execute it. The scheduler does not offer any form of preemption so the code is run until the control returns to the scheduler or the running thread sends a message. As it can be easily seen, the scheduler definitely does not offer any constraints on the period of time of running a piece of code. The concept of OOSF Framework will be important when the process of gathering statistics will be described.

Each unit has its own characteristic and a set of specific statistics it generates. This statistics will not be individually described here because they are very specialized and there are too many of them. On the other hand, certain phenomena should be mentioned here. First of all, units often count the number of messages they receive and send so it seems, that there would be some statistics which equal to the sum of other ones. Secondly, some of the statistics will be identical, for example when a specific type of messages is sent between two units only and these messages are counted in both units. Another similar situation takes place when a message triggers an action (being counted) or another kind of message to be sent. A glance at these two examples from the higher perspective results in discovery of another, 'sociological' source of identities—sometimes the same thing can be counted in a few places due to some engineering reasons. Firstly, having same things counted in two places (so having two names as well) may be more convenient in the case of system maintenance. HYDRAstor is a performance critical software, although the ease of maintenance is even more important. Secondly, developers of distinct units sometimes do not know that their colleagues already have created some code logging the same event, sometimes a few years earlier. It seems to be caused by the lack of communication between the teams or just a simple fact that people cannot exchange excessively detailed knowledge about every single piece of code. According to this, a hypothesis can be put forward that in each system that is sufficiently large there would be some repetitions of statistics or logs. Repetitions of statistics seem to be easy to reduce through preparation of a tool able to generate some missing ones based on some rules. The only problem is where to obtain these rules from. Preparing expert knowledge—based rules is often too expensive because it involves reading the code of software and making decisions, whether two statistics are always the same or if some rare exceptions exist.

Distributed System Perspective

As it has been stated before, HYDRAstor is a scalable, fault-tolerant distributed system. Each physical node can host multiple logical servers called components. Components can migrate from one node to another in many situations, for example if a faulty disk has been discovered or a system needs rebalancing due to its extension. What is more, the number of components can change in time—if the amount of data grows, a split of component may be needed to achieve better performance. Naturally, changes in the distribution of components are not very common but statistics from such events are frequently analyzed as they depict a kind of a corner case of the system. There is a number of statistics connected with each component and they are being gathered on the node on which the component actually resides. It means that in the case of component transfer between physical nodes, some statistics cease to be gathered on an old node and become logged on the other.

2.2. System Monitoring 2.2.1. Motivation

The survey [OGX12] identifies five reasons for gathering logs:
1. debugging,
2. performance,
3. security,
4. reporting and profiling,
5. prediction.

The first two—debugging and performance—are the most important for HYDRAstor. As it has been mentioned before, the designed solution should improve the quality of maintenance of HYDRAstor installations at customer's site in the case of bugs occurrence or expectations concerning performance improvements. To achieve this goal, statistics are often used as a source of knowledge about the specific hardware and software configuration and the current state of the system. This usage exploits to some extent the item 'reporting and profiling' from the list above. However, authors of [OGX12] go further and describe the usage of an artificial intelligence (for example clustering tools) for preparation of semi-automatically generated reports about the system. It seems reasonable to consider whether this kind of tool will not be usable in the HYDRAstor maintenance, especially that it would help in preliminary visualization of problematic areas. When it comes to 'prediction' point, HYDRAstor already has an anomaly detection tool. It leverages expert-knowledge based rules for discovering misbehavior of the system. The last item from the list above, which has not been mentioned yet, is security. It seems that security problems (perceived as intrusions or breaches) do not apply to HYDRAstor because the system is a 'very' backend solution and security is already being enforced by the higher layers of software (especially software creating backup).

2.2.2. Logs and Statistics

Up to now the term 'logs' and 'statistics' have been used interchangeably and now it is time to make a clear distinction between them and explain why statistics are so extensively used in HYDRAstor.

Traditionally, a 'log' consists of a number of lines, each having a timestamp, describing a singular event in the system—for example receipt of the message. Logs are generally extremely verbose, which can act both as up- and downside. As the single log message (generally) maps to the single event, debugging based on logs is easier because it is possible to get all the details of the event. At the same time, big systems gather huge amount of logs in this sense so it puts a visible, negative impact on the performance. Moreover, getting a set of messages connected with a specific situation requires extensive filtering and transforming. Also obtaining a full image of the system behavior is more complicated because it involves parsing and aggregating data from logs.

Statistics, as they are used in HYDRAstor, are a sequences of samples gathered periodically. For example, every 20 seconds a number of requests passed to the each disk is being dumped. The number of requests is known but all the knowledge about the sources of requests or specific type of it is lost, what makes debugging more complicated. However, it seems not be a problem for experienced maintainers, as the example of the HYDRAstor shows. On the other hand, statistics facilitate the process of getting the overall image of the system because making a plot out of them involves the minimal amount of parsing and transforming. The biggest advantage of this approach is the fact, that it conserves disk space and thus minimizes impact on the performance. Statistics can be treated as higher level logs—they give overall perspective at the price of reducing the details by aggregating data. It is possible to convert messages from logs into statistics but not the other way round. Statistics are in fact a kind of lossy compression of logs.

HYDRAstor gathers both logs and statistics but statistics are more important. Classical logs cover the most important situations, for example failed assertions. Some legacy code still logs certain common situations but as it has strong impact on performance, such code is being transformed to use statistics instead. Statistics in HYDRAstor are used for saving all the information about the current system state. As it was described before, each machine generates about 50 000 of different statistics, depending on the role in the installation and software version.

2.3. Gathering Statistics in HYDRAstor 2.3.1. Process of Gathering Statistics

Gathering statistics in HYDRAstor can be divided into several phases.

The first one can be called unit-local: each unit has a map of counters representing statistics. Appropriate events trigger actions on these counters. It should be mentioned here, that described counters do not store any timestamps.

The second phase is node-local: One specialized unit periodically sends a message (MessageRequestStats) to other units to pass back the current values of their statistics (values of counters). Receipt of this message sometimes results in resetting some of the statistics, for example those informing about "recent" changes. The answer message is being redirected to the StatsGather module which is responsible for storing data on disk. StatsGather dumps statistics in one of the formats which will be described in the next subsection (see Par. 2.3.2).

The node-local phase has some special characteristics which have been taken into account while designing the solution described in the thesis. The most important problem is that the scheduler does not guarantee that any set of messages (especially any subset of the sent MessageRequestStats) will be delivered synchronically to their recipients. It means that if there are two statistics which are always identical but reside in different units, their values may differ slightly. The variations are mostly very small but it makes the problem of finding correlations much harder. Moreover, it also affects the compression. This issue will be addressed later. On the other hand, this problem has no impact on the statistics which originate from the same unit.

Another impediment connected with the node-local phase of gathering statistics is the fact, that statistics may be requested from different units with different frequency. Currently, all units are asked for statistics every 20 seconds, however it is planned to allow some units to be inquired every 5 seconds. As a result, the designed software should be able to compare samples gathered with different frequency.

Statistics which are stored on disk wait until the user requests them (the download-phase) or they become old enough to be deleted to conserve the space. Nowadays there are no other ways of utilizing the statistics in HYDRAstor. Admittedly there is an anomaly detection tool but it works online.

As it can be noted, statistics from different nodes are never merged into one file. Such an action would involve much network traffic and seems not to give any benefits in the download-phase, because if the user has to download statistics, there is no difference between downloading data from one node or from a few, especially that there are scripts which automate the process. On the contrary, a single file contains the statistics gathered from all the units running on the node.

2.3.2. Formats of Files Storing Statistics in HYDRAstor

HYDRAstor, probably as any piece of commercial software with extended market presence, uses a few types of formats for storing statistics and evolution of formats can be seen across various versions of the system. There are naturally some expectations a statistics file should meet. Although statistics are being mostly visualized using a special tool (called StatsViewer), there is sometimes a need for manual manipulations of the files. Due to this, a good format should enable easy manipulations using standard unix tools such as grep, cut, sort etc. On the other hand, such files should not use too much space and generating them should not have an impact (neither CPU nor memory consumption) on the working system.

XML Files

XML files are the oldest ones used in HYDRAstor for storing statistics. A file consists of a few (about 20) markups describing metadata and the rest of the file are markups, one per line, each of them informing about exactly one statistic—there is a name, time offset, frequency of gathering and sequence of samples. Such organization of data has many advantages—it is readable for humans, the process of generating a file is not complicated and there are some existing XML-parsers on the market. On the other hand, XML files use a lot of disk space. This problem is mitigated by compressing the files using gzip tool. XML files are however not used anymore in the H4 version, so designed solution is not expected to directly read files in this format.

Zstat Files

The Zstat file format was introduced by one of the updates for H3 and has become the base format for storing statistics since then. Introducing it was a part of extension of the functionality of the statistics gathering module. This format offers better space utilization and now exact time of gathering the samples is being saved. However, the format is hand-made so a special parser was delivered. Like in the case of XML files, Zstat files are being compressed using an external compressor. This issue will be discussed later in the thesis.

The designed software should support Zstat files. The practical side of it will be described later but theoretically this format puts all the practical constraints on the created solution. First of all, utilized compression should be lossless compression from the point of view of Zstat files—compressed and decompressed Zstat file should be izomorphic to the base one. Secondly, compressed files will be compared to the base Zstat files to determine the compression ratio. According to it, the format of the files created by StatsCompressor will be called Zplus to highlight these two requirements.

Zstat files are comprised of two sections, each having the same number of lines (see FIG. 15). In the first section, each line contains a name of one statistic some metadata of it and a numerical identifier, which is unique to the file. In the second section, each line (except for a few, which are sequences of timestamps) contains an identifier of a statistic and a sequence of its samples. Please note that timestamps will not be described in detail in the thesis because the designed solution does not use them, so they are being treated as a kind of metadata and are just copied to the Zplus files. It is important, that each statistic in the file may have different number of samples. Zstat files are compressed using gzip compressor.

Pack Statistics

The Pack statistics format was designed in the first attempt to solve the problem of minimizing Zstat files size in the case of downloading them from the customer restricting the amount of downloaded data. Pack statistics files are created in the download-phase by a special tool from a regular Zstat files. There is also a similar program converting back Pack statistics into Zstat file.

The described file format is similar to the Zstat file format but numerous simple tricks are used to make the files smaller. First of all, such files contain a subset of all statistics only. The user can define it manually or leverage one of the predefined cut schemes that were manually defined by the HYDRAstor's developers. Secondly, Pack statistics files are compressed using bzip2 tool, in contrast to gzip in the case of Zstat files.

A Zstat file consists of two main parts (see Par. 2.3.2): a mapping of the statistics' names to the numerical identifiers and a mapping of the mentioned identifiers to the samples' sequences' values. It can be observed that the real names of the statistics have long common prefixes (for example, METRIC::DataSynch::DiskRequestManager::RequestsCount::total::requestsInProgress::RecentMax and METRIC::DataSynch::DiskRequestManager::RequestsCount::cannotExecuteBecauseOfLimit::Current).
In Pack statistics files, name to identifier mapping is described in the form of a tree, which has stems (METRIC, DataSynch, DiskRequestManager, etc.) in the inner nodes and identifiers in the leaves. This approach reduces the space consumption by about 20-30%.

The designed solution may be merged into Pack statistics tools during productization phase. All the ideas presented above could be used by the designed StatsCompressor. The way the name-identifier mapping is compressed seems to be quite effective and will not be improved at this point, especially that the thesis focuses on the problem of samples' compression. The idea of limiting the number of statistics in the file makes sense only if the user knows exactly which statistics are really needed and it is not so common in practice while starting the investigation of a bug. In such a case, the predefined set of arbitrarily defined, 'important' statistics is downloaded. Using these files is harder due to the lack of many statistics, which are interesting in the specific situation. It is believed that the designed solution will made the situation, when restricting the statistics' file content is necessary, very rare.

Database Files

All the formats described up to now are used to store the statistics at the consumer's site and to transfer it to the support team. StatsViewer, the tool used for making plots from statistics, is able to read the aforementioned formats (except for Pack statistics, which need to be converted first) but it needs to load all the data into memory. If statistics from long period are being analyzed, opening them takes a long time. From this problem the need for on-demand statistics loading arouse. The solution is a conversion of statistics' files (of different formats) into one, standardized database format. In fact, database files are sqlite databases, which hold already parsed data, ready to use by Stats Viewer. It should be mentioned that databases are created on the support team's machines only—they are never created at customer's site nor transferred through the Internet due to their size and specific application.

From the point of view of the searched solution, database files are interesting as an input for some of the created tools because it allows the programs to read files in only one format, as there are converters making database files from any version of XML or Zstat files.

Chapter 3 The Distributed Model of Correlation-Based Compression

The thesis proposes a new method of minimizing the size of files containing statistics that are being downloaded from customers. The solution should be lossless and do not have a negative impact on the HYDRAstor system running on the customer's machines. As it was already mentioned in Par. 2.1.3, it is believed that many statistics are correlated with other ones and the thesis presents a method of compression which tries to leverage this fact. On the other hand, the described solution was designed to cooperate with HYDRAstor, so it can use some domain-knowledge about the format and content of the compressed files.

The central concept of the thesis is a correlation, that is a relationship between samples of a few statistics. For example, if there are two statistics in a file (statistics f and g) having the same sequences of samples' values (f (0)=5, f(1)=3, f(2)=8 and g(0)=5, g(1)=3, g(2)=8) they are correlated—there is an identity between them (it will be noted as f=g). Such correlation can be used during compression of the file (in fact, a correlation-based compression), because it is enough to dump the sequence of samples of statistic g and save the information, that there is also a statistic f and f=g. Naturally, identity is just a very simple example of correlation—more complicated are for example sums (so h=j+k, where h, j, k are statistics).

Technically, there are two types of correlations—strict correlations and weak correlations. Previous paragraph presented a strict one: f=g. An example of weak correlation is the following identity—there are statistics $f_w$ and $g_w$, $f_w$ (0)=5, $f_w$ (1)=3, $f_w$ (2)=8 and $g_w$ (0)=5, $g_w$ (1)=6, $g_w$ (2)=8, and there is $f_w=g_w+d$, where d=[0, 3, 0] and it is called a deviations vector. In fact, there is always a weak correlation between any set of statistics. Naturally, the better a weak correlation is, the smaller numbers the deviations vector contains. The concept of deviations vector will be important in the chapter about StatsCompressor (Chapter 5). In the thesis, if the notion of the correlation is used, it is always a strict correlation (unless the weak correlation is explicitly mentioned).

Correlation-based approach have been implemented in the form of a stand-alone tool named StatsCompressor. The tool will be run on the customer's machines to compress the files in Zstat format (see Par. 2.3.2) containing statistics. The tool outputs a file in a Zplus format, which is extended version of Zstat format. The StatsCompressor uses correlation-based approach and some domain-knowledge about the format and the content of the Zstat files.

A single Zstat file contains thousands of statistics and each statistic have many samples, so numerous correlations between the statistics can exist. Discovering the correlations on the customer's machines might have a strong, negative impact on the performance of the simultaneously running HYDRAstor, so it was decided to prepare a separate tool, named StatsMiner, which will be used for searching for the correlations while running on the support's site machines. The tool reads database files for flexibility and produces a file containing rules. A single rule describes a single correlation between statistics. Rules are enriched with some metadata about the quality of correlation, for example how many times the correlation was found. StatsCompressor uses the rules created by StatsMiner for conveying a correlation-based compression.

StatsMiner and StatsCompressor form a distributed compression-model, presented in FIG. 16. The figure shows a consecutive operations that should be conveyed to download statistics from a customer, compressed with the usage of the designed software.

StatsMiner runs at the support team's site and StatsCompressor at the customer's site. The support team runs StatsMiner on the set of example files to create the rules file. The currently implemented version of the tool has not achieved the fully planned functionality—some algorithms are being proposed in the thesis but they were not implemented due to the lack of time. However, at present, the number of rules created by StatsMiner is too big to upload all of them directly to the customer, so some kind of selection of the rules has to be done. This limited set of rules is being occasionally transferred to the customer, for example with a package containing a set of patches and updates, and then stored on the hard drives of the customer's machines.

If the support team needs to download statistics from the customer, a selected file in Zstat format is being compressed using StatsCompressor. Naturally all the Zstat files could be automatically compressed when created but it seems to be a waste of resources—the aim of the research was to increase the number of samples downloaded by the support in case of limited available bandwidth. It was decided that StatsCompressor will be exploiting domain-knowledge only, not running any algorithms on the byte level. The aim of this assumption was to focus on the high level correlations between statistics and not on the lower, byte level. It was believed that existing general-purpose compressors will carry out this kind of compression faster and better. Moreover, implementing such an algorithm will be very error-prone. Ready Zplus file is being downloaded from the customer.

Obtained Zplus file should be decompressed to recreate the original Zstat file (as the used compression methods are lossless). During the research, the decompressor was not implemented due to the lack of time, however it could prove that the original and de-compressed Zstat file are identical. A meticulous review of the implemented compression algorithms had been done for proving that methods of compression are lossless. There were also functional tests which checked whether StatsCompressor produces Zplus files adhering to the specification.

The presented distributed model of cooperation of StatsMiner with StatsCompressor is the most general one. Other models will be discussed later in Par. 5.10.

In the subsequent chapters, a notion of finite difference operator, the following Math 1 defined in [GKP94], will be extensively used: the following Math 2. It should be noted that in the following description, "d" is used in place of Math 1, as shown in the following Math 3.

$$\Delta \quad \text{[Math.1]}$$

$$\Delta f(x) = f(x+1) - f(x) \quad \text{[Math.2]}$$

$$\Delta = d \quad \text{[Math.3]}$$

Chapter 4 Correlations Miner

This chapter contains a description and evaluation of StatsMiner, which is a tool for discovering correlations in the statistics. The rules describing the correlations found will be used later by StatsCompressor to compress the files with statistics.

The chapter contains following sections:

4.1. 'General overview' presents the concept of StatsMiner—the problems it should solve, the high-level architecture, the main assumptions and the selected technology.

4.2. 'Testbed' describes the methodology of StatsMiner testing and the data used during this process.

4.3. 'Windows' defines one of the most important entities used in StatsMiner, which is a window. Apart from the definition, different algorithms for preparing windows are presented. One of them was implemented.

4.4. 'Storing the discovered rules' addresses the issue of keeping the discovered rules in RAM as it was found to be crucial for the performance of the tool.

4.5. 'Types of correlations' introduces a division of correlations' discovery algorithms.

4.6.-4.8. 'Global inter algorithms' 'Local inter algorithms', 'Intra algorithms' describe the specific mining algorithms, divided into the categories presented in Par. 4.5. Note that not all the concepts have been implemented (especially none of the local inter algorithms have) albeit all of them are discussed to build a comprehensive image of the possible features of StatsMiner.

4.1. General Overview

Correlations miner, named StatsMiner, is a data-mining tool created as part of the research described in the thesis and was used for searching for correlations between statistics. It was created as a tool to be run on developers' machines, at least in the experimental phase of the entire project. Depending on the resources' consumption, part of it or the entire application may be merged into StatsCompressor during the productization (see Par. 5.10.4). The code of StatsMiner was written in the way enabling fast productization—it adhered to the coding standards and good practices, was object-oriented etc.

The tool reads database files (see Par. 2.3.2) and outputs CSV files containing rules.

4.1.1. Problem Statement

Any correlation between statistics can be described using an equation. It is believed that almost all relationships among analyzed statistics can be described with linear equations (although finite differences of statistics are allowed). This assumption is based on the expert-knowledge of HYDRAstor developers who do not expect other genres of correlations (ie. quadratic) to appear. Linear algebra delivers some tools for discovering linear dependences (for example Gaussian Elimination), although they have two flaws—first of all, they require that the number of analyzed statistics is the same as the number of samples of every statistic. If there is about 50000 statistics and, moreover, their finite difference are being included, it would mean that 100 000 samples of each statistic would be required and since, normally, statistics are being gathered every 20 seconds, samples from 23 days of gathering would be needed! The second problem with this approach is that Gaussian Elimination has complexity of $O(n3)$ so in the case of usage of 100000 statistics the time of computations would be unacceptably high. Another constraint is laid down by the memory consumption—storing a matrix of size 100 000*100 000 containing C++'s doubles would consume 75 gigabytes of memory!

As mining for linear dependencies is impossible, some requirements imposed in the results should be weakened to make the problem easier and thus solvable. First of all, it seems quite obvious that coefficients of correlations will be integers—this observation comes from the nature of statistics which are describing a discrete space of events. Unfortunately, searching for linear dependencies having integer coefficients is an NP-hard problem—there is a simple reduction from the subset-sum problem. As the researched problem cannot be limited to a more constrained one, another approach has been chosen. There would be plenty of simple algorithms run on input data, each of them discovering another kind of precisely defined relationship between statistics. The result of this approach will be some subset of results that would be gained from a true search for linear correlations but computing the aforementioned subset is achievable.

4.1.2. Phases

The main function of StatsMiner is to dig up the correlation in the statistics. A few first runs of the tool have proved that it can find even billions of correlations, so soon the need of precise quantitative information about the correlations became apparent. Moreover, as the amount of data to be searched was very large (100 000 of statistics at a time), some heuristics for speeding up the process of mining were engaged. The most important one was that if a kind of correlation on a few statistics has been found, they were being removed from the working set before the search for the other kinds of correlations. This issue will be described in detail when dealing with specific algorithms but one of the effects of this approach is that lightweight correlations can hide the heavier ones.

To deal with such situations, the work of the tool has been split into two phases. The first phase was a mining phase (FIG. 17) during which correlations in the set of statistics are dug from scratch. Naturally, it is a time-consuming process. For example, mining on 100 000 statistics, each having 20 samples, takes about 300 seconds. Naturally, all the acceleration heuristics are used. The second phase is verification (FIG. 18). During this phase, the tool searches for occurrences of the correlations discovered before (or loaded from a file) and only checks whether the correlation applies or not to the working set. On the same set of data as presented before, it takes about 30 seconds.

The division into phases results in the possibility of better parallelization of the computations. The map-reduce paradigm fits best for the tool's usage pattern. In the case of mining and verification phases, the set of database files to be researched can be spread through a number of machines (map step) and in the reduce step, files containing generated rules can be easily merged into one.

In fact, the miner and the verificator can be two different programs. This approach may result in better performance of both (as they could be more specific and tuned) at the price of higher development and maintenance costs.

4.1.3. Choice of Programming Language

The program can be run on Linux, as the whole HYDRAstor software does, and is written in C++. The choice of the language was forced by a number of reasons. The pragmatic one was that developers of HYDRAstor use C++ and Python so choosing one of these two would make the development easier due to the possibility of using the existing code database and asking other programmers for help. Furthermore, the program was expected to consume much CPU and memory. Although the first requirement may be satisfied by usage of Python (C++ is naturally faster but the development process is much slower) but the second one caused the choice of C++. This was a good decision because the assumptions proved to be right. StatsMiner, run with the standard configuration, uses a few gigabytes of RAM and if the software was written in Python, this would make the application unusable due to poor garbage collection in Python.

4.2. Testbed 4.2.1. Testing Data

All the tests of StatsMiner were carried out on the following sets of data:

1. LRT_A—50 randomly selected Zstat files (from 5327 available files) from Long Running Test on H4 (there was 1 HN and 4 SNs). This test lasted for about two weeks and its aim was to simulate both normal usage of HYDRAstor and some corner cases too. The aforementioned files have been converted into Database format. Each file consisted of about 50000 statistics, each having 60 to 100 samples (although all the statistics in one file have about the same number of samples).

2. CL-30 randomly chosen XML files from among files received from real users (customers) of HYDRAstor. The files were generated by various versions of HYDRAstor system having various patches and updates installed. Only the files of size 2 MB to 4 MB and generated by SNs were approved for this test. The selected files have been converted into the database format. They contained about 50000 statistics, each having 140-240 samples (although all the statistics in one file had about the same number of samples).

CL and LRT_A test set contain different number of files (30 and 50), because usage of 50 files in the case of CL set resulted in the shortage of RAM due to a large number of found rules and experiments could not be accomplished successfully.

4.2.2. Measuring Performance

All the tests were run on the development machine with two Intel Xeons 5645 CPUs and 48 GB of RAM. The time and memory was measured using the time program, run with parameters % U (Total number of CPU-seconds that the process spent in user mode) and % M (Maximum resident set size of the process during its lifetime). The memory consumption results were corrected so they are not affected by the well-known counting bug in time [com13].

4.3. Windows

The window is the central concept in StatsMiner and can be described as a set of comparable, same-length sequences of samples of all available statistics. The length of the window is the number of samples in individual sequence. The width of the window is the number of statistics. In fact, window is a matrix. Note that window does not contain any information about a time of gathering any of the samples it contains—it is assumption that simplifies the usage of windows.

FIG. 19 presents an example window having length 10 and width 7. A single file can be chopped into many windows (compare FIG. 15, presenting an example Zstat file, with FIG. 19 showing one window generated from the mentioned file). Each algorithm searching for correlations expects a window as an input. Thanks to the windows properties (same number of samples of each statistic), implementation of the mining algorithms has been simplified. Another benefit of windows usage are clear criteria for results comparison—rules always apply to the specific number of well-defined windows. On the other hand, files analyzed by the tool can contain different number of samples of each statistic, so stating that 'rule was found in 3 files' is much more imprecise than saying 'rule was found in 3 windows'. The concept of window is extensively used during verification—having a rule describing a correlation and a window, two facts are checked and then saved for each rule (see FIG. 18): if the correlation can be applied to the window (all the expected statistics exist) and if the samples really fulfill the correlation.

The content of a window, as an input for mining algorithms, has a significant impact on the number and the type of the correlations found. Two independent issues are important—the size of a window and the algorithm for generating it (making a window out of statistics loaded from the database file).

Window generating seems to be trivial but some problems need to be faced during this process, making it quite complicated. As it was mentioned before, in HYDRAstor statistics can be gathered with different frequencies, the process of gathering is asynchronous at units' level, statistics may appear or disappear in every moment and finally samples are being stored in variable-length files (Zstat). Two algorithms for generating windows will be presented in the next section.

The size of the window has huge impact on the number and quality of correlations found in the given database file. As experiments have proved that too small windows can be misleading because correlations found can be just occasional but in excessively long windows many correlations may be missed because an asynchronous nature of statistics gathering process disturbs the samples in the way that strict correlations vanish. Strict-correlations are interesting because looking for them is much easier than searching for weak ones (see Par. 4.7.5).

The metric of the quality of correlation is its level of significance. For the correlation C it is defined as Math. 4.

$$\text{significance}(C) = \frac{\text{applies}(C)}{\text{appears}(C)} \qquad [\text{Math. 4}]$$

where
applies(C)=the number of windows to which correlation C strictly applies
appears(C)=the number of windows in which all the statistics expected by correlation C appear.

Plots of significance of the different correlations types will be presented in Par. 4.9.

If it is not explicitly stated, all rules described in the thesis have been generated on windows having length of 10 to 20 samples.

Note, that each window contains also finite differences of all its statistics—it is believed, that if f and g are statistics, there can be some correlations like df=g. This assumption is based on the fact, that there are some 'recent' statistics, which measure the change of some parameters in the last few seconds.

4.3.1. Windows Generating Algorithms

Window generation is a preparation of data for the mining algorithms—samples of statistics loaded from database have to be divided into windows as all the algorithms searching for the correlations work on windows.

In this subsection three approaches to creating windows will be described—two replaceable algorithms (Greedy and Timestamps-aware) and one idea of higher level source of windows (random windows). However, only the greedy algorithm has been implemented and described in detail. The remaining two are presented as possible extensions if Greedy Algorithm was not performing well (although it did).

Greedy Algorithm

Greedy Algorithm for window generating was the first one implemented. The idea of the algorithm is in general quite simple—for each statistic the algorithm loads samples from the database file and puts these data into the internal samples' queue of unlimited size. Each statistic has its own samples' queue. If the size of all statistics' samples' queues (except for empty ones) at least equal the minimal window length (M), first M samples of the each statistic are being moved from the queues to the new window. Naturally, a window cannot be longer than the desired maximal length. However, if one of the queues contains fewer samples (N) than the minimal window length, more samples are loaded from database. If there are no more samples in the database, that number of first samples (N) is being dropped from all the buffers.

The algorithm is called 'greedy' to depict the fact that it does not make use of timestamps of samples. It can lead to an error-prone situation when a window is created but there is a shift in timestamps of samples so they are theoretically not comparable in a column anymore (so if there are two statistics, f and g, and i-th sample is analyzed, f (i) cannot be compared to g(i)). Luckily, it concerns the inter-unit correlations only because i-th samples of the statistics of a one unit always have the same timestamps. Naturally, mining algorithms can find some improper correlations between two units if timestamps of samples are not being taken into consideration, but such correlations will get low grade in the verification phase. Another problem with this algorithm occurs if there are many statistics which appear or disappear at the same time, because it might be impossible to create any window.

The flaws of the algorithm are balanced by its advantages, mainly by speed. If n is the total number of samples to be used in computations, the complexity of the algorithm is O(n). The ease of use of correlations generated in this way is another upside of the algorithm because if StatsMiner does not use timestamps, StatsCompressor does not need them either, making that tool much faster and simpler—it can just take a few sequences of samples and try to apply fitting correlations to them. Finally, implementation of this algorithm was very fast and it is quite usable, as the number of correlations found is sufficiently large.

Timestamps-Aware Algorithm

The main problem with Greedy Algorithm is that it does not take into consideration timestamps of the samples. To address this problem, a Timestamps-aware Algorithm was planned to be designed. However, in the meanwhile, the generator of files in database format had been improved in a way that the greedy algorithm performed better (created more windows) than before. Moreover, good compression ratios achieved by StatsCompressor while working with the rules dug in the windows generated in the greedy way proved that using timestamps while generating windows is not as crucial as it seemed previously. Due to that Timestamps-aware Algorithm was not created and thus timestamps of the samples are not described in detail in the thesis, as they are not being used by any of the implemented algorithms.

Random Windows

Random windows are an idea to reuse (or rather 'recycle') windows generated by the algorithms described before. As it was mentioned, the StatsGather process is asynchronous so even if a correlation between statistics from two units objectively exists, there is still a chance that it will never be found due to slight deviations between compared samples. Such a phenomenon is not just theoretical—it had been observed in real data (while searching for a bug in StatsMiner). The size of a window was set to be 10 to 20 samples and two evidently identical statistics had deviations with probability of 10%. Sadly, there was at least one deviation in each generated window so a correlation was never found. Random windows address this issue.

The idea is to create a window from a few columns of samples taken randomly from windows generated in the classical way, for example all 4th, 6th an 7th samples from the first window and 1th, 6th and 8th samples from the second window will be transferred into a new random window. This new window will naturally satisfy all the expectations from the definition of a window, although the samples will not be consecutive anymore.

Depending on the total length of windows from which the sets of samples will be taken, the random window concept will help to fight with deviations in the samples. Naturally, the probability of deviation stays the same but it is possible to generate much more random windows than normal windows from one database file, and the more random windows are generated, the higher is the probability of getting random window having no deviations, thus containing strict correlation which was hidden before. Moreover, generating a random window is very cheap because all the samples are already stored in the memory (there is no need to read data from a database file) and can be programmed in the manner that no samples will be copied between old windows and a new, random one.

The algorithm has not been implemented due to the lack of time, although it seems to be an easy and efficient extension of StatsMiner.

4.3.2. Summary

Window is a convenient container for statistics and their samples and it makes the implementation of the mining algorithm much easier. The way windows are created has significant impact on the rules discovered by StatsMiner. One parameter is window length (as its width depends on the data loaded from the database), another is an algorithm used for inserting samples into windows. Greedy Algorithm is the only one implemented among concepts presented in this section. In practice it performed well (as many rules were found in the windows made this way), although using Timestamps-aware Algorithm may lead to obtaining more realistic correlations. On the other hand, random windows is a mean to walk round the limitation of the vast mining algorithms—impossibility of discovering weak correlations.

4.4. Storing the Discovered Rules

StatsMiner discovers correlations between statistics and creates rules to save the obtained knowledge. These rules should be stored somehow in memory and then on hard drive. There are two opposite methods to do it in a simple way (combinational and abstract-classes based approaches) and one complex method based on the best ideas from the simpler ones (by using a tree). In this section, f, g etc. represent different statistics.

In the combinational method of storing rules, each correlation of specific statistics is being stored separately. For example, if there is a correlation f=g, a rule describing the identity of f and g is being stored. However, to save the correlation $f_1=g_1=h_1$, there is a need to use three identity rules, each describing the relationship between two specific statistics. In abstract-class method, there is a need to use one rule to store a correlation f=g and also one rule only to store the correlation $f_1=g_1=h_1$.

Usage of the combinational method results in higher memory consumption, for example when dealing with a simple sum p=q+r, if $p=p_1$ and $q=q_1=q_2$ and $r=r_1=r_2=r_3$, 24 rules will be created to store all correlations! In the abstract-class method, only 4 rules will be created—one per each abstraction class and one for a simple sum. The question is, whether to save p=q=r and use these rule in the context of other rules describing abstraction classes of p, q and r, or to save the sum as $((p=p_1)=(q=q_1=q_2)+(r=r_1=r_2=r_3))$. To sum up, from the point of view of memory consumption, the abstraction—class based approach seems to be definitely better but the situation becomes more complicated when dealing with multiple windows.

Let us assume that in the window $W_1$ a correlation described before was found (the sum). However, in window W2 were similar but not the same correlations: $p=p_1$ and $q=q_1=q_2$ and $r_1=r_2=r_3$ (the following Math 5). If the combinational method was used, this change would not involve creation of new rules—it is enough to update usage counters (used for computing significance) of the existing rules. At the same time, there is no good solution for the abstract-class approach. One idea is to add new rules to describe the class $r_1=r_2=r_3$ (or $(p=p_1)=(q=q_1=q_2)+(r_1=r2=r_3)$), but what to do with the rule p=q=r—should a rule p=q=r1 be added? If yes, than in the case of W1 the same correlation will be represented (and thus counted in the verification phase) two times. This problem may be solved by splitting the rule $(p=p_1)=(q=q_1=q_2)+(r=r_1=r_2=r_3)$ into two rules: $(p=p_1)=(q=q_1=q_2)+(r_1=r_2=r_3)$ and $(p=p_1)=(q=q_1=q_2)+(r)$. This will solve the problem of wrong values of usage counters but the total count of rules can explode exponentially as every combination of subsets of (p, $p_1$), (q, $q_1$, $q_2$), (r, $r_1$, $r_2$, $r_3$) can occur. Alternatively, the rule p=q=r may be used, as there is a class $r_1=r$ and a notion of transitive closure may be leveraged. However, in this case every rule may apply soon to every window, as the number and size of abstraction classes will grow—consequently the rules usage counters will be totally misleading.

$$r \neq r_1 \qquad \text{[Math.5]}$$

Summing up, the abstraction-class based approach is a trade-off between the memory consumption and accuracy of usage counters. Besides, in the combinational approach the number of rules before and after verification is the same, albeit in the case of abstraction—class method, if splitting rules have been chosen as remedy for the counters problem, the number of rules after verification may increase dramatically.

Joining the advantages of both methods leads to storing each rule as a tree so all the rules create a forest. The thesis contains only a draft of this approach. The root of a tree contains the most general form of correlation (for example $(p=p_1)=(q=q_1=q_2)+(r=r_1=r_2=r_3)$—see FIG. 20), the inner nodes contain the list of information about splits of abstraction classes (for example, the following Math 6 and r), and leaves have usage counters. During the walk from the root to the leaf one can determine what is the value of usage counters of the set of correlations created by applying cuts from visited inner-nodes to the rule existing in the root. This representation uses at least the same amount of memory that the abstract-class method does (if there are no inner-nodes) and no more than the combinational method (with respect to the details of implementation of the tree) if only singleton abstraction classes exist. The complexity of this data structure is a cost for its memory effectiveness. This is only a draft of the approach that has not been tested in practice.

$$\emptyset \qquad \text{[Math.6]}$$

In the designed solution, the combinational method has been chosen as being simpler in implementation, faster in action (splits of abstraction classes seem to be expensive), fully accurate and having predictable (although high) memory consumption. Furthermore, the rules stored in the combinational manner are easy to visualize or sum up—it is enough to make some operations on counters. When rules are dumped on a hard drive, they are stored in the CSV format so it is easy to manipulate them using tools like Libre Office, Microsoft Excel or just bash scripts.

The abstraction-classes based approach may be a way of reducing the size of the rules when storing them at the consumer's site—all the mining can be done using the combinational approach and then data actually sent to clients may be converted into the abstraction-class form (especially if there were no need to have usage counters at that time). This can be perceived as a kind of lossless compression of rules files.

4.5. Types of Correlations

Correlations can be divided into two main categories—inter and intra. The most interesting are inter correlations, which depict relationship between two different statistics. The basic example of this type is identity (f=g, where f and g are two statistics). Totally different are intra correlations, affecting only one statistic and describing some repeatable characteristic of it. The simplest example of an intra correlation is a constant.

Another division of correlations is connected with the technical restrictions of mining algorithms—the ability to search for correlations in large sets of statistics. Search for the most types of simple correlations (like identities) can be carried out in the sets containing all available statistics (70000 after removing constant statistics). Such correlations (and thus mining algorithms) are called global correlations. On the other hand, more subtle correlations like linear combinations cannot be effectively found between many statistics at once (for example no more than 1000 at a time)—such correlations (and algorithms as well) will be called local correlations. Usage of local mining algorithms requires selecting first a subset of all the available statistics on which such an algorithm will be run—this constitutes the main difference between global and local mining algorithms.

From the compression point of view, inter correlations are the most valuable ones. The distinction between global or local makes no difference, although it is hoped that the number of global correlations is greater than that of local ones. On the contrary, mining for global correlations seems to be simpler and cheaper and this kind of analysis might be done at the customer's site if CPU and memory consumption will stay at an acceptable level.

Please note that in Chapter 3 a distinction between strict correlations and weak correlations was introduced. However, in general, all the correlations discussed in the thesis are strict.

4.6. Global Inter Algorithms

As it was stated before, searching for regular linear combinations is too costly, however it is possible to easily find some classes of linear combinations. Inter algorithms are looking for these special kind of relationships between different statistics in the window. In this and the following section n will be the number of statistics in the window (window's width) and k will be the number of samples of each statistic (window's length).

Note that only some of the presented algorithms have been implemented and assessed in practice: a Sorting Algorithm for identities discovery and a Brute Algorithm for simple sums discovery. Other algorithms should be treated as alternatives if the performance was not satisfying. Some algorithms have some possible extensions described. These extensions may increase the number of rules found.

4.6.1. Mining for Identities

Identity is the most basic example of inter-correlation. It is believed that the number of identities will be quite high due to the fact that the same event is often logged in different layers of the system independently, for example the number of messages received or sent.

Algorithms searching for identities discover abstraction classes of the vectors of samples in the window. To cut down the time of running of the subsequent mining algorithms (see FIG. 17), only one representative of each abstraction class is left in the window and the rest of the members are removed. On average, IdentityMiner gets windows containing 20366 statistics as an input and it outputs windows containing 12 236 statistics (both values computed for the LRT_A dataset).

Sorting Algorithm for Identities Discovery

Description

The idea of this algorithm is quite simple—each statistic can be treated as a vector of samples so statistics can be sorted using lexicographical comparator of samples' values. This step of algorithm has a complexity of O(kn log n) when using standard algorithms, like Merge Sort. The lower bound of complexity (the following Math 7) comes from decision trees analysis [Knu98] and this complexity has been achieved by the algorithm described in [FG05]. However, as the vectors of samples are being accessed in StatsMiner by pointers, authors of the aforementioned article suggest that also a classical Quick Sort can have the complexity of O(nk+n log n).

$$\omega(nk+n \log n) \quad [\text{Math.7}]$$

After sorting vectors of samples, it takes O(nk) time to check whether subsequent vectors are the same so the identity correlation can be registered. To summarize, the implemented algorithm has a complexity of O(nk log n), although the optimal-case complexity of O(nk+n log n) is theoretically achievable but requires more effort.

Naturally, if two statistics f and g are identical in a window, their finite differences are also identical (df=dg). However, there is no opposite implication (the following Math 8). The aim of StatsMiner is to produce rules for StatsCompressor so saving a rule f=g is sufficient. Due to practical performance reasons, rules df=dg are never created—it is a heuristic build upon an assumption that there are not many examples of (df=dg and the following Math 9).

$$df=g \not\Rightarrow f=g \quad [\text{Math.8}]$$

$$f \neq g \quad [\text{Math.9}]$$

Test Results.

The algorithm is fast (although theoretically not optimal) and produces many rules. In the example window (FIG. 19) the following rules will be created:

1. stat_alpha=stat_beta.
2. stat_beta=dstat_gamma.
3. stat_alpha=dstat_gamma.

Some identities found in true HYDRAstor's statistics (the meaning of their names will not be explained because it would require a precise description of the internals of the system):

1. DISK::sdb8::readsMergedPerSec=DISK::sdb8::readsPerSec
2. METRIC::Aio::aioCtx-shred::AioStat::numberReqsStarted=METRIC::Aio::aioCtx-shred::AioStat::numberReqsCompleted
3. METRIC::transaction::FP::05DM::t1::syncs::req::NumStarted=METRIC::transaction::FP::05DM::t1::creations::req::NumStarted Running the algorithm on the Customers' Logs took (in total) 21 seconds and 776 814 rules were generated (on average 57 210 rules per analyzed window). (Note that one rule may be discovered in many windows, so it influence the 'average number of rules per analyzed window' in the case of the each window separately, but the rule is counted only once when discussing the 'total' number of generated rules.) The analysis on LRT_A data resulted in digging up 561 560 rules in cumulative time of 54 seconds (on average 29 026 rules per analyzed window). The discussion of the results can be found in Par. 4.9. The significance of the discovered rules will be discussed in Par. 4.9.

Hashing Algorithm for Identities Discovery

Description

The main problem with the previous algorithm is that, in the worst-case scenario values of all samples in each vector should be compared to make an order over a set of vectors. One of the simplest ways to improve the speed of Sorting Algorithm is to compare the hashes of the vectors first—and to fall back to the vector's values comparison only in the case of the hashes being equal. The rest of the previous algorithm remains unchanged. The hashing method can be freely chosen.

The worst-case complexity of the algorithm still remains O(nk log n) but the average-case complexity is O(nk+n log n). What is important, upgrade of the regular Sorting Algorithm to its hashing version should be quite simple if hashing of the vectors is already implemented.

As the sorting algorithm for identities discovery performed well, the hashing version has not been implemented.

4.6.2. Mining for Simple Sums

A simple sum is a sum of statistics with all the coefficients equal to one: f=g+h+ . . . ). This kind of relationship seems to be very common among the statistics, because there are often both a counter representing the quantity of a class of events and some other counters presenting the number of subclass events. To be more specific, an example from HYDRAstor is METRIC::transaction::FI::State::opened::NumStarted=METRIC::transaction::FI::State::opened::NumOutstanding+METRIC::transaction::FI::State::opened::NumFinished.

The more elements a sum has, the higher complexity has an algorithm. Algorithms presented below were designed to search for sums of two statistics (f=g+h) because otherwise their theoretical complexity was too high. In practice they could be used to mine for sums of more elements if their performance is acceptable because the only known substitute for them is a search for full linear combinations (see Par. 4.7.4), which is costly too but merely a local method only.

Mining for simple sums is very expensive so any kind of useless work should be avoided at this point. If mining for sums is run together with mining for identities, all the abstraction classes discovered by algorithm mining for identities in the window can be reduced to one representative only—if this representative appears in any sum, then each member of its abstraction class can appear in the same place. As it was described before, StatsMiner stores rules in memory in the combinational form. Due to that, finding a rule in which a representative of one of the abstraction classes appears results in adding many new rules to the database. Owing to it, StatsMiner can use huge amounts of memory (many gigabytes) and, moreover, a performance slowdown is observed (because of traversing through data structures). Naturally, in general it is good that so many sum rules are being created, but from the point of view of compression, identity rules are preferred over sum ones and creating too many sum rules is just a waste of resources, as they are useless in practice. To slightly cut down on memory consumption, it was decided not to look for sums consisting of finite differences only (they are found but dropped). It was believed that this kind of relationship is not common in reality but may often appear occasionally. This decision proved to be very fortunate as the performance of StatsMiner improved substantially—it was possible to end mining in LRT_A set, using about 30 GB of memory, whereas earlier the developers machine quickly ran out of memory.

On average, any algorithm of the class described in this section gets windows containing 12 236 statistics as an input (for the LRT_A set).

Brute Algorithm for Simple Sums Discovery

Description

A Brute Algorithm is not very sophisticated—samples of each two statistics are summed and then it is checked whether the result equals to any existing statistics. The cost of the algorithm is $O(kn2+kn2 \log n)=O(kn2 \log n)$ because there are the number of pairs of statistics to be summed as shown in the following Math 10, summing one pair is linear to k and checking whether the result equals to the existing statistic means a binary search in the sorted set of statistics, having the complexity of $O(k \log n)$.

$$\frac{n(n-1)}{2} \quad \text{[Math. 10]}$$

The model of summing presented above assumes that addition is commutative. For floating-point numbers it cannot be true in the case of summing of a sequence of more than two elements if their representation uses different exponents. Moreover, rounding of results (numerical-errors) was a real problem in the implementation of this algorithm, even though the sums of only two elements were searched for. As a solution, long doubles are used for storing samples (instead of regular doubles).

Test Results

The algorithm created (in total) 25 803 555 rules for Customer Logs, working for 6137 seconds (on average 4 601 590 rules per analyzed window) Mining in LRT resulted in discovering (in total) 13 738 732 rules in 20 402 seconds (340 minutes), on average generated 431 324 rules per analyzed window. The long time of running the algorithm was caused by updating the database of rules due to the usage of the combinational form of storing rules. The discussion of the results can be found in Par. 4.9. The significance of the rules that were found is discussed in Par. 4.9.

The algorithm would find the following rule in the example window (FIG. 19): stat_delta=stat_epsilon+dstat_zeta.

Some sum rules found in true HYDRAstor's statistics (the meaning of their names will not be explained because it would require a precise description of the internals of the system):

1. METRIC::dci::NumFinisedGetReqs=METRIC::dci::HintVector@WI::NumNegHintHits(finitedifference)+METRIC::dci::NumHashArrayGetReqs(finitedifference)

2. DISK::sd12::totalBandwidth=DISK::sdl::writeBandwidth+DISK::sdl::readBan dwidth 3. DISK::sdb6::writesMergedPerSec=DISK::sdb12::readsMergedPerSec+METRIC::ackCollector::dataLocs::dataLocCacheSize::RecentAvg Possible Extension.

This naive algorithm is very costly and mining for sums of three elements seems not to be a good idea at all. On the other hand, simple heuristic can be implemented to make it reasonable. After discovering that some statistics (called lhss—left-hand sides) equal to the sum of some other statistics, one could try to sum lhss and check whether the results are not the same as any other existing statistics. The idea is based on the belief, that a hierarchy of counters often exists—there are some zero-level counters informing about the quantity of some events and there are some first-level counters being a sum of zero-level counters, etc.

Hashing Algorithm for Simple Sums Discovery

Additive Hashing

Hashing, as a method of decreasing CPU consumption of StatsMiner, was already suggested while discussing Hashing Algorithm for identities discovery (see Par. 4.6.1). The process of discovering sums can also take advantage of this approach, although a special hash function should be used—an additive one.

An additive hashing function should have the following property:
the following Math 11
Here,
the following Math 12, 13

$$H(\vec{f}+\vec{g})=H(\vec{f})+H(\vec{g}) \quad [\text{Math.11}]$$

$$\vec{f},\vec{g}: \text{vectors of samples of statistics} \quad [\text{Math.12}]$$

$$H: \text{a hashing function } Q^n \to N \quad [\text{Math.13}]$$

In fact, such a function is a kind of 'weakened' linear functional from the point of view of linear algebra (only additivity—not full linearity—is needed).

A good hashing function should have two properties (according to [Knu98]):
1. the computing hash value should be fast,
2. the number of collisions should be minimized.

The following function satisfies all the criteria mentioned in this section (it is a 'good hashing function' and it is linear too):
the following Math 14
Here
the following Math 15, 16
b: big natural number $$H(\vec{f}) = \left(\sum_i f[i] \cdot c[i]\right) \bmod b \quad [\text{Math. 14}]$$

$$\vec{f}: \text{vectors of samples of statistics} \quad [\text{Math.15}]$$

$$\vec{c}: \text{vector of not too small prime numbers} \quad [\text{Math.16}]$$

The function H as defined above is additive because all the operations it uses are additive. It can be computed fast, especially that SIMD instructions can be used for increasing the speed of computations (it is easy to implement this function in the way enabling the compiler to automatically vectorize it). There was a prototype implementation of this function and it proved that number of collisions is at an acceptable level, if b is as big as possible (a prime number is preferred, although $2^{64}$ is more practical on 64-bits machines) and c contains prime numbers big enough, so the following Math 17 is established for the most of values of (the following Math 18). On the other hand, H represents a kind of modular hashing function and such functions are believed to have good properties (according to [Knu98]).

$$f[i] \cdot c[i] > f[i] \cdot c[i] \bmod b \quad [\text{Math.17}]$$

$$[\vec{f}] \quad [\text{Math.18}]$$

The described function has been tentatively implemented (as the whole algorithm), although further work (and experiments) has been ceased due to impossibility of hashing float values in this manner while working on IEEE-754 floating points (rounding makes the whole idea unusable). The use of fixed point arithmetics would solve the problem, although it has not been finally implemented. Due to that, the algorithm worked well only for integer values.

Description

Hashing Algorithm resembles the brute one but it uses improved method of summing and comparing. Thanks to the additive hashing, it was possible to remove the k factor from complexity of the naive algorithm so the hashing one will have the average-time complexity of $O(kn+n^2+n^2 \log n)=O(kn+n^2 \log n)$. The k factor in the complexity of Brute Algorithm comes from comparing and summing of the samples, whereas when using the described hashing method, both operations can be conveyed in $(O(1))$ time. Naturally, hashes of all the statistics should be computed first and this step has a complexity of $(O(kn))$ but on the other hand, loading data into memory has the same complexity so in practice this cost can be neglected.

Tests Results

No performance experiments were conveyed on this algorithm because it was only partially implemented, not tuned enough and, as it was already mentioned, it does not work properly with floating point samples.

Possible Extensions

Naturally, the heuristic described while presenting Brute Algorithm can also be used with the hashing one. What is worth mentioning, the phenomena of hierarchy of counters is expected to appear with integer-values counters only, so even a weak method of hashing (having no support for fractional values) will be enough here. According to it, a hybrid approach is possible—the Brute Algorithm can be used to find out a first-level counters and higher-level counters can be found using the hashing one. The belief that hierarchy of counters can appear on integer-values statistics is based on the assumption that fractional-values statistics are used to describe time periods commonly and they are not so frequently summed together. What is more, if there are fractional-values higher-level counters, they are probably already contaminated with some numerical errors derived from the nature of float numbers so finding such sums can be extremely difficult.

4.6.3. Summary

Global inter algorithms are the most important source of the rules for StatsMiner. Among the presented conceptions, the Sorting Algorithm for identities discovery and the Brute Algorithm for simple sums discovery have been fully implemented, (functionally) tested and assessed. It turned out that they can discover a huge number of correlations and the way rules are stored is their main problem.

4.7. Local Inter Algorithms

The algorithms described in this section cannot be run on the whole window due to their characteristics or complexity. Unfortunately, none of the ideas presented here have been implemented in the described software because of the time constraints put on the project so they should be treated as the draft for future work.

4.7.1. Limiting the Window Width

Random Choice

The simplest method of limiting the width of the window (such window will be called a reduced window) is to choose the desired number of statistics randomly. It may be a good idea provided that the mining algorithms will be able to work well on the sets that are big enough. For example, in the case of mining on the LRT_A set, there are about 15 000 of statistics in the window at a time, when a local inter algorithm are planned to be run (see FIG. 17. If the local inter algorithm accepts windows cut down to the size of a 1000 statistics, choosing the content of these windows randomly seems to be quite good idea, although it should be tested in practice. On the other hand, if the algorithms might work on the windows containing 30 statistics only (which is more probable), a method of choosing the statistics based on some knowledge should be taken into account so the statistics in the windows will be in a relationship with higher probability.

4.7.2. Chose Based on Some Knowledge

In data mining, the classical approach for grouping similar objects is clustering. There is much research in this field so various methods of clustering have been proposed. [Sch07] summarizes the current state-of-the-art. Before some suggestions for choosing the best algorithm are presented, the problem of choosing the possibly correlated statistics should be transformed into the language of clustering.

Graph of Statistics

Clustering algorithms require a weighted graph as an input. In the case of statistics clustering, the vertexes will represent statistics and weight of edges will describe the similarity of the statistics at their ends. It is hard to say at this point whether the graph should be directed or not. The directed graph contains two times more edges than the undirected so clustering becomes slower but it can also store more information. The question is if the aforementioned property of the directed graph can be efficiently used in terms of the number of true correlations found in the cluster. It seems that this should be checked experimentally. All the heuristics evaluating the similarity of statistics can be applied to both versions of the graph.

Determining the Weight of Edges

The weight of an edge should represent the similarity of vertexes (representing statistics) it connects. Each of the heuristics for evaluating similarity, which will be proposed shortly, should return a floating point value from the range [0; 1]. The problem is, what should be the weight of edge if some heuristics return different values. There are two main approaches, which can be combined to some extent:

1. the weighted mean of the values returned by the heuristics,
2. choosing the minimum or maximum among the values returned by the heuristics.

The decision, how to determine the weight of the edges, should be based on the results of some experiments.

4.7.3. Heuristics of Similarity

The heuristics proposed in this chapter should asses the similarity of a two statistics, given them as the input. Performance is a critical requirement because preparing a set of statistics for analysis should rather not take more time than the analysis itself. Only the concepts of heuristics will be presented here.

The heuristics can be divided into two antagonistic categories—static and dynamic. Static heuristics, contrary to the dynamic ones, does not use the real values of samples of the assessed statistics. They mainly analyze the names of statistics, trying to recover some knowledge developers had left in them. This approach is based on the belief that humans name things in an organized manner and there are only a few ways for naming similar entities. On the other hand, dynamic heuristics base on the values of statistics, trying to discover similarity that exists in the current window.

Both kind of heuristics should be used to get a comprehensive image of the similarities among statistics in the window because each kind of heuristics has some flaws that are mitigated (to some extent) by the other kind. Static heuristics aggregate some general knowledge, which in fact cannot be applied to the specific situation, whereas dynamic heuristics add some local point of view into the results. On the other hand, dynamic statistics are much biased by the accidental similarities of statistics that have nothing in common but this second fact can be discovered by the static heuristics only.

Static Heuristics

Same Prefixes

Names of statistics in HYDRAstor consist of a list of terms which appear in the general-to-specific order. In fact, the names of statistics form a tree (see Par. 2.3.2. The shorter a path in a name-tree statistics is (the longer their common prefix is), the more similar they are. An example of very similar statistics is METRIC::DataSynch::SynchronizerTask::SCC_RECONSTRUCTION::numTasksStarted and METRIC::DataSynch::SynchronizerTask::SCC_RECONSTRUCTION::numTasksFinished.

Same Stems

As is was already stated, names of statistics consist of lists of terms. Moreover, each of these terms is built up from words (called stems), written in Camel Case notation, so the single stem can be easily extracted from a long name. Natural language seems to be very flexible when it comes to giving names but there is a limited set of words that can be used for naming similar things, for example METRIC::DataSynch::SccCache::SccChunksCount and METRIC::memory::PerClass::DataSynch::SingleSccCache::SUM have a slightly different names but in reality they represent the same thing and, moreover, their names share many similar stems. This observation can be used to build a smart heuristic for discovering similar statistics—similar statistics have many common stems in their names.

Same Sender

Zstat files contain information about the unit from which the statistics have been gathered (sender of the statistics). It can be a base for the following heuristic: statistics from the same unit are more similar than those from different ones. This approach comes from the observation that a unit has a precisely defined, narrow range of functionality so there is a higher chance that two statistics measure correlated events. On the other hand, relationships between statistics from different units seem to be much more interesting (from the theoretical point of view, as they can reveal some unexpected dependencies in the HYDRAstor) but they would be poorly assessed by this heuristic.

Same Type

Zstat files contain information about the type (float, percentage, counter, etc.) of the statistics. Generally, correlations can appear rather between the statistics of the same type, although some exceptions are known (especially when it comes to the timers measuring the number of events per second, for example METRIC::flowControl::node::SlotsComputer::Bandwidth::duplicateWriteCountPerSec).

Dynamic Heuristics

Correlation

Statistics being already correlated in the window should be treated as very similar. In the case of identity, the vertexes could even be merged but there would be a problem of different weights of the edges linking merged vertexes with the other ones. Due to this, an edge with a weight meaning 'full similarity' should be preferred. On the other hand, the more statistics are involved in the correlation, the lesser is similarity between them (for example, if there are correlations $f_0 = f_1 + f_2$ and $g_0 = g_1 + g_2 + g_3$, then $f_0$, $f_1$, $f_2$ are more similar to each other than $g_0$, $g_1$, $g_2$, $g_3$).

Same Number of Values Changes

Not all the statistics change their values each time they are sampled. Assuming that one of the statistics is a sum of a few others (f=g+h+k), f will change its value at most the same number of times that g, h, k together do. Naturally, f can never change its value (if there is g=-h and k=const) but it is believed that such situation rarely occurs.

The described heuristic can be extended by assuming that f can change the value of some of its samples only at the same time as the samples of g, h or k changes. Unfortunately, as the statistics are being gathered asynchronously, there could be some time shifts, making the whole concept unusable in practice. However, this statement should be checked in an experiment.

Clustering Algorithms

Survey [Sch07] contains a comprehensive discussion of available general-purpose clustering algorithms. The selected algorithm should have the following properties:

1. It should be possible to control the maximal size of a cluster.
2. Single vertex can appear in many clusters (clusters are overlaying).
3. The algorithm should be fast and not consume much memory.

It seems that the expectation (3) is crucial because if the clustering algorithm is too slow, it will make the process of limiting windows size useless. Due to this, the selection of an algorithm should be based on some performance experiments so the process of building the graph and choosing clusters is sufficiently fast. The simplest possible algorithm applicable to the described requirements is to create as many reduced windows as the number of statistics that remained at this point—exactly one reduced window per statistic. Such window created for the statistic f will contain the defined number of the nearest neighbors of the vertex f.

4.7.4. Linear Combinations

Linear combinations are the most general and thus most interesting kind of relationship searched for among statistics. Having a window, linearly dependent statistics are computed using methods of linear algebra. In the language of this theory, a window can be represented as a matrix expressed in the following Math 19 where m is the window's length (the number of samples) and n is the window's width (the number of statistics)—note that the window is transposed here. It is expected that m=n, otherwise there will be at least |m−n| dependent vectors and, moreover, a problem with interpretation of results will occur. The aforementioned requirement is the most important reason for not running mining of linear combinations on the whole window, as fulfilling this expectation may be impossible due to the large quantity of samples needed.

$$W \in Q^{m \times n} \qquad [\text{Math.19}]$$

The classical method of determining which vectors from W are linearly dependent is Gaussian Elimination. The described problem can be expressed in the form of the following Math 20 so any algorithm for solving linear equations can be applied to it. Nontrivial x means that some vectors (statistics) are linearly dependent, although getting the coefficients from x may be confusing and the reduced column echelon form is needed.

$$A \cdot \vec{x} = \vec{0} \qquad [\text{Math.20}]$$

Manually-coded Gaussian Elimination can be inefficient (from the point of view of cache usage etc.) and biased by numerical errors, so usage of linear algebra libraries is preferred here. In fact, such software provides computations using for example LU decomposition instead of pure Gaussian Elimination.

The complexity of finding linear combinations among statistics in a given window, regardless of choosing Gaussian Elimination or any other popular decomposition method, is ($O(n^3)$).

4.7.5. Regression

Linear combination is the most powerful kind of relationship that StatsMiner looks for. However, StatsCompressor is flexible enough to make use of weak correlations. This feature was introduced to mitigate the problem of asynchronous gathering of statistics, and it allows StatsCompressor to use rules that do not fully apply even at the mining phase. Such rules can be found using multidimensional regression analysis, which is briefly presented in [SE02]. In fact, much research has been done in this field so choosing the optimal method for mining regression rules would require further investigation. At this moment it is already known that any algorithm of this kind should be run on reduced windows due to its high complexity (($O(n^3)$) or worse).

4.7.6. Summary

None of the ideas presented in this section has been implemented due to the lack of time—elaborating existing algorithms seemed to be more important than introducing some new, poorly tested ones, especially that much work with clustering should be done first. On the other hand, the ability of discovering linear combinations (both strict and regression-based weak ones) among statistics may much improve the compression ratios achieved by StatsCompressor. It may be also important for anomaly detection.

4.8. Intra Algorithms

Intra algorithms search for the repeatable property of a statistic. As there is no need to compare samples between different statistics, this kind of algorithms can be run on all the samples of the statistic—dividing samples into windows may be superfluous. This characteristic of the intra algorithms make them perfect candidates to become the source of knowledge for heuristics reducing the search space for inter algorithms.

4.8.1. Discovering Constants

The constant function is the simplest example of intra correlation (and of any other correlation as well). Surprisingly, many HYDRAstor statistics stay constant for long periods of time—on average Zstat file from LRT (having about 83 samples) contains about 48940 statistics and 11 860 do not change their values at all (about 25%).

Discovering constants is a simple procedure—it is enough to check whether all the samples of the given statistic have the same numerical value. The search is done for statistics in each window separately—it is an exception from an assumption that looking for intra algorithms is reasonable only for the samples not divided into windows. In fact, constants are discovered by StatsMiner but such rules are not loaded from rules file by StatsCompressor—StatsCompressor discovers constants on its own (see Par. 5.8.1).

Discovering correlations between constant statistics (for example sums) is a much simpler task than in the case of statistics changing value but such inter correlations are rather useless from the compression point of view. Moreover, there would be a huge quantity of rules describing correlations between constant statistics. Owing to it, StatsMiner discovers constant statistics directly after generation of a window and such statistics are not used in further mining on this window.

In the example window (FIG. 19) one constant would be found: stat_eta.

The algorithm created (in total) 154023 rules for Customer Logs, working for 8 seconds (on average 33152 rules per analyzed window) Mining in LRT resulted in discovering of (in total) 117310 rules in 38 seconds, on average generated 36 633 rules per analyzed window. The discussion of the results can be found in Par. 4.9. The significance of the rules which were found is discussed in Par. 4.9.

4.8.2. Discovering Common Subsequences

In some statistics, the same subsequences of samples can appear regularly and they are good candidates for compression. On the other hand, this kind of analysis is already done by every general-purpose compressor, such as gzip, bzip2 or xz, so from the point of view of compression, there is no sense in digging up this kind of relationships in StatsMiner. On the other hand, if rules were to be used for other means than compression, it may be worth searching for common subsequences. It can be done by using a dictionary, as the mentioned compressors do (LZ77, LZMA algorithms).

4.8.3. Summary

Intra algorithms are not much discussed in the thesis, unlike the intra ones. However, discovering constants is crucial for fast and efficient work of algorithms searching for inter correlations.

4.9. Summary

FIG. 21 gathers mining and performance results of StatsMiner.

Please note that, while analyzing the CL set, about 249 windows could be generated but then the discovered rules would use all the available memory. This was the reason to use 30 databases only (instead of 50 planned)—while analyzing the 33-th database, the machine's memory (48 GB) got swapped and StatsMiner was killed.

The number of rules created for CL set was 2 times bigger than for the LRT_A set, although the number of analyzed windows was 5 times smaller. The reasons for this behavior seem to be complex. First of all, the LRT_A set was built upon statistics created during a test, which should simulate a normal HYDRAstor run. However, the CL set comprises real data from customers and their systems may behave differently. Moreover, each customer has his own pattern HYDRAstor usage, so even if there are two similar installations, there could be a large group of correlations that are unique. Nevertheless, the CL set contains statistics gathered by different versions of HYDRAstor, with various patches installed. From this point of view, results for the LRT_A set show how StatsMiner behaves when analyzing statistics from the specific version of HYDRAstor, whereas experiments on the CL set correspond to discovering correlations on different versions of the system.

It is interesting that the number of identity rules created per window in the CL set is twice as big as in the case of LRT_A. What is more, if the number of analyzed windows was the same in the both sets, then discovering identities in the CL set would take about 100 seconds, so two times more than on the LRT_A set. It is hard to say why so many identities were found in the CL set. Maybe the real way of using HYDRAstor is only a small subset of behaviors simulated by the Long Running Test? Fortunately, a large quantity of identities is definitely positive, because compression of identities is the most effective (see Par. 5.9.3).

The quantity of sum rules is much bigger than of other correlations put together. It is however an illusion—a consequence of using the combinational form of saving rules. The more identities are found in the window, the more sum rules are created. This implication can be clearly seen in the CL set.

To make the analysis of the discovered rules complete, a FIG. 22 should be described. The plot shows the minimal significance of different types of rules—the X axis presents a minimal significance (see Par. 4.3 for definition) and the Y axis—the percentage of rules having a given minimal significance. The plot should be understood in the following way: if there is a point having minimal significance of 0.3 and 40% rule, it means that 40% of the discovered rules have a relationship of the following Math 21. Such information is very useful, if the rules with the highest significances only may be transferred to customer's site (see 1).

$$\text{significances} \in [0.3, 1] \qquad [\text{Math.21}]$$

Generally, FIG. 22 proves that the approach researched in the thesis is reasonable, as the significance decreases slowly, so there are indeed many correlations between statistics of HYDRAstor system and they are not occasional. The significance of constant rules drops the most slowly and it is not surprising—many statistics change their values occasionally only (for example during rare deletion). The poorer result for rules from the LRT_A set (in the case of constants and other types too) are connected with the fact that LRT was an intensive test, checking different scenarios of the HYDRAstor usage. The most optimistic result found in the plot is that the significance of identity and sum rules from the CL set is very similar and, moreover, they have high values. It is very fortunate, because rules discovered in the files received from customers will be (probably) of high quality. Please note that the CL set contained files generated by a different version of HYDRAstor and it did not help to obtain such a good result. Unfortunately, the significance of identity and sum rules discovered in the LRT_A set does not have the same properties as identities discovered in CL set have and thus they seem to be not so useful from the compression point of view.

Finally, when it comes to the performance of StatsMiner, verification is always faster than mining—it is a welcome development as the introduction of this phase was based on such an assumption. Mining time to verification time ratio is higher for the LRT_A set than for the CL set because verification starts with full database of rules and mining does not. On the other hand, both mining and verification time per window is smaller for the CL set albeit the number of rules finally saved is much bigger than for the LRT_A set. It can be explained by the fact that there are many more unique statistics (in the sense of their names) among the databases of the CL set (because of different versions of HYDRAstor etc.) than among files from the LRT_A set. This conclusion may be proved by the average number of applicable correlations per file during the verification phase—applicable means that all the statistics expected by the correlation exist in the file. The value for the LRT_A set is 8 599 140 and for CL only 6 774 390 (21% less).

The performance of StatsMiner (as a whole) is currently below expectations (both when it comes to CPU and memory usage) but the software was not profiled or even sufficiently tuned. The main bottleneck is the way rules are saved—usage of combinational approach means storing billions of rules in memory. Unfortunately, internal data structures proved not to be efficient enough. StatsMiner was prepared as semi-prototype software so its problems should not be surprising.

To sum up, StatsMiner lived up to expectations. Despite the fact that only a small subset of the designed mining algorithms has been implemented, the number and significance of the rules prove that the concept of the tool is right. What is interesting, memory is a bottleneck for StatsMiner.

At present, in order to avoid hitting these limitations, analysis should be done on statistics gathered by one version of HYDRAstor. Moreover, mining for correlations between statistics of each customer separately may provide the best results but it will naturally require many resources and thus is not realistic. Memory consumption can be also lowered by introducing a better method of storing the rules—it seems that this problem should be solved before widening the functionality of the tool by making it able to discover other new types of correlations or introducing the concept of random windows.

Chapter 5 Compressor

This chapter contains a description and evaluation of StatsCompressor, which is a tool for compressing files containing statistics generated by the HYDRAstor system, using the correlation-based approach and domain-knowledge.

The chapter consists of the following sections.

5.1. General overview' presents the general concepts and assumptions of StatsCompressor.

5.2. 'Testbed' describes test data and test methods used in this chapter. It is important, because many results of experiments will be presented.

5.3. 'Base results of StatsCompressor' presents best results that are possible to achieve using StatsCompressor on the test data. They will be base results, with which results of other experiments will be compared.

5.4. 'External compressors' discusses briefly the tools which may be used for further compression of the files generated by StatsCompressor, as the tool itself only does correlation-based compression.

5.5.-5.9. These sections contains descriptions and assessments of the compression methods used by StatsCompressor.

5.10 'Other models of usage of correlation-based compression' briefly presents the ways of cooperation of StatsMiner and StatsCompressor. Its aim is to enable usage of one set of rules for compressing statistics gathered by different versions of HYDRAstor. It both discusses the policies that could be used in the model touched-upon in Chapter 3 and introduces certain new approaches.

5.1. General Overview

The designed and implemented compressor, named StatsCompressor, is a tool for lossless compressing Zstat files (see Par. 2.3.2), created as a part of the described research. It gets a regular Zstat file as an input and produces a Zplus file as an output. Zplus files are very similar to the Zstat ones what makes them both comparable. Compression done by the tool is high-level—no byte-level methods are being used—and is based on some domain-knowledge (mainly on correlations between statistics) and a few simple text transformations of the compressed file. Created Zplus files should be further compressed with some general-purpose external compressors.

The tool was written in C++ and can be run under Linux operating system. Usage of C++ resulted from the high performance expectations as the compressor will be run on a normally-operating, customer's machines (operating under Linux operating system). In particular, it may be run during writing of backup data into the system so its CPU and memory consumption should be minimized. On the other hand, it is hard to prepare highly-effective software during research so the code was treated as a prototype from the beginning and it should be rewritten (practically from scratch) during the productization phase. This approach—preparing a prototype in C++—made it possible to measure the maximum achievable compression ratios in the context of maximal use of resources. All the presented results of experiments should be assessed from the point of view of this assumption.

5.2. Testbed 5.2.1. Testing Data

All the performance tests of StatsCompressor were carried out on the following sets of data (similar as in the case of StatsMiner).

1. LRT_A—50 randomly chosen Zstat files from Long Running Test on H4 version.

2. LRT_B—50 randomly chosen Zstat files from Long Running Test on H4 version.

$$\text{There is } LRT\_A \cap LRT\_B = \emptyset \qquad [\text{Math.22}]$$

LRT is an abbreviation from Long Running Test, which took about 2 weeks and simulated both normal and corner-case usage of HYDRAstor. The system was in version H4 and consisted of 1 HN and 4 SNs. This source of data has been selected, as there are no statistics from customers using H4 version yet and, moreover, these Zstat files can be treated as snapshots of the model version of HYDRAstor. The results for randomly chosen statistics files obtained from customers, using previous versions of HYDRAstor, are demonstrated in Chapter 6.

5.2.2. Performance Measuring

Tests of StatsCompressor have been conveyed on the same machine and in the same way as tests of StatsMiner (see Par. 4.2.2).

5.3. Base Results of StatsCompressor

FIG. 23 contains best-achievable, average StatsCompressor's Compression Ratios (defined below) and performance results of StatsCompressor. The results were gathered by compressing each Zstat file from the LRT_A set using rules generated before for the whole LRT_A set. StatsCompressor worked with all the algorithms enabled so results presented here are the best achievable.

In the thesis, StatsCompressor's Compression Ratios (ScCR) and supporting space saving are computed in the following way.

$$ScCR(\text{Compressor}, Zstat) = \frac{\text{size of Compressor}(Zplus)}{\text{size of Compressor}(Zstat)} \cdot 100\% \qquad [\text{Math. 23}]$$

Space saving(Compressor, Zstat)=1-ScCR(Compressor, Zstat)

Here, size of Compressor(Zplus)=size of the Zstat file compressed by StatsCompressor and then compressed by Compressor size of Compressor(Zstat)=size of the Zstat file compressed by Compressor only (normal HYDRAstor practice)

The StatsCompressor's ratio provides information about the compression quality of StatsCompressor. It is not just an artificial measure, because it can be used to determine how much bigger the Zstat file can be when using the proposed tool to finally obtain the compressed file of the same size as if StatsCompressor was not used. In practice it means, how much longer the gathering period can be for the statistics downloaded from customers if StatsCompressor is productized.

Compressor 'noComp' stands for no external compressor usage—this shows how well StatsCompressor performs on its own. The section 'Only bodies' shows results of compression of the Zstat file that contains lines with samples only. As it is described in Par. 2.3.2, half of each Zstat file lines contain names and metadata of existing statistics. The designed solution focuses on the compression of samples only, as the problem of efficient representation of metadata has been already solved (see Par. 2.3.2). The section 'Only bodies' provides information on factual performance of StatsCompressor (although it should be kept in mind, that even though StatsCompressor does not explicitly compress metadata, it can dump it in a slightly different order and some changes of the statistics' identifiers can be made (see Par. 5.7.1).

The best StatsCompressor's Compression Ratios are achieved for the bzip2 compressor run with −9 parameter— it is at average 47.78% for full Zstat files (space saving amounts to 52.22%) and 42.72% for only bodies (space saving amounts to 57.28%). The best results are 43.8% (space saving amounts to 56.2%) for full files and 33.4% (space saving is 66.6%) for bodies only. These results surpassed all expectations because while initializing the project, space savings of 20%-30% were expected.

However, the best StatsCompressors's Compression Ratios are achieved when using bzip2 as an external compressor, the smallest files are output by the combination of StatsMiner and the xz compressor.

On the other hand, CPU and memory usage is currently much too large to really run StatsCompressor at customers' sites. The ways of improving the performance will be discussed later in the chapter.

Compression ratios, while no external compressor was used (rows 'noComp'), are very interesting. In the case of full files, the average compression ratio is 64.44% (space saving amounts to 35.56%)—this result seems to be quite good, especially that StatsCompressor does not provide any compression on the bit level, and both Zstat and Zplus file formats use verbose text representation. This effect is even stronger for compression of bodies only—the average compression ratio is 30.61% (space saving amounts to 69.39%).

For the results of full files, the following phenomena for average compression ratios occurred:

$$bzip2 < gzip < noComp < xz$$

It can be interpreted as a hint that StatsCompressor compresses parts of the Zstat file in a way inaccessible for gzip or bzip2, as space saving is higher after compressing the Zplus file with bzip2 or gzip. On the other hand, in the case of xz, it is suspected that xz can independently convey some transformations which StatsCompressor does. However, as FIG. 24 indicates, using xz on Zplus files gives the smallest compressed Zplus files possible, although the difference between xz and bzip2 is statistically insignificant. When analyzing the same relationship in the case of only bodies compression, inequality has following form:

$$noComp < bzip2 < gzip << xz$$

It means that, in fact, StatsCompressor repeats some steps that all other external do but compression of metadata (which exist in full files only), strongly degenerates the abilities of bzip2 and gzip.

The standard deviation of StatsCompressor's Compression Ratios is quite small both in the case of compressing full files and bodies only. It is a very good news because it means that the behavior of the developed software is predictable. It is especially important in the case of full files, as if the solution was used at the customer's site, it would be possible to precisely select the size of the input Zstat file to have a Zplus file of the desired size.

The described results will be referenced in the following sections (as model ones, base ones or 'full LRT_A/LRT_A'), to compare them with the results gathered after disabling some of the algorithms built into StatsCompressor—this will show how important (in a sense of StatsCompressor's Compression Ratio) the specific algorithm is.

5.4. External Compressors

It was decided that StatsCompressor will be supported by an external compressor to focus the development of the tool on the usage of correlations only. Data compression, a mixture of algorithms and information theory, has been studied for years and nowadays offers a vast number of data compression methods. The most practical ones have been implemented in the popular tools. In Linux they are gzip and bzip2, however there is a variety of other tools, as [Vei13] and [Jr13] indicate. It was decided to test the xz compressor which is an improved version of the 7za tool and is gaining increasing popularity in the Linux community. It was checked how xz will perform in the HYDRAstor environment—up to now gzip and bzip2 have been successfully used.

5.4.1. Comparison

FIG. 24 presents the absolute compression ratios (shown in the following Math 24. The values in the row StatsCompressor only prove that the usage of external compressor is obligatory. FIG. 25 shows the compression ratios and performance of the considered external compressors while compressing raw Zstat file from the LRT_A set—these are normal results, if StatsCompressor is not used.

$$\frac{\text{size of (fully compressed } Zplus)}{\text{uncompressed } Zstat} \qquad [\text{Math. 24}]$$

FIG. 25 presents the performance of the external compressors. First of all, the xz tool offers the best compression ratio and its superiority is overwhelming. However, it is achieved with an extremely high consumption of memory and it can be the main obstacle against using it in HYDRAstor, as memory is a valuable resource. On the other hand, gzip is the poorest tool (although its usage is cheap). In this experiment, there is an insignificant difference between compression ratios achieved by gzip and bzip2, although the differences are much bigger when Zplus files are being compressed (compare with FIG. 24). From this point of view, the best choice for the external compressor seems to be bzip2, as xz is too expensive and gzip offers unsatisfactory compression ratios. Note the interesting fact that on average, bzip2-9 is worse than bzip2-6, although flag −9 instructs bzip2 to use the best compression method it has.

5.5. Schema of StatsCompressor

FIG. 26 presents a diagram of StatsCompressor. Each part of the software will be comprehensively described in the following sections and this picture shows the sequence of actions carried out on a single Zstat file. The usage of the components can be controlled by the program arguments or limiting the rules file (for example usage of identity correlations only).

The described picture contains a notion of cost. In this chapter, cost refers to the number of bytes needed to save the specific information, using a specific method, in an Zplus file not compressed yet by an external compressor. For example, if a sample has a value of '12345' and no method of compressing it had been chosen, the cost of this sample is 5 (as the sample will be dumped in the human-readable form as '12345'). This method of counting the cost has one general drawback—it does not take into account the fact that Zplus file will be compressed with an external, general-purpose compressor. Unfortunately, the final (after external compression) cost of dumping any information cannot be determined in StatsCompressor because the compression ratio achieved by an external compressor for a specific data is always determined by the context data. To sum up, StatsCompressor is built on the assumption that the external compressor will rarely compress bigger representation of data (for example '1_2_3_4_5') into smaller number of bits than it does for a smaller representation ('12345') (it is assumed that the algorithms of the external compressors are monotonic).

The process of compression consists of three phases.
1. Trying various methods of compressing statistics (see Par. 5.8 and 5.9).
2. Choosing best methods for compressing the statistics (see Par. 5.6).
3. Optimizing the encoding (see Par. 5.7).

5.6. Correlation-Based Compression

The most important part of StatsCompressor is its algorithm for choosing rules to be used for compression. It gets two types of rules—these loaded from the file containing the discovered rules (see Par. 5.9) and those discovered by StatsCompressor on its own (see Par. 5.8). The implemented algorithm is one of the simplest ones and consists of two steps: scoring the rules and then choosing which of the scored rules will be used in compression.

5.6.1. Scoring the Rules

The very first step of scoring the rules is choosing the best so called transformat to be applied to each statistic. Transformats are in fact intra correlations, discovered by StatsCompressor on its own (see Par. 5.8.2). To be coherent, writing samples of statistic explicitly—without the use of any method of compressing them—will be called a 0-transformat. Only one transformat—this having the minimal cost—may be applied to a statistic in the Zplus file.

The next step is to compute the cost of each inter correlation and give them scores. The score is a numeric value used for introducing a linear order among all the rules possessed. Usage of any inter correlation for compression of a given statistic is naturally reasonable only if the cost of this correlation is smaller than the cost of the best transformat. If this condition is met, the rule should be scored. There are two possible approaches that will be presented in a moment. To make the description clearer, let us assume that there are two rules—r1 and r2—each compressing different statistic and $$10=cost(r_1), cost(t_1)=15, cost(r_1)<cost(t_1)$$

$$12=cost(r_2), cost(t_2)=30, cost(r_2)<cost(t_2)$$

Where, $t_1$ and $t_2$ are transformats applied to the same statistics as corresponding $r_1$ and $r_2$ are.

The Absolute Cost Method of Scoring the Rule
The score of a rule is $$score(r_i)=cost(r_i)$$

In the case of the example defined above, it will be score($r_1$)=10 and score($r_2$)=12. These scores introduce the following order:

$$r_1 > r_2 \qquad [\text{Math.25}]$$

The Relative Cost Method of Scoring the Rule
The score of a rule is as shown in Math 26.

$$score(r_i) = \frac{cost(r_i)}{cost(t_i)} \qquad [\text{Math. 26}]$$

Where, ti is a transformat of the same statistic that ri tries to compress. In the case of the example defined above, it will be score($r_1$)=0.625 and score($r_2$)=0.4. These scores introduce the following order:

$$r_1 > r_2 \qquad [\text{Math.27}]$$

As the experiments have proved, the relative cost method performs slightly better, offering average StatsCompressor's Compression Ratios higher by 0.3%-0.6% points depending on the external compressor used.

Scoring the rules took on average 593 seconds (in the model LRT_A/LRT_A experiment). The length of the process was caused by the large number of rules that should be scored—27095900 rules were checked on average per Zstat (see FIG. 33). Note that a correlation f=g+h appears in three forms (as three different directed rules): f=g+h, g=h−f and h=g−f. Among all checked directed rules, 4 523 420 (avg. per Zstat) had a lower cost than the cost of the corresponding transformat (so that many rules got fully scored). It means that only about 17% of rules that could be applied (because all the expected statistics appear in the Zstat file) can be used for compression. More results can be found in FIG. 33, which is discussed in Par. 5.9.2. The ways of minimizing the resource usage of StatsCompressor will be further investigated in Par. 5.9.4 and Par. 5.10.

5.6.2. Choosing Scored Rules to be Used

At first glance, this step seems to be very simple—if there is a set of scored rules, for each statistic a rule with the lowest score should be taken. If no rule applies to the specific statistic, a transformat—at least 0-transformat—should be used. However, there is a trap in this approach: what if f=g, g=h and h=f are selected? In this case the values of the samples of all statistics will be gone (samples of f are not saved because f=g etc.)—only the information about the correlation remains.

StatsCompressor uses more subtle version of the approach presented above. It examines all the rules, starting from this of the smallest score (it is possible because linear order on scores exists). The rule, to be used, have to satisfy the following criteria.

1. Left hand side of the directed rule (the statistic, that can be compressed using this specific rule) has not been already compressed by the another rule (having a smaller score).
2. Usage of the rule will not introduce a cycle into the directed graph of applied rules. Vertexes of the graph are statistics and edges represents dependencies between statistics, for example if a rule f=g was used, there will be an edge expressed in Math 28 in the graph. Consequently, usage of sum rule p=q+r, introduces edges expressed in Math 29 and Math 30. The graph is kept in memory and existence of the cycle is being detected using the Depth First Search algorithm.

$$f \leftarrow g \qquad [\text{Math.28}]$$

$$p \leftarrow q \qquad [\text{Math.29}]$$

$$p \leftarrow r \qquad [\text{Math.30}]$$

The described algorithm is greedy. As the experiments have proved, it offers an acceptable level of compression, although it is quite easy to construct an example in which it does not perform well. Some more work in the future should be spent on discovering a better algorithm for this purpose (or adding some heuristics to the existing one). It is suspected that the problem may be NP-complete, although no proof has been constructed as expressing these problems in the graph-theoretic language is hard enough. One trial is: there is a weighted multigraph G. Remove some edges from G (according to the given list of possibilities), so Gt will be acyclic, has no multiple edges, is connected and the sum of weights of edges is minimal. Note that some edges cannot be removed separately (because a sum correlation should be used as a whole and it implies existence of at least 2 edges). Graph G will have one artificial vertex so edges from it to all the other vertexes will have weights equal to the cost of transformats of target vertexes (representing statistics naturally).

Execution of the implemented greedy algorithm took on average 18 seconds per Zstat file so this step is much faster than evaluation of rules.

5.7. Postprocessing of the Selected Correlations 5.7.1. Renumbering

Renumbering is a process of exchanging identifiers used by the statistics inside Zplus file to improve the compression ratio. According to FIG. 26, it is the last phase of compression, although it will be described before touching the problem of flattening abstraction classes, as flattening was introduced to improve the renumbering.

Each statistic in the Zstat file (and Zplus too) has its unique identifier—a natural number. In a Zstat file each identifier is used exactly twice (to map the statistic's name to its samples). In Zplus files identifiers are used while saving correlations so some of them will appear more frequently. The aim of the renumbering is to give the frequently appearing statistics the shorter identifiers (thus having lower cost). In the case of LRT_A, the most frequent statistic identifier was being dumped (on average) 25678 times. The time of renumbering was not measured but it has a negligible impact on the performance because the complexity of this step is O(n log(n)), where n is the number of statistics.

FIG. 27 shows results of compressing the LRT_A set using rules mined on LRT_A with renumbering disabled. According to it, renumbering is a very important step because the lack of it causes a significant drop in StatsCompressor's Compression Ratio (at least 11 percentage points). As always, xz is the least afflicted with this issue. In the case of only bodies compression the problem is obscured by the fact that there are no rows with statistics names. It is surprising that the average CPU utilization is slightly bigger when renumbering is disabled—it is hard to explain this.

In fact, this step is one of the two that cannot be reversed during decompression because the Zplus file does not contain a dictionary of mapping of the old identifiers to the new ones (there was no need for it). On the other hand, in order to make Zstat comparable with Zplus, new identifiers are chosen from among the old identifiers already used in the Zstat file. It is interesting that the smallest identifier in all Zstat files was 568 at most. In the production version of StatsCompressor new identifiers should start from 1.

5.7.2. Flattening of Abstraction Classes

Description of the aim of flattening of the abstraction classes requires introducing a new notation. Let us f, g, . . . represent different statistics. id(f)=x will mean, that statistics f will get an identifier x in the Zplus file.

The way the algorithm for selecting scored rules (see Par. 5.6.2) works implies that for example compression of abstraction class A=$f_0$, $f_1$, $f_2$, $f_3$, the following rules can be selected: $f_1$=$f_0$, $f_2$=$f_1$, $f_3$=$f_2$. However, it is not optimal, because at least three different identifiers should be used—x, y, z and x=id($f_0$), y=id($f_1$), z=id($f_2$)=id(f3). The optimal approach is to code the whole abstraction class as follows: $f_1$=f0, f2=$f_0$, $f_3$=$f_0$ because only one identifier, t=id($f_0$), will be used then. There will be t=id($f_0$)=id($f_1$)=id($f_2$)=id($f_3$). Please note, that in that case it is impossible to get the original identifier of the statistics $f_1$, $f_2$ and $f_3$. However, it is not necessary.

The process of optimization of the representation of abstraction classes is called flattening because its aim is to reduce the height of the tree of rules used for encoding the abstraction class. Optimal tree height is 1, so each abstraction class has exactly one representative. Find-Union Algorithm is used to convey it. At the beginning each statistic forms a singleton set. If there is a strict identity between statistics, appropriate sets (representing abstraction classes of this statistics) are joined. Finally, each of the sets has only one representative to be used (f0 in the example from the previous paragraph). In practice, Boost Disjoint Sets library was used. The complexity was O (the following Math 31), where the following Math 32 is the inverse Ackermann's function, n is the number of statistics, m=O(1) and depends on the set of rules to be analyzed. In the experiment with full LRT_A/LRT_A this step took on average 0.7 second.

$$m\alpha(n, m \cdot n) \quad [\text{Math.31}]$$

$$\alpha \quad [\text{Math.32}]$$

FIG. 28 shows the results of compressing the LRT_A set using rules discovered on LRT_A with flattening of abstraction classes disabled. Space saving is very little—it is on average 2-3 percentage points. It is interesting that enabling flattening is very important for the xz compressor. Flattening of abstraction classes uses about 14 MB of RAM, as data structures for Find-Union Algorithm have to be built.

5.8. Internal-Knowledge Based Algorithms

StatsCompressor searches for some kind of correlations on its own—it performs mining that is fast enough that has no negative impact on the performance (which is crucial for this software).

5.8.1. Compressing Constants

About 24% of statistics in all Zstat files are constants. This kind of (intra) correlations is not put into rules files, so StatsCompressor should find them by itself. The process is similar to the one described in Par. 4.8.1.

When all the constant statistics are identified, they are grouped into abstraction classes (basing on their values)—there is for example class f=g=h. Each class has one representative, which is the statistic having fewest samples (for example f). For each member of the abstraction class, an identity rule (same as in the case of identities loaded form rules file) is created, describing the relationship between the statistic and the representative of the abstraction class (in the example, it is f=g and f=h). Please note that there are no rules between non-representative statistics (there is not rule g=h). This approach was used to minimize the number of rules created at this step (abstraction classes can be quite large, so usage of the real combination method of storing rules would result in generating of thousands of rules, although only a small percentage of them would be used).

Discovering of constants took on average 0.61 seconds only but it had a significant impact on the StatsCompressor's Compression Ratios—FIG. 29 presents the results of the experiment with StatsCompressor having only the compression of constants turned on (no other compression method was used, although postprocessing was active). Space savings varied from 9.61% to 12.69%, depending on the external compressor used, in the case of compressing full files and from 6.48% to 8.67% when only bodies where compressed. It seems that space saving was bigger for full files because of the use of the renumbering of the statistics as a postprocessor, so the name to identifier mapping from the first section of the Zplus file contained less entropy—the number of the different identifiers was smaller.

5.8.2. Transformats

As it was already mentioned, a method of compressing samples of statistics using an intra correlation is called a transformat. Such correlations are currently discovered by StatsCompressor on its own. Each statistic can be compressed using no more than one transformat—it is done when no other mean of compression is accessible—see Par. 5.6.1) for more details. StatsCompressor always computes all the transformats for each statistic to determine the best transformat. These computations proved to be extremely fast.

The following notation will be used while describing transformats:

s—sequence of samples of a statistic
$s_i$—the i-th sample from the sequence s
$T_i(s)$—result of applying the transformat t to the i-th sample of sequence s 0-Transformat 0-transformat was introduced for clarity only, to make the following statement always true: 'if samples of a statistic should be (explicitly) dumped in the Zplus file, a transformat is used.' 0-transformat does not transform samples in any way—their values are just saved 'as is', in the same manner as they existed in the Zstat file.

$$T_i(s)=s_i$$

Difference Transformat

Difference transformat is based on the assumption that the values of statistics change gradually, so saving the difference between the current sample and the previous one can be cheaper than explicitly saving values of both samples—the difference is often a small number, having lower cost. Moreover, same values may appear frequently as differences, to they will be efficiently compressed by the external compressors. To be able to compute differences it is assumed that the value of the sample before the first samples of statistic is 0. This approach is leveraged for all computations on finite differences in StatsCompressor, enabling, for example, the decompression of statistic f compressed using the rule df=g when samples of the statistic g are already known.

$$T_0(s)=s_0-0=s_0$$

$$T_i(s)=s_i-s_{i-1} i>0$$

Dominant Transformat

The dominant transformat was invented due to observation that some statistics seldom change their values, so it is enough to save the dominant value of these statistics and the vector of deviations. The latter thing can be done effectively thanks to the usage of the encoding of the sparse deviations vector (see appendix A). Computation of the dominant transformat requires reading the samples of the statistic two times—in the first pass a dominant (the most common value) is found and in the second deviations are determined. However, as the performance results proved, scanning the sequence two times does not have a visible impact on the performance of StatsCompressor.

c—dominant of the sequence—the most common value in the sequence of samples of s $$T_i(s)=s_i-1-c$$

Evaluation of Transformats

FIG. 30 contains StatsCompressor's Compression Ratios for compressing the LRT_A set using transformats as the only method of compression. The space savings are impressive: 18.06%-30.89 (depending on the external compressor used) in the case of full files and 21.91%-36.28% for bodies only. The dominant and difference transformats proposed in the thesis are very simple methods and it is surprising that none of the external compressors use the same mechanism in such an efficient manner. Naturally, the aforementioned tools are tuned to work rather with byte files than with text ones, but it seems they should be improved in some way, because the potential space saving is huge and nowadays files containing plain text are becoming more and more popular (eg. JSON format).

The difference transformat is more frequently used than the dominant one, which had been already predicted—see FIG. 31. However, the dominant transformat is surprisingly often the best one, although theoretically it might be used under very similar conditions as the difference one—the better they work the smaller the number of deviations is. Another interesting fact is that 0-transformat was hardly ever used—it means that there are just a few statistics having huge fluctuations.

Both difference and dominant transformats are built in the same manner—there is a function used for predicting values of the samples and deviations between real and predicted values have to be saved. Naturally, many other families of functions can be used for prediction—determining which family of functions (polynomial, exponential, etc.) should be used may be checked by StatsMiner, whereas StatsCompressor can compute coefficients of these functions using some numerical methods. In fact, the whole idea of fitting function to the real samples' values is not new—it is already used for sound compression, for example in Free Lossless Audio Codec (FLAC) [CF13].

5.9. Usage of External-Knowledge

The rules file is the source of external-knowledge—correlations found by StatsMiner. This section contains analysis of the usage of these rules—how it impacts performance of StatsCompressor and what problems have to be solved in the future.

5.9.1. Vectors of Deviations

One of the most important features of StatsCompressor is its ability to use correlations even if they do not numerically fit, so there are some deviations between real values of samples and the ones predicted by the use of correlation. It means that StatsCompressor can use weak correlations, although StatsMiner discovers only the strict ones (especially in the implemented version). The way such deviations are encoded is described in the appendix A. FIG. 32 presents the StatsCompressor's Compression Ratios when usage of deviations vectors is disabled, so only strict correlations are allowed. In fact, it also means that transformats are turned off (except for 0-transformat, naturally), because they require deviations vectors to work properly. As it can be seen, usage of deviations vectors is crucial for achieving good compression ratios by StatsCompressor, especially when external compressors are used. On the other hand, this results also proves that the idea of correlation-based compression (as described in this thesis) is reasonable, because space savings are non-zero even if the best external compressor (xz−9) is used—space savings are 14.9% for full files and 12.68% for bodies. In fact, the second result is more important because it applies to the part of Zstat file containing sequences of samples only, which are the most interesting for StatsCompressor.

The usage of vectors of deviations does not influence CPU consumption very much. On the contrary, usage of the memory seems to be affected but it is implementation dependent and can be reduced—in the current version of StatsCompressor deviations vectors computed while scoring the rules are held in the memory no matter if they are usable anymore.

5.9.2. Performance of Usage of External-Knowledge Rules

StatsMiner can easily produce millions of rules (see Par. 4.9), so it is interesting how well can StatsCompressor use this knowledge. FIG. 33 presents the statistics of the usage of rules loaded from rules files while compressing the LRT_A set with rules discovered on LRT_A set.

Please note that results for identities include rules generated internally in StatsCompressor for compression of constants. It is due to the fact that StatsCompressor does not create identity rules for constant statistics, even though it could. According to that, not including this kind of rules may result in creating a false image of StatsCompressor, as some statistics (being constant in the file being compressed) might be compressed very ineffectively because of the lack of the aforementioned identity rules. For example, if the following Math 33, 34 are established, instead of encoding f=g, a rule f=g+dg might be used. The number of rules created in StatsCompressor for encoding constants is relatively small there is no more such rules than the number of statistics—so they will not perturb the evaluation of external-knowledge rules very much, however their absence will make these results totally untrue.

$$f \equiv 2 \qquad \text{[Math.33]}$$

$$g \equiv 2 \qquad \text{[Math.34]}$$

Description of FIG. 33

Before commenting on the result, categories used in FIG. 33 should be described:

All statistics—The average number of statistics in the analyzed Zstat file.

Non-const statistics—The average number of statistics being not constant in the analyzed Zstat file.

Loaded rules—The average number of rules per Zstat file, that were loaded from the rules file and they might be used for compression. A rule may be used for compression, if the Zstat file contains all the statistics this rule uses.

Tried to apply—The number of rules that were scored (see Par. 5.6.1). There is tried to apply>loaded rules, because generated identity rules for constants compression are included but, first of all, new rules are created out of existing ones because of changing left-hand-sides of them (for example, if there is a rule f=g+h, the following rules are created: f=g+h, g=h−f and h=g−f). Such rules are called directed rules. Each directed rule can compress exactly one statistic (which is on its left-hand-side).

Having a good cost—The average number of directed rules per Zstat which can really compress a statistic, so the cost of encoding a statistic using the aforementioned rule is smaller than the cost of compressing the statistic using the best transformat (see Par. 5.6.1).

Not applied, cycling—The average number of directed rules per Zstat, whose usage will introduce cycles in the graph of statistics, so it would be impossible to recover the factual values of samples of the statistics (only the relationships between statistics would be known). See Par. 5.6.2.

Not applied, lhs described—The average number of directed rules per Zstat file that were not used because another rule has been previously selected to compress the statistic. See Par. 5.6.2.

Applied—The average number of directed rules per Zstat used for compression. The number in parenthesis in the identity rules column indicates the average number of applications of identity rules really loaded from rules files (not generated by StatsCompressor on its own for compression of constants).

Evaluation time—The average time (in seconds) of scoring the directed rules per Zstat file (see Par. 5.6.1).

Choosing the rules—The average time (in seconds) of choosing the directed rules to be used for compression per Zstat file (see Par. 5.6.2).

Please note that the following relationship holds between the directed rules.

$$\text{Tried to apply} \geq \text{Having a good cost} \qquad \text{[Math.35]}$$

$$\text{Having a good cost} = \text{Applied} + \text{Not Applied}$$

Analysis of Performance of Usage of External-Knowledge Based Rules

First of all, it is very encouraging that so many rules, that so many rules have been loaded from rules file and may be applied to the (average) Zstat file. However, the number of directed sum rules becomes extremely huge and it seems to be the main performance problem of StatsCompressor, as the time of evaluation of sums is 80 times longer than the time of the same operation for identity rules. Surprisingly, choosing the rules to be used for compression is much faster than evaluation of sum rules, although this step seems to be more complicated than evaluation. It is believed that the code of evaluation phase could be improved—by better CPU's caches usage, SIMD instructions leveraging etc.

The number of rules, that have good costs (so they are worth applying) is also impressive and proves that correlation-based compression has a big potential. Naturally, it is only 44% of identity rules and 16% of sums rules, so it seems that the rules file's size can be decreased without much lowering the compression ratio. This issue will be discussed in Par. 5.9.4. The main reason why (directed) rules cannot be applied is the fact that target statistics are already compressed by another rule. This situation has some important implications. First of all, improving the algorithm for choosing rules (see Par. 5.6.2) may increase the compression ratio. On the other hand, it can also mean that there are big abstraction classes among statistics, as there are often many ways of compressing the same statistic (it is correlated with many other statistics). A relatively small number of failures of application of the rule due to a cycle appearance may be interpreted as information about a small number of abstraction classes, but in reality rules are checked for this condition only if their left-hand-sides have not yet been compressed, so interpreting this value is difficult. However, no matter how big the value of this result is, it means that without this check there would be many statistics that cannot be properly decompressed.

At first glance, the number of applied rules (i.e. the ones really used for compression) is huge—on average 42 010 per Zstat file, containing on average 48 940 statistics (so 86% of statistics can be compressed using correlations). On the other hand, on average 41 008 rules compress constant statistics and are generated by StatsCompressor on its own. However, it is rather good news because it proves that dropping constants in StatsMiner (see Par. 4.8.1 and Par. 5.8.1) was a good decision—otherwise rules files would be huge and StatsCompressor would be much slower than it is now. Consequently, the number of applications of rules loaded from file (in total 6598) should be compared with the number of statistics that are not constant (14 528), so 45% of statistics are compressed using such correlations. Certainly this result may be improved after extending StatsMiner by searching for more kinds of correlations (see Par. 4.7), or by implementing one of the proposed, theoretically better, algorithms for window generation (see Par. 4.3.1). The number of applied rules should increase then but it is hard to predict how much, as currently sums are applied to 7% of statistics. This kind of sums (consisting of 3 statistics only) is not very sophisticated, and it is believed that sums of many more statistics exist. On the other hand, the more complicated the formula of correlation is, the higher is the cost of application of such a rule, because the rule should also be stored in the Zplus file.

Summary

External-knowledge rules (these loaded from file) are important for StatsCompressor—they are often used for compression. Discovering more types of correlations in StatsMiner (or just improving the existing algorithms) will certainly improve the compression ratio achieved by StatsCompressor, as there is a group of statistics not compressed now. However, StatsCompressor currently has problems with performance, as there are too many rules that are being assessed (especially sum rules) and it seems that they can be used more efficiently. Possibilities of using a smaller number of sum rules will be discussed in Par. 5.9.4 and some new system approaches will be presented in Par. 5.10. Problematic (from the performance point of view) internal algorithms of StatsCompressor were described in Par. 5.6.

5.9.3. Importance of Identity and Sum Rules

In the previous section there was a suggestion of lowering the number of used sum rules to improve the performance of StatsCompressor. FIG. 34 presents the StatsCompressor's Compression Ratios for compression of the LRT_A set using only identity rules discovered on the LRT_A set. The values in brackets show the difference between the achieved values and those found, when all the rules are being used (in full LRT_A/LRT_A experiment, see FIG. 23), so they inform about the importance of sum rules for the compression.

StatsCompressor's Compression Ratios presented in FIG. 34 inform that sum rules have very small impact on the compression ratios achieved by the tool (about 1.8% for full files and 2.37% for bodies only), but not using them greatly improves the performance (CPU and memory usage becomes acceptable right now, albeit it is just a prototype version of the compressor!). Moreover, as the standard deviation of performance results drops significantly, it is easier to predict StatsCompressor's requirements. It is interesting that in the case of compression of bodies only, usage of sums is the most important for the xz compressor among other ones. However, it is not surprising, since this kind of correlation cannot be discovered by any external compressor by itself—they would rather not assume that some data can sum. If sums are not to be used, StatsCompressor uses some other methods for compressing the affected statistics and the xz seems to be able to do some of this work on its own.

As the sums are not used, StatsCompressor applies identity rules instead. On the average, it applied 410 more such rules than usual. It may be treated as evidence that sum rules are however important, because not all of them (1002 on average) may be substituted. Furthermore, sum rules applies to 2% of statistics only, but they improve the StatsCompressor's Compression Ratio by about 2% as well—it is an impressive result which also implies that use of other correlations should be tried by the designed software. Naturally, performance degradation connected with usage of sum rules is currently unacceptable and should be improved.

5.9.4. Random Reduction of the Number of Sum Rules

The simplest idea to reduce the time and memory consumption of StatsMiner while still using sum rules is to randomly delete the specific amount of such rules. FIG. 35 presents the differences between average StatsCompressor's Compression Ratios and performance results between usage of all the rules with usage of all identities and randomly selected number of sum rules.

The results collected in FIG. 35 imply, that it is possible to significantly improve the performance of StatsCompressor with only a subtle loss of StatsCompressor's Compression Ratio by using only a small percent of the originally found sum rules. It seem that leaving 20% of sum rules is a good trade-off—at the price of losing about 45% of space saving stemming from the usage of sum rules, it is possible to cut down the CPU and memory consumption so it is just 6% higher than while not using sum rules at all. Such a strange behavior of StatsCompressor, so the number of deleted rules is not in linear relationship with CPU and memory consumption, seems to be an effect of using the combinational form of storing rules, as the rules file contains a product of abstraction classes of all statistics involved in each sum rule. On the other hand, such a good result may be proof that implemented algorithm for selecting rules to be used for compression—although simple—is quite effective.

5.9.5. Summary

The importance of usage of external-knowledge based rules is illustrated by FIG. 36. It contains StatsCompressor's Compression Ratios for compression of LRT_A without loading any rules from the file. The numbers in brackets are the differences between the results of the similar experiment, but having enabled loading of all rules discovered in the LRT_A ('full LRT_A/LRT_A'). From the other point of view, this table can be treated as part of discussion of different model of usage of the described solution (see 5.10)—it answers the question 'what if there is no StatsMiner at all?'.

The results from FIG. 36 indicate that usage of rules loaded from file (i.e. discovered by StatsMiner) improves StatsCompressor Ratio for full files on average 6.76%-12.22% points, depending on the external compressor used, and 8.65%-14.33% points in the case of bodies only. It is interesting that usage of the loaded rules is much more important for the bzip2 compressor than for the gzip, however files generated by the xz are still smaller, though.

In this approach the tool has excellent performance, which can be further improved by cautious implementation of StatsCompressor. Especially memory consumption may drop significantly, as much data is now being kept in the memory although it can be easily computed on demand.

Summing up, using external-knowledge based rules increases StatsCompressor's Compression Ratio, albeit the space saving is not as big as in the case of other, built-in algorithms of the tool. However, much work can be done to improve StatsMiner, so the results can be much better—it is believed that 10 percentage points is feasible. In addition, it is already known that some places of StatsCompressor's code need optimization, so the performance may also increase. Finally, the current results seem to be satisfying at this point of research.

5.10. Other Models of Usage of Correlation-Based Compression

Chapter 3 presents the most general, distributed model of usage of the designed solution. There are two places where a policy should be adopted—the method of selecting rules sent to customers and the external compressor used. External compressors were already discussed already in 5.4. Sections 5.10.2, 5.10.3 and 5.9.4 discuss three various approaches for preparation of rules file. Then section 5.17 covers a totally different approach—merging StatsMiner with StatsCompressor, so discovering rules is being done just before the compression, at the customer's site. Please note, that one more approach was already discussed in Par. 5.9.5—the idea of not using StatsCompressor at all.

This section only briefly presents different models of usage of the correlation-based compression.

5.10.1. Realistic Distributed Model of Compression

Up to now all the results concerned compressing the LRT_A set using (or sometimes not) rules discovered on the LRT_A set. This assumption was not very realistic because real Zstat files will be compressed using rules discovered not on the same data (although such approach will be discussed in Par. 5.17), so the results already analyzed can be considered as 'best currently achievable'.

FIG. 37 contains StatsCompressor's Compression Ratios for compressing the LRT_B set with rules discovered on the LRT_A set. It simulates realistic, but also the most optimistic use-case of the designed solution—the data at the customer's site (the LRT_B set) is compressed using rules discovered on a training set (the LRT_A set) and both were generated by the exactly same version of HYDRAstor.

The results presented in FIG. 37 are very good, because StatsCompressor's Compression Ratios achieved in this realistic model are very similar to those analyzed in the optimistic one—they are only 0.5 percentage point worse. Naturally, standard deviations increased, but it is not surprising, as the input's data entropy increased (not the same files have been mined and then compressed). It seems that accepting deviations is crucial to get such good results. Performance behaved as expected—CPU usage increased (as there were more deviations to analyze), but memory consumption was lower, because in Zstat files from the LRT_B set some statistics that appeared in the LRT_A set may not exist.

These results are crucial for assessment of all previous experiments, as it is proof that the optimistic results already presented may be also used for discussing the properties of a realistic model of usage of StatsMiner and StatsCompressor.

5.10.2. Usage of Significant Rules

StatsMiner first searches for rules, and then it checks how many times each rule might be applied to the data and how often the given relationship between statistics is true. The result of this check is called a significance (see Par. 4.3) of a rule—this value indicates how good a correlation is, so how often it is true. As the number of rules produced by StatsMiner is huge, not all of them can be sent to the customers. Moreover, as it was already mentioned, using too many rules has negative impact on the performance of StatsMiner. Accordingly it seems reasonable to transfer only the best rules—having the highest significance factor—to the customers' machines. FIG. 38 presents the correlation of the significance of the used rules with the StatsCompressor's Compression Ratios (compared to the best achievable results) and the tool's performance.

According to the results from FIG. 38, using rules of a given significance has strong impact on the performance of StatsMiner, as both CPU and memory consumption drops significantly. Unfortunately, the StatsCompressor's Compression Ratios are also lower, but the decrease in resources consumption is much faster than the decrease in compression ratios. The values of the compression ratio should be compared with those from FIG. 36, which contains information about the general impact of usage of rules found by StatsMiner. It seems that usage of rules having significance 80% and higher is a good choice for policy of limiting of the size of the rules file.

Note that rules files created in this way may be used for efficient compression of statistics gathered by a different version of HYDRAstor, as the best rules are being chosen.

5.10.3. Usage of the Rules Already Used

StatsMiner produces millions of rules, however StatsCompressor uses in reality about 63% rules for compression per single Zstat file. Limiting the rules files according to the rules significance (described in the p. 5.10.2) was based on the knowledge from StatsMiner. FIG. 39 presents a similar approach, but based on the experience with the usage of StatsCompressor—at support's site StatsMiner discovers rules in the training set (LRT_A), then StatsCompressor is run on the same set to determine which of the found rules are used in practice. Only such rules will be transferred to customers. The quality of this approach is measured by compressing the LRT_B set.

FIG. 39 presents the StatsCompressor's Compression Ratios for compressing the LRT_B set with only these rules that were also used for compressing the LRT_A set before. Values in brackets indicate the loss of compression ratio while compared with best achievable—those from LRT_A/LRT_A full experiment—and they can be assessed as very good, because the compression ratio dropped about 1 percentage point although performance increased significantly. It shows that StatsCompressor uses similar sets of rules for compressing different Zstat files, naturally if HYDRAstor versions are similar. However, the standard deviation increased up to 50%, so it is harder to predict the size of a Zplus file while using this approach, however it is still only 3%-4%. The described method of limiting the size of the rules file seems to be very promising and practical.

Please note that such good results could be achieved because existence of the deviations vectors was allowed—rules were treated as though they described weak correlations. This method of selecting the rules to be used is believed to work best if StatsCompressor will compress Zstat files generated by the same version of HYDRAstor, which produced the files for experiments at the support's site as well. On the other hand, StatsCompressor performs much better having rules selected using this approach than while using the rules of the highest significance (see Par. 5.10.2).

5.10.4. Merged StatsMiner with StatsCompressor

The model of cooperation of StatsMiner with StatsCompressor showed in FIG. 16 is as general as it could be and it assumes that StatsMiner needs a lot of CPU time and memory. However, algorithms have been already moved from StatsMiner to StatsCompressor (discovery of constants—see Par. 5.8.1) and it resulted in increasing of StatsCompressors's Compression Ratios without much decrease of its performance. FIG. 40 presents a more radical approach—both StatsMiner and StatsCompressor run on the customer's site, for each Zstat file separately. It simulates (to some extent) the situation in which both tools were merged.

FIG. 40 shows the results of joining the mining and compressing phases, so that each file undergoes this procedure separately on the customer's site. While interpreting these results, it should be kept in mind that StatsMiner and StatsCompressor were not designed to run in this model, so the performance results are as poor as possible. On the other hand, StatsCompressor's Compression Ratios are best achievable in this method, because StatsMiner discovers all the rules first and StatsMiner selects the most fitting ones. If the tools were merged, compression and mining may be interleaved, so there would be no mining for sum rules among statistics which are already perfectly compressed using identity rules. However, even if performance results are not as good as they could be, the use of CPU and memory dropped by half at the customer's site—it is one more proof why the number of rules which were to be used by StatsCompressor should be limited somehow. StatsCompressor's Compression Ratios drop in this model by about 1.5-2.5 percentage points in comparison to the best one achievable (coming from LRT_A/LRT_A full experiment). It is interesting that these results are slightly worse than those achieved while using rules proved to be already used for compression (see Par. 5.10.3). This observation shows how the possibility of usage of weak rules is important for StatsCompressor, because, at present, StatsMiner discovers strict rules only. The conclusion is, that implementing random windows (see Par. 4.3.1) in StatsMiner should have high priority. When it comes to the standard deviation, it is still very low and there were not many changes in comparison to the LRT_A/LRT_A full experiment—it is a good sign, because it enables the prediction of the size of the Zplus files.

5.10.5 Summary

Numerous policies of selecting the rules to be sent to the customer's site (see 3.1) have been described and assessed in this section.

1. Usage of the most significant rules (Par. 5.10.2).
2. Usage of the rules that were already used by StatsCompressor (Par. 5.10.3).
3. Random choice of the sum rules (Par. 5.9.4).

The mentioned policies may be mixed together to let the rules file have expected characteristics (work well with slightly different versions of HYDRAstor (1), work best with a specific version of HYDRAstor (2) or be of the minimum size (3)).

On the other hand, completely different models of cooperation of StatsMiner and StatsCompressor were studied.

1. Distributed model of correlation-based compression (Par. 5.10.1).
2. Not using StatsMiner at all (Par. 5.9.5).
3. Merging StatsMiner with StatsCompressor (Par. 5.17).

Each of the models forces different trade-offs between the achievable compression ratios and performance. The choice of the best one is very hard, because it depends on the restrictions imposed on the designed solution. Moreover, the software that was prepared is experimental, so its performance is not well-tuned.

Finally, it was proved that results of the experiment LRT_A/LRT_A full can be used as a base for comparison with the results of other experiments, because the StatsCompressor's Compression Ratios and performance of real-life use case is not very different from those idealistic ones (see Par. 5.10.1).

5.11. Summary

StatsCompressor is a powerful tool for compressing files containing statistics. It compresses data using correlations loaded from special file (Par. 5.9) or discovered on its own (Par. 5.8). The tool reduces the size of Zstat files, on average, by half on average (best result is 66.6%). Unfortunately, the performance of the process is not very good—consumption of CPU and memory is very high. This can be naturally improved by more cautious implementation and optimization, choosing more efficient internal algorithms (it was already summarized in Par. 5.9.5) or by changing the whole approach towards the usage of StatsCompressor (Par. 5.10).

Despite the specific characteristics of the implemented software, it was proved that using correlations for compression is a good idea, as the most popular compressors (gzip, bzip2, xz) do not use such possibilities themselves. The space saving may be increased by extending the functionality of StatsMiner (and StatsCompressor appropriately).

Chapter 6 Evaluation on Real Statistics Obtained From Customers

Correlation-based compression was tested not only on the artificial statistics gathered during the Long Running Test (LRT) but also on statistics received from the real customers—(Customer Logs). As it was already mentioned, such statistics are downloaded occasionally, when there is a need to check the system performance or investigate a potential bug because the system behaves not in the way it was expected to. Due to this, such statistics are often specific. The designed solution will be indeed used mainly in this kind of situations but it may be possibly used in any conditions. For these reasons it was decided to convey detailed experiments on the Long Running Test's results, and only the most important ones on the Customer Logs. Another reason for this approach was that even though the volume of statistics from customers is quite big, not all the files are of the proper size (there are many too small ones). Finally, the available statistics obtained from customers were generated by the different versions of the HYDRAstor system. Experiments conveyed on the such inconsistent data are believed to be slightly poorer than they might be if there were a possibility to experiment on the statistics created by a one, specific version of the system.

6.1. Testbed 6.1.1. Testing Data

All the tests were carried out on the set of test data called CL_2. In Chapter 4, the CL set was analyzed, where the following Math 36 is established. CL_2 set containing 50 randomly chosen XML files (CL had only 30) among files received from real users (customers) of HYDRAstor. The files were generated by various versions of the HYDRAstor system having various patches and updates installed. Only the files of size 2 MB to 4 MB and generated by SNs were approved for this test. The selected files have been converted to the Zstat format. They contained about 50.000 statistics, each having 140-240 samples (although all the statistics in one file had about the same number of samples.

$$CL \subset CL\_2 \qquad \text{[Math.36]}$$

6.1.2. Measuring Performance

Tests have been conveyed on the same machine and in the same way as tests of StatsMiner (see Par. 4.2.2).

6.2. Results of Experiments

FIGS. 41 and 42 present the results of running the designed solution on the CL_2 set in different models. The first table (FIG. 41) shows average StatsCompressor's Compression Ratios, and the second (FIG. 42) presents standard deviations of the results. In brackets, differences between the value in the experiment on the CL_2 set and the corresponding experiment on the LRT_A set are shown. The names of the columns refer to the models mentioned in Par. 5.10.

Optimistic—compression of the CL_2 set using rules mined on the whole CL set. Note that the following Math 37 and |CL|=30, |CL_2|=50 are established. Rules were discovered on the CL set, because StatsMiner running on the CL_2 set consumed too much memory (over 40 GB). A similar experiment was LRT_A/LRT_A full—FIG. 23.

Realistic—compression of the CL_2 set using rules discovered in the whole LRT_A set. The results of a similar experiment can be found in FIG. 27.

Used—compression of the CL_2 set using rules which were used for compression of the LRT_A set with rules discovered in the LRT_A set. The results of a similar experiment can be found in FIG. 39.

No rules—compression of the CL_2 using no rules created by StatsMiner. The results of the similar experiment can be found in FIG. 36.

Merge—compression of the CL_2 using rules found by StatsMiner in the file compressed at the moment. The results of a similar experiment can be found in FIG. 40.

$$CL \subset CL\_2 \qquad [\text{Math.37}]$$

Performance results apply to StatsCompressor only, except for the 'merge' model, in which it is a sum of performance of StatsMiner and StatsCompressor.

6.3. Analysis of the Results of the Experiments

Results of the experiments on the statistics obtained from customers are satisfactory. As it was already mentioned, the CL_2 set contrary to the LRT_A set, contained statistics gathered by the various versions of HYDRAstor, so naturally the results are poorer than those from the experiments on the LRT_A set. However, the loss was not big—it was 1.92-7.48 percentage points in case of full files and 3.98-9.23 percentage points for bodies only. Please note that the statistics from the CL_2 set contained many more samples (140-240) than those from the LRT_A set (60-100), so the ratio between the results for compression of the full files and the bodies only is different. The achieved results proved that usage of the designed solution is reasonable in a real-life use-case.

Optimistic results present the hypothetic best results that can be achieved. As a matter of the fact, the CL set was compressed using rules found only in the subset of it (CL_2), but if the rules had been found in the full CL set, StatsCompressor's Compression Ratios would not be much better (see FIGS. 35 and 38) but performance would significantly drop. Currently, the 'merge' model is characterized by a smaller decrease of results than the 'optimistic' model, and this may be inversed if the rules in the 'optimistic' approach were discovered in the full CL set.

The best results, in the case of a drop in the StatsCompressor's Compression Ratio, have been achieved with the 'merge model'. These are also the best absolute results (except for the 'optimistic' model which is totally unrealistic due to the huge size of the rules file). Depending on the compressor used, Zplus files are finally 28%-49% smaller than Zstat files—which is a very good result. Unfortunately, the performance is very poor—it seems to be correlated with the bigger number of samples in the Zstat files from the CL set. On the other hand, as it was already mentioned, StatsMiner and StatsCompressor were not designed to work efficiently (as regards performance) in this model and much optimization can be done.

The 'realistic' model's results are mediocre—they are acceptable, however the loss is substantial and performance is poor (although better than in the case of the same experiment for the LRT_A set). It is worrying though that the decrease is so big in the case of the bodies only—the largest among all the models for the each external compressor! On the other hand, results of the experiments with the 'used' model are satisfactory—drops in StatsCompressor's Compression Ratios are indeed big, but slightly smaller than in the 'realistic' model, however the performance is very good. It is believed that this approach to limiting the number of the rules used will perform poorly if the versions of the HYDRAstor system differs in the case of preparing rules and compressing files, but finally the results are fully acceptable. It is interesting that the standard deviation for this model dropped for each used external compressor and resource consumption category—it is very good, because the lower the standard deviation is, the more precise the predictions of the final Zplus file's size are.

The results for the 'no rules' model are slightly disappointing—they dropped 5.04-6.31% in the case of full files, albeit in this approach StatsCompressor does all the analysis on each file separately. It seems to be connected with the larger quantity of samples in each Zstat file, so for example looking for constants did not work so good. On the other hand, this may also result from the fact that customers have HYDRAstor in the previous versions than the one used for generating Zstat files for the LRT_A set. Finally, HYDRAstor may behave differently when normally used by the customers than in the artificial Long Running Test. However, the results for the 'no rules' approach constitute additional proof that all the methods proposed in the thesis are important for gaining good compression ratios, even a in real-life example—it is not enough to use the sole StatsCompressor to obtain a good compression ratio.

Standard deviation of the results of all the experiments is good—in did not increased much, although the compressed files came from a different versions of HYDRAstor. It implies that the statistics generated by the system are similar, no matter which version has been used. It means that anomaly detection based on the analysis of the statistics is reasonable (at least using the correlations found by StatsMiner).

When it comes to the selection of an external compressor, StatsCompressor's Compression Ratios are the highest for the bzip2 tool.

6.4. Summary

The experiments conducted with the designed solution used for compressing some of the statistics received from customers proved that correlation-based compression may be successfully used in practice. The achieved results are slightly worse than in case of the compression of example statistics, but they are still satisfying. It was found out that two approaches are significantly better than others—merging StatsMiner with StatsCompressor is the first one and usage of the rules already used for compression of the training set is the second. The first of the aforementioned methods had good results but very bad performance—using it would require creating a new tool that would be optimized to work in this way. The second method should be further investigated as it seems that both performance and compression ratios may be improved—for example extending the rules file with the rules of the highest significance (but not used for compression already) should be checked.

To sum up, the designed solution is practicable.

Chapter 7 Related Work

The thesis presents a method of improving the compression ratio of the specific kind of logs by usage of the discovered correlations and domain-knowledge. The proposed approach seems not be already proposed in the literature, especially the idea of searching for correlations at the support's site and using this knowledge on the customer's site. However, the designed solution can be placed at the intersection of a few well-researched disciplines of the computer science: data mining, compression and logs analysis.

Compression of the logs has been studied for a long time, especially in the context of supercomputers [BS06] or distributed systems [RL04] and [SS07]. The aforementioned articles propose usage of an additional, specialized compressor, which should be used together with a general purpose one. The designed solution bases on the same approach. However, StatsCompressor has statistics as the input. The statistics are a kind of already parsed and compacted logs. On the contrary, authors of the cited articles struggle with logs parsing themselves and then try to find some identities and thus reduce the size of the files. Authors of the [BS06] developed algorithms working rather on the byte-level, while the solution from [SS07] works by comparing lines of logs. [RL04] proposes compression of each column of logs using different, the most effective algorithm. The authors of all the aforementioned articles put substantial effort into minimizing resource consumption of their tools—this aspect of StatsMiner and StatsCompressor should still be improved.

Logs are a very important source of knowledge about the state of the system which can be utilized in many ways, as the survey [OGX12] indicates. Data mining methods are often used for analysis of the logs [HBK+03] or anomaly detection [OKA10], [BKK01], [FRZ+12]. All of them make use of correlations in some way, though different authors understand this term differently. [HBK+03] proposes 'Comprehensive Log Compression' whose aim is not to compress data but rather to help system administrators in analysis of logs by finding (textual) patterns. From this point of view, rules generated by StatsMiner can also be an important source of knowledge for system administrators. Authors of [FRZ+12] discusses a notion of a 'bottleneck anomaly' which may be interesting while tuning a system. It seems that a set of simple scripts may help in finding such situations by comparing the model set of rules generated by StatsMiner for a specific version of HYDRAstor with those found in particular Zstat files. Unusual identity correlations between unbound statistics ('anomalies in the statistics files') may warn about the existence of a performance bottleneck. What is interesting, authors of [FRZ+12] have also introduced a similar notion of a window as it was done for StatsMiner. On the other hand, they used sophisticated data mining techniques for analysis. All articles mentioned in this paragraph propose tools for anomaly detection that may be (probably) extended and improved by the use of the rules generated by StatsMiner, because they are all based on some kind of dependencies or correlations—[OKA10] proposes a Structure-of-Influence Graph, [BKK01] focuses on the operational dependencies and [FRZ+12] describes a tool for event prediction. This last article has a comprehensive bibliography too. Finally, [Say04] presents the analysis of data in a very similar approach as the one used by StatsMiner. [Say04] focuses on detecting time correlations in data streams—StatsMiner does a very similar thing, although the method described in the article searches rather for interesting singular events, while algorithms presented in the thesis try to discover general relationships.

From the data mining point of view, the notion of correlation used in the thesis bears some similarity to a specific association rule. There are plenty of methods of finding association rules, however they seem to be overly general and thus too slow to be used by StatsMiner, especially that the aim of this tool is to mine for exact, numerical relationships. What is interesting, the article [BMS97] faces the problem of upgrading the association rules to make them correlations from the mathematical point of view. The mathematical approach presented in this text might be adopted to improve the methods of limiting the number of rules used by StatsCompressor. In fact, the notion of significance used in the thesis is very similar to the confidence, which stems from the association rules' world. Moreover, the term support corresponds to the percentage of windows in which the correlation may occur (because the expected statistics exist) to the number of all windows.

To sum up, it seems that the idea of usage of numerical correlation found by a data mining tool for compressing another (or even the same) sets of data is a new one.

Chapter 8 Summary

The thesis presented a distributed, data-mining based approach to the compression of the statistics while the statistics are a kind of aggregated logs. Two tools have been implemented—StatsMiner, which searches for correlations between statistics, and StatsCompressor, which uses the rules created by StatsMiner to efficiently compress files containing statistics. Both programs were intended to work in a distributed model—StatsMiner discovers correlations while working on the example data at the support's site while StatsMiner runs at the customer's site. Other models of cooperation of the tools have also been evaluated, for example running the whole software on the customer's machines only.

The achieved compression ratios met all the expectations—on average, in the most optimistic model, usage of StatsCompressor can increase the space saving by about 50%, while using the tool together with the bzip2 compressor, by about 45% while using the tool together with the gzip compressor and by about 30% while using the tool together with the xz compressor. The results can be further improved by implementation of some extensions for StatsMiner, which aim to discover more types of correlations. On the other hand, the performance of the implemented software is below the expectations, although it is a prototype version in which performance bottlenecks were identified and some preliminary solutions were proposed.

StatsMiner—a tool for discovering correlations between statistics—can also be used as a basis for anomaly-detection software.

There are plans to introduce some results described in the thesis to NEC HYDRAstor. The work on the project was initiated due to real-life problems of the HYDRAstor support team and these problems may be solved using the proposed ideas.

<Supplementary Notes>

The whole or part of the exemplary embodiments disclosed above can be described as, but not limited to, the following supplementary notes. Hereinafter, the outline of the configuration of a data compression system and the like according to the present invention will be described. However, the present invention is not limited to the configurations described below.

(Supplementary Note 1)

A data compression system comprising:

correlation extraction means for extracting at least one candidate for a correlation from a collected given data set, based on a relationship between units of data in the given data set;

correlation verification means for verifying whether or not the units of data in the given data set satisfy the correlation extracted by the correlation extraction means; and data compression means for compressing the given data set with use of the correlation, based on a result of verification by the correlation verification means.

(Supplementary Note 2)

The data compression system according to supplementary note 1, wherein each of the units of data in the given data set is a data group including at least one data value, and the correlation extraction means extracts at least one candidate for a correlation based on a relationship between the data groups in the given data set.

(Supplementary Note 3)

The data compression system according to supplementary note 2, wherein the correlation extraction means generates at least one localized search range in which the respective data groups have the same number of data values, and extracts at least one candidate for a correlation based on a relationship between the data groups in the generated localized search region, and the correlation verification means verifies whether or not the respective data groups in the localized search ranges generated by the correlation extraction means satisfy the correlation.

(Supplementary Note 4)

The data compression system according to supplementary note 2 or 3, wherein the correlation extraction means extracts a candidate for a correlation of a predetermined type, and then removes a data group having the correlation from the localized search range, and again extracts a correlation based on the relationship between the data groups in the localized search region after removal.

(Supplementary Note 5)

The data compression system according to any of supplementary notes 2 to 4, wherein the correlation extraction means extracts any of the data groups in which the data value is a constant from the given data set, and then removes the data group in which the data value is the constant from the localized search range, and again extracts a correlation based on the relationship between the data groups in the localized search region after removal.

(Supplementary Note 6)

The data compression system according to any of supplementary notes 2 to 5, wherein the correlation extraction means extracts a combination of the data groups determined to be identical based on a predetermined criterion, from among the data groups in the given data set.

(Supplementary Note 7)

The data compression system according to any of supplementary notes 1 to 6, wherein the correlation verification means stores data satisfying the correlations listed cyclopaedically for the respective units of data, and verifies whether or not the given data set satisfies each of the correlations listed cyclopaedically.

(Supplementary Note 8)

The data compression system according to any of supplementary notes 1 to 6, wherein the correlation verification means generates a numerical expression representing the correlation, and verifies the given data set for a case where the given data set satisfies the numerical expression and for a case where the given data set does not satisfy the numerical expression.

(Supplementary Note 9)

A data compression method comprising:

extracting at least one candidate for a correlation from a collected given data set, based on a relationship between units of data in the given data set;

verifying whether or not the units of data in the given data set satisfy the extracted correlation; and compressing the given data set with use of the correlation, based on a result of the verification.

(Supplementary Note 9-1)

The data compression method according to supplementary note 9, wherein each of the units of data in the given data set is a data group including at least one data value, and the method including extracting at least one candidate for a correlation based on a relationship between the data groups in the given data set.

(Supplementary Note 9-2)

The data compression method according to supplementary note 9-1, further comprising:

generating at least one localized search range in which the respective data groups have the same number of data values, and extracting at least one candidate for a correlation based on a relationship between the data groups in the generated localized search region, and verifying whether or not the respective data groups in the generated localized search ranges satisfy the correlation.

(Supplementary Note 10)

A correlation-for-data-compression extraction device that extracts a correlation for compressing given data, the device comprising:

a correlation extraction unit that extracts at least one candidate for a correlation from a collected given data set, based on a relationship between units of data in the given data set; and a correlation verification unit that verifies whether or not the units of data in the given data set satisfy the correlation extracted by the correlation extraction unit.

(Supplementary Note 10-1)

The correlation-for-data-compression extraction device according to supplementary note 10, wherein each of the units of data in the given data set is a data group including at least one data value, and the correlation extraction means extracts at least one candidate for a correlation based on a relationship between the data groups in the given data set.

(Supplementary Note 10-2)

The correlation-for-data-compression extraction device according to supplementary note 10-1, wherein the correlation extraction means generates at least one localized search range in which the respective data groups have the same number of data values, and extracts at least one candidate for a correlation based on a relationship between the data groups in the generated localized search region, and the correlation verification means verifies whether or not the respective data groups in the localized search ranges generated by the correlation extraction means satisfy the correlation.

(Supplementary Note 11)

A program for causing an information processing device to realize:

correlation extraction means for extracting at least one candidate for a correlation from a collected given data set, based on a relationship between units of data in the given data set; and correlation verification means for verifying whether or not the units of data in the given data set satisfy the correlation extracted by the correlation extraction means.

(Supplementary Note 11-1)

The program according to supplementary note 11, wherein each of the units of data in the given data set is a data group including at least one data value, and the correlation extraction means extracts at least one candidate for a correlation based on a relationship between the data groups in the given data set.

(Supplementary Note 11-2)

The program according to supplementary note 11-1, wherein the correlation extraction means generates at least one localized search range in which the respective data groups have the same number of data values, and extracts at least one candidate for a correlation based on a relationship between the data groups in the generated localized search region, and the correlation verification means verifies whether or not the respective data groups in the localized search ranges generated by the correlation extraction means satisfy the correlation.

It should be noted that the programs described in the above-described embodiments and supplementary notes are stored on storage devices or on computer-readable storing media. For example, storing media are portable media such as flexible disks, optical disks, magneto-optical disks, and semiconductor memories.

While the present invention has been described with reference to the exemplary embodiments described above, the present invention is not limited to the above-described embodiments. The form and details of the present invention can be changed within the scope of the present invention in various manners that can be understood by those skilled in the art.

DESCRIPTION OF REFERENCE NUMERALS 1 statistics compression system
2 storage system
21 accelerator node
22 storage node
3 statistics mining device
31 data transmission/reception means
32 statistics database
33 window generation means
34 correlation extraction means
35 correlation verification means
36 rule file
4 statistics compression device
41 data transmission/reception means
42 statistics file
43 verified rule file
44 statistics compression means

The invention claimed is:

1. A data compression system comprising:
a memory configured to store instructions; and
at least one processor configured to process the stored instructions to realize:
a correlation extraction unit extracting at least one candidate for a correlation from a collected given data set, based on a relationship between units of data in the given data set;
a correlation verification unit verifying whether or not the units of data in the given data set satisfy the correlation extracted by the correlation extraction unit; and
a data compression unit compressing the given data set with use of the correlation, based on a result of verification by the correlation verification unit,
wherein
each of the units of data in the given data set is a data group including at least one data value,
the correlation extraction unit extracts at least one candidate for a correlation based on a relationship between the data groups in the given data set, and
the correlation extraction unit extracts at least one of any of the data groups in which the data value is a constant from the given data set, and a combination of the data groups determined to be identical based on a predetermined criterion, from among the data groups in the given data set.

2. The data compression system according to claim 1, wherein
the correlation extraction unit generates at least one localized search range in which the respective data groups have the same number of data values, and extracts at least one candidate for a correlation based on a relationship between the data groups in the generated localized search range, and
the correlation verification unit verifies whether or not the respective data groups in the localized search ranges generated by the correlation extraction unit satisfy the correlation.

3. The data compression system according to claim 1, wherein
the correlation extraction unit extracts a candidate for a correlation of a predetermined type, and then removes a data group having the correlation from a localized search range, and again extracts a correlation based on the relationship between the data groups in the localized search range after removal.

4. The data compression system according to claim 1, wherein
after the correlation extraction unit extracts any of the data groups in which the data value is a constant from the given data set, the correlation extraction unit then removes the data group in which the data value is the constant from a localized search range, and again extracts a correlation based on the relationship between the data groups in the localized search range after removal.

5. The data compression system according to claim 1, wherein
the correlation verification unit stores data satisfying the correlations listed cyclopaedically for the respective units of data, and verifies whether or not the given data set satisfies each of the correlations listed cyclopaedically.

6. The data compression system according to claim 1, wherein
the correlation verification unit generates a numerical expression representing the correlation, and verifies the given data set for a case where the given data set satisfies the numerical expression and for a case where the given data set does not satisfy the numerical expression.

7. A data compression method comprising:
extracting at least one candidate for a correlation from a collected given data set, based on a relationship between units of data in the given data set;
verifying whether or not the units of data in the given data set satisfy the extracted correlation; and
compressing the given data set with use of the correlation, based on a result of the verification,
wherein
each of the units of data in the given data set is a data group including at least one data value, the extracting at least one candidate comprises extracting at least one candidate for a correlation based on a relationship between the data groups in the given data set, and the extracting at least one candidate comprises extracting at least one of any of the data groups in which the data value is a constant from the given data set, and a combination of the data groups determined to be identical based on a predetermined criterion, from among the data groups in the given data set.

8. A correlation-for-data-compression extraction device that extracts a correlation for compressing given data, the device comprising:

a memory configured to store instructions; and at least one processor configured to process the stored instructions to realize:

a correlation extraction unit that extracts at least one candidate for a correlation from a collected given data set, based on a relationship between units of data in the given data set; and a correlation verification unit that verifies whether or not the units of data in the given data set satisfy the correlation extracted by the correlation extraction unit, wherein each of the units of data in the given data set is a data group including at least one data value, the correlation extraction unit extracts at least one candidate for a correlation based on a relationship between the data groups in the given data set, and the correlation extraction unit extracts at least one of any of the data groups in which the data value is a constant from the given data set, and a combination of the data groups determined to be identical based on a predetermined criterion, from among the data groups in the given data set.

9. A non-transitory computer-readable medium storing a program for causing an information processing device to realize:

a correlation extraction unit extracting at least one candidate for a correlation from a collected given data set, based on a relationship between units of data in the given data set; and a correlation verification unit verifying whether or not the units of data in the given data set satisfy the correlation extracted by the correlation extraction unit, wherein each of the units of data in the given data set is a data group including at least one data value, the correlation extraction unit extracts at least one candidate for a correlation based on a relationship between the data groups in the given data set, and the correlation extraction unit extracts at least one of any of the data groups in which the data value is a constant from the given data set, and a combination of the data groups determined to be identical based on a predetermined criterion, from among the data groups in the given data set.

* * * * *

UNITED STATES PATENT AND TRADEMARK OFFICE
CERTIFICATE OF CORRECTION

PATENT NO. : 10,078,669 B2
APPLICATION NO. : 14/655784
DATED : September 18, 2018
INVENTOR(S) : Dominik Borowiec and Michal Welnicki Page 1 of 1

It is certified that error appears in the above-identified patent and that said Letters Patent is hereby corrected as shown below:

In the Specification

Column 34, Description of Embodiments, Line 34; Delete "window)" and insert --window).-- therefor Column 48, Description of Embodiments, Line 21; Delete "h=g=f." and insert --h=g-f.-- therefor Signed and Sealed this
Nineteenth Day of February, 2019

Andrei Iancu
*Director of the United States Patent and Trademark Office*